United States Patent
Zheng et al.

(10) Patent No.: US 12,161,002 B2
(45) Date of Patent: Dec. 3, 2024

(54) FORMULATIONS FOR THE MANUFACTURE OF PEROVSKITE DEVICES

(71) Applicant: Alliance for Sustainable Energy, LLC, Golden, CO (US)

(72) Inventors: Xiaopeng Zheng, Lakewood, CO (US); Joseph Matthew Luther, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 18/304,701

(22) Filed: Apr. 21, 2023

(65) Prior Publication Data

US 2023/0345745 A1    Oct. 26, 2023

Related U.S. Application Data

(60) Provisional application No. 63/363,327, filed on Apr. 21, 2022.

(51) Int. Cl.
*H10K 30/40* (2023.01)
*H10K 30/80* (2023.01)
(Continued)

(52) U.S. Cl.
CPC ............ *H10K 30/40* (2023.02); *H10K 30/80* (2023.02); *H10K 85/211* (2023.02); *H10K 2102/101* (2023.02)

(58) Field of Classification Search
CPC ...... H10K 30/40; H10K 30/80; H10K 85/211; H10K 2102/101
See application file for complete search history.

(56) References Cited

U.S. PATENT DOCUMENTS

2023/0284468 A1    9/2023    Zhu

FOREIGN PATENT DOCUMENTS

| CN | 114094019 A | * | 2/2022 | |
| WO | WO-2022180170 A1 | * | 9/2022 | ......... H01L 31/0236 |

OTHER PUBLICATIONS

WO-2022180170-A1 English machine translation (Year: 2022).*
(Continued)

*Primary Examiner* — Andrew J Golden
(74) *Attorney, Agent, or Firm* — Michael A. McIntyre

(57) ABSTRACT

The present disclosure relates to a device that includes a perovskite layer; and a first layer that includes a molecule having a structure according to formula (I)

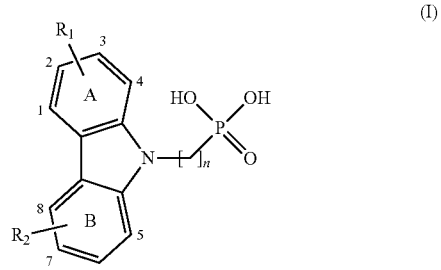

(I)

Wherein the perovskite layer and the first layer are in physical contact, n is between 1 and 10, inclusively, $R_1$ includes at least one of hydrogen, a first alkyl group, a first alkoxy group, and/or a first halogen, $R_2$ includes at least one of hydrogen, a second alkyl group, a second alkoxy group, and/or a second halogen, $R_1$ is bonded to aromatic ring (A) at carbon atom (1), carbon atom (2), carbon atom (3), or (Continued)

carbon atom (4), $R_2$ is bonded to aromatic ring (B) at carbon atom (5), carbon atom (6), carbon atom (7), or carbon atom (8), and $R_1$ and $R_2$ are the same or different.

19 Claims, 43 Drawing Sheets

(51) Int. Cl.
H10K 85/20 (2023.01)
H10K 102/10 (2023.01)

(56) References Cited

OTHER PUBLICATIONS

CN-114094019-A English machine translation (Year: 2022).*
Al-Ashouri et al, Conformal Monolayer Contacts with Lossless Interfaces for Perovskite Single Junction and Monolithic Tandem Solar Cells, Energy Environ. Sci., 2019, 12, 3356 with attached supporting information (Year: 2019).*
Al-Ashouri, A. et al., "Conformal monolayer contacts with lossless interfaces for perovskite single junction and monolithic tandem solar cells," Energy & Environmental Science, vol. 12, 2019, 14 pages.
Al-Shouri, A. et al., "Monolithic perovskite/silicon tandem solar cell with >29% efficiency by enhanced hole extraction," Science, Solar Cells, vol. 370, 2020, 10 pages.
Cassella, E.J. et al., "Gas-Assisted Spray Coating of Perovskite Solar Cells Incorporating Sprayed Self-Assembled Monolayers," Advanced Science, vol. 9, 2022, 10 pages.
Cheng, H. et al., "Influence of chain ordering on frictional properties of self-assembled monolayers (SAMs) in nano-lubrication," Advances in Colloid and Interface Science, 2012, 13 pages.
Dagar, J. et al., "Compositional and Interfacial Engineering Yield High-Performance and Stable p-i-n Perovskite Solar Cells and Mini-Modules," Applied Materials & Interfaces, vol. 13, 2021, 12 pages.
Deng, M. et al., "Photoconducting hybrid perovskite containing carbazole moiety as the organic layer: Fabrication and characterization," Materials Science and Engineering B, vol. 147, 2008, 5 pages.
Hotchkiss, P.J. et al., "The Modification of Indium Tin Oxide with Phosphoric Acids: Mechanism of Binding, Tuning of Surface Properties, and Potential for Use in Organic Electronic Applications," Accounts of Chemical Research, vol. 45, No. 3, 2012, 10 page.
Hu, J. et al., "Efficient CsPbBr3 Inorganic Perovskite Light-Emitting Diodes via Lewis Acid-Base Reaction with Organic Small Molecule mCP," Applied Electronic Materials, vol. 2, 2020, 7 pages.
Kim, M. et al., "From Self-Assembled Monolayers to Coatings: Advances in the Synthesis and Nanobio Applications of Polymer Brushes," Polymers, vol. 7, 2015, 33 pages.
Kim, S.Y. et al., "Self-Assembled Monolayers as Interface Engineering Nanomaterials in Perovskite Solar Cells," Advanced Energy Materials, vol. 10, 2020, 21 pages.
Levine, I. et al., "Charge transfer rates and electron trapping at buried interfaces of perovskite solar cells," Joule 5, 2021, 20 pages.
Li, J. et al., "20.8% Slot-Die Coated MAPbI3 Provskite Solar Cells by Optimal DMSO-Content and Age of 2-ME Based Precursor Inks," Advanced Energy Materials, vol. 11, 2021, 8 pages.
Li, X. et al., "Improved performance and stability of perovskite solar cells by crystal crosslinking with alkylphosphonic acid-ammonium chlorides," Nature Chemistry, vol. 7, Sep. 2015, 9 pages.
Li, Y. et al., "Performance and stability improvements in metal halide perovskite with intralayer incorporation of organic additives," Journal of Materials Chemistry A, vol. 9, 2021, 58 pages.
Lin, Y. et al, "Self-Assembled Monolayer Enables Hole Transport Layer-Free Organic Solar Cells with 18% Efficiency and Improved Operational Stability," vol. 5, 2020, 10 pages.
Liu, J. et al., "28.2%-efficient, outdoor-stable perovskite/silicon tandem solar cell," Joule 5, 2021, 19 pages.
Roß, M. et al., "Co-Evaporated p-i-n Perovskite Solar Cells beyond 20% Efficiency: Impact of Substrate Temperature and Hole-Transport Layer," Applied Materials & Interfaces, vol. 12, 2020, 12 pages.
Shrivastav, N. et al., "Investigations aimed at producing 33% efficient perovskite-silicon tandem solar cells through device simulations," RSC Advances, vol. 11, 2021, 9 pages.
Wu, W-Q. et al., "Molecular doping enabled scalable blading of efficient hole-transport-layer-free perovskite solar cells," Nature Communications, vol. 9, 2018, 8 pages.
Ye, S. et al., "A Strategy to Simplify the Preparation Process of Perovskite Solar Cells by Co-deposition of a Hole-Conductor and a Perovskite Layer," Advanced Materials, Materials Views, vol. 28, 2016, 7 pages.
Zhou, Z. et al., "Organic/Inorganic Hybrid p-Type Semiconductor Doping Affords Hole Transporting Layer Free Thin-Film Perovskite Solar Cells with High Stability," ACS Applied Materials & Interfaces, vol. 11, 2019, 9 pages.
Zhou, Z. et al., "Highly efficient inverted hole-transport-layer-free perovskite solar cells," Journal of Materials Chemistry A, vol. 8, 2020, 10 pages.

* cited by examiner

A B X
A) 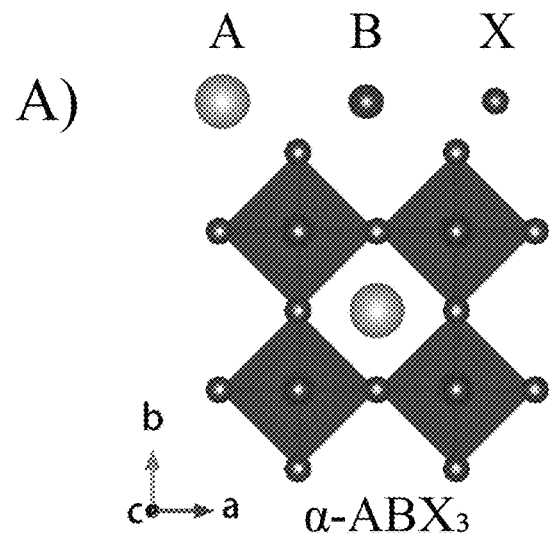
α-ABX$_3$
B) 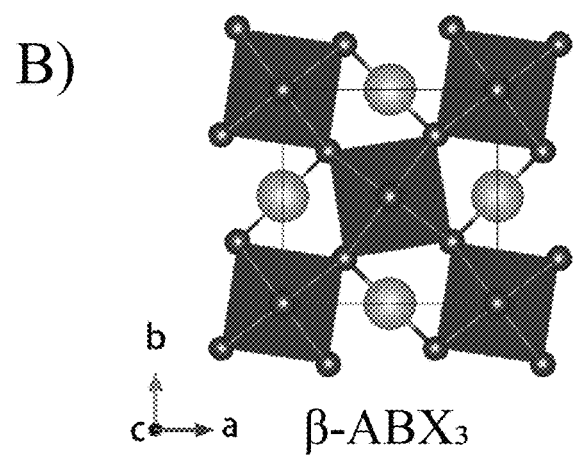
β-ABX$_3$
C) 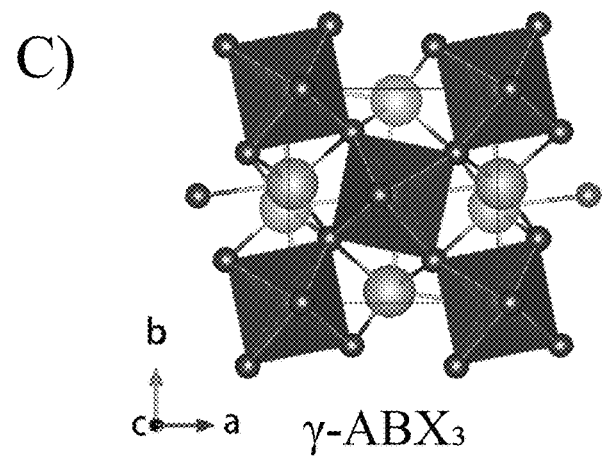
γ-ABX$_3$
Figure 2A

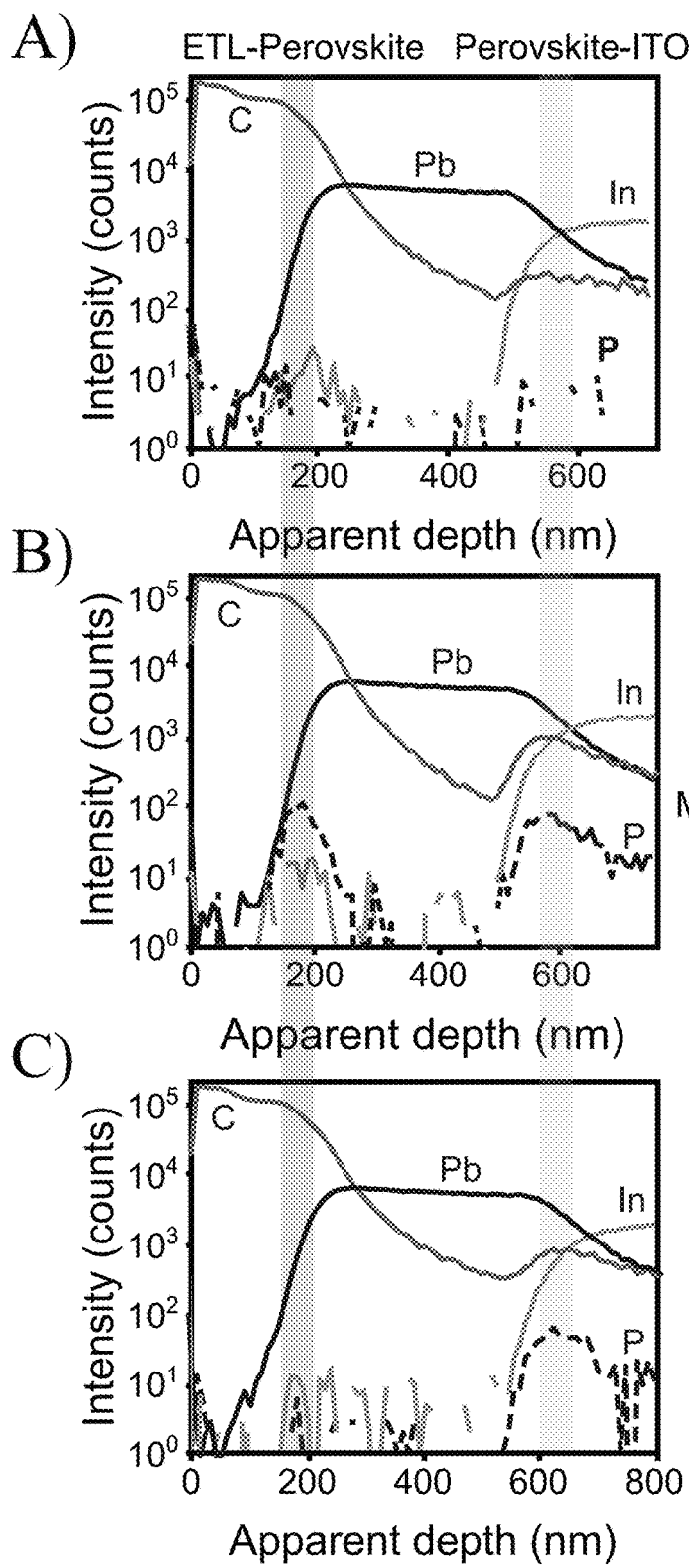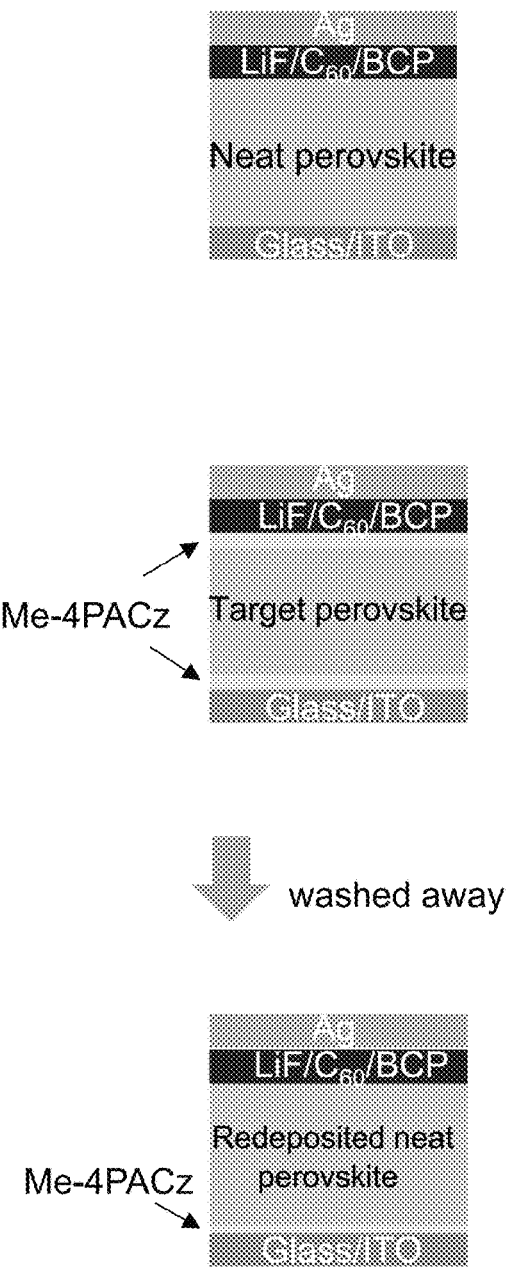
Figure 8C

Figure 19 (21)

FORMULATIONS FOR THE MANUFACTURE OF PEROVSKITE DEVICES

CROSS-REFERENCE TO RELATED APPLICATIONS

This application claims priority from U.S. Provisional Patent Application No. 63/363,327 filed on Apr. 21, 2022, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Solution-processable perovskite solar cells (PSCs) have attained power conversion efficiencies (PCE) over 25% based on the advances in compositional engineering, solvent engineering, interface engineering, phase stabilization, and defect passivation. However, the successful transfer of this technology from the lab-scale to economically viable manufacturing scale is challenging. There remains, therefore, the need for new methods of producing PSCs that are economically scalable to the manufacturing level.

SUMMARY

An aspect of the present disclosure is a device that includes a perovskite layer; and a first layer that includes a molecule having a structure according to formula (I)

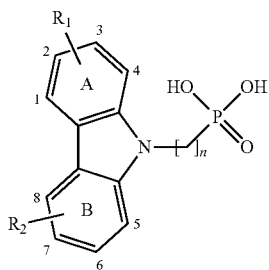

(I)

where the perovskite layer and the first layer are in physical contact, n is between 1 and 10, inclusively, $R_1$ includes at least one of hydrogen, a first alkyl group, a first alkoxy group, and/or a first halogen, $R_2$ includes at least one of hydrogen, a second alkyl group, a second alkoxy group, and/or a second halogen, $R_1$ is bonded to aromatic ring (A) at carbon atom (1), carbon atom (2), carbon atom (3), or carbon atom (4), $R_2$ is bonded to aromatic ring (B) at carbon atom (5), carbon atom (6), carbon atom (7), or carbon atom (8), and $R_1$ and $R_2$ are the same or different.

In some embodiments of the present disclosure, the first alkyl group and the second alkyl group may independently include at least one of a methyl group, an ethyl group, and/or a propyl group. In some embodiments of the present disclosure, the first alkoxy group and the second alkoxy group may independently include at least one of a methoxy group, an ethoxy group, and/or a propoxy group. In some embodiments of the present disclosure, the first halogen and the second halogen may independently include at least one of fluorine, chlorine, bromine, and/or iodine. In some embodiments of the present disclosure, $R_1$ may be bonded to aromatic ring (A) at carbon atom (2). In some embodiments of the present disclosure, $R_2$ may be bonded to aromatic ring (B) at carbon atom (7).

In some embodiments of the present disclosure, the molecule may include at least one of (2-(3,6-dimethyl-9H-carbazol-9-yl)ethyl)phosphonic acid (Me-2PACz), (4-(3,6-dimethoxy-9H-carbazol-9-yl)butyl)phosphonic acid (MeO-4PACz), (2-(3,6-dimethoxy-9H-carbazol-9-yl)ethyl)phosphonic acid (MeO-2PACz), (2-(9H-carbazol-9-yl)ethyl)phosphonic acid (2PACz), (4-(9H-carbazol-9-yl)butyl)phosphonic acid (4PACz), (2-(3,6-dibromo-9H-carbazol-9-yl)ethyl)phosphonic acid (Br-2PACz), (4-(3,6-dibromo-9H-carbazol-9-yl)butyl)phosphonic acid (Br-4PACz), and/or (6-(3,6-Dimethyl-9H-carbazol-9-yl)hexyl) phosphonic acid (Me-6PACz).

In some embodiments of the present disclosure, the first layer may have a thickness between about 0.1 nm and about 10 nm. In some embodiments of the present disclosure, the perovskite layer may include at least one of a zero-dimensional (0D) structure, a one-dimensional (1D) structure, a two-dimensional (2D) structure, and/or a three-dimensional (3D) structure. In some embodiments of the present disclosure, the perovskite layer may include at least three of cesium, formamidinium (FA), methylammonium (MA), lead, tin, iodide, chloride, iodide, and/or bromide. In some embodiments of the present disclosure, the perovskite layer may have a grain size between 100 nm and 500 nm.

In some embodiments of the present disclosure, a device may further include a second layer that includes the molecule, where the perovskite layer is positioned between the first layer and the second layer, and the perovskite layer and the second layer are in physical contact. In some embodiments of the present disclosure, a device may further include a contact layer, where the first layer is positioned between the contact layer and the perovskite layer. In some embodiments of the present disclosure, the contact layer may include a transparent conducting oxide (TCO). In some embodiments of the present disclosure, a device may further include a charge transfer layer (CTL), where the second layer is positioned between the CTL and the perovskite layer. In some embodiments of the present disclosure, the CTL may be an electron transfer layer (ETL). In some embodiments of the present disclosure, the ETL may include at least one of a metal oxide or a fullerene.

An aspect of the present disclosure is a composition that includes a perovskite precursor, a solvent, and a molecule having a structure according to formula (I)

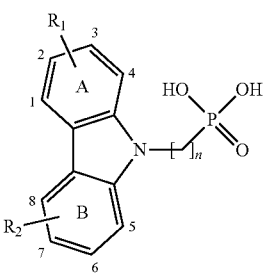

(I)

where n is between 1 and 10, inclusively, $R_1$ includes at least one of hydrogen, a first alkyl group, a first alkoxy group, and/or a first halogen, $R_2$ includes at least one of hydrogen, a second alkyl group, a second alkoxy group, and/or a second halogen, $R_1$ is bonded to aromatic ring (A) at carbon atom (1), carbon atom (2), carbon atom (3), or carbon atom (4), $R_2$ is bonded to aromatic ring (B) at carbon atom (5), carbon atom (6), carbon atom (7), or carbon atom (8), and $R_1$ and $R_2$ are the same or different.

An aspect of the present disclosure is a method that includes preparing a solution that includes a perovskite precursor, a solvent, and a molecule having a structure according to formula (I)

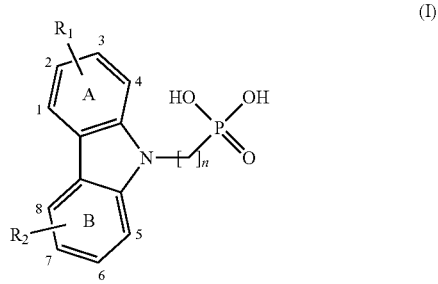

where, n is between 1 and 10, inclusively, $R_1$ includes at least one of hydrogen, a first alkyl group, a first alkoxy group, and/or a first halogen, $R_2$ includes at least one of hydrogen, a second alkyl group, a second alkoxy group, and/or a second halogen, $R_1$ is bonded to aromatic ring (A) at carbon atom (1), carbon atom (2), carbon atom (3), or carbon atom (4), $R_2$ is bonded to aromatic ring (B) at carbon atom (5), carbon atom (6), carbon atom (7), or carbon atom (8), and $R_1$ and $R_2$ are the same or different. The method may also include applying the solution to a substrate to form a liquid layer on the substrate and treating the liquid layer to form a perovskite layer positioned adjacent to a first layer comprising the molecule. In some embodiments of the present disclosure, the treating may result in the forming of a second layer that includes the molecule, and the perovskite layer may be positioned between the first layer and the second layer.

BRIEF DESCRIPTION OF THE DRAWINGS

Some embodiments are illustrated in referenced figures of the drawings. It is intended that the embodiments and figures disclosed herein are to be considered illustrative rather than limiting.

FIG. 2A illustrates three possible corner-sharing phases for perovskites, Panel A) cubic phase (i.e., α-ABX₃), Panel B) a tetragonal crystalline phase (i.e., β-ABX₃), and Panel C) an orthorhombic crystalline phase (i.e., γ-ABX₃), according to some embodiments of the present disclosure.

FIG. 8C (9) illustrates time-of-flight secondary ion mass spectrometry (TOF-SIMS) profiling of solid perovskite layers along with a device stacks diagram depicting the various layers, according to some embodiments of the present disclosure. Panel A) corresponds to "neat" perovskite layers; Panel B) represents "target" perovskite layer; Panel C) represents "target" perovskite layers washed away with newly deposited "neat" perovskite layer.

REFERENCE NUMBERS

Figure 1A:
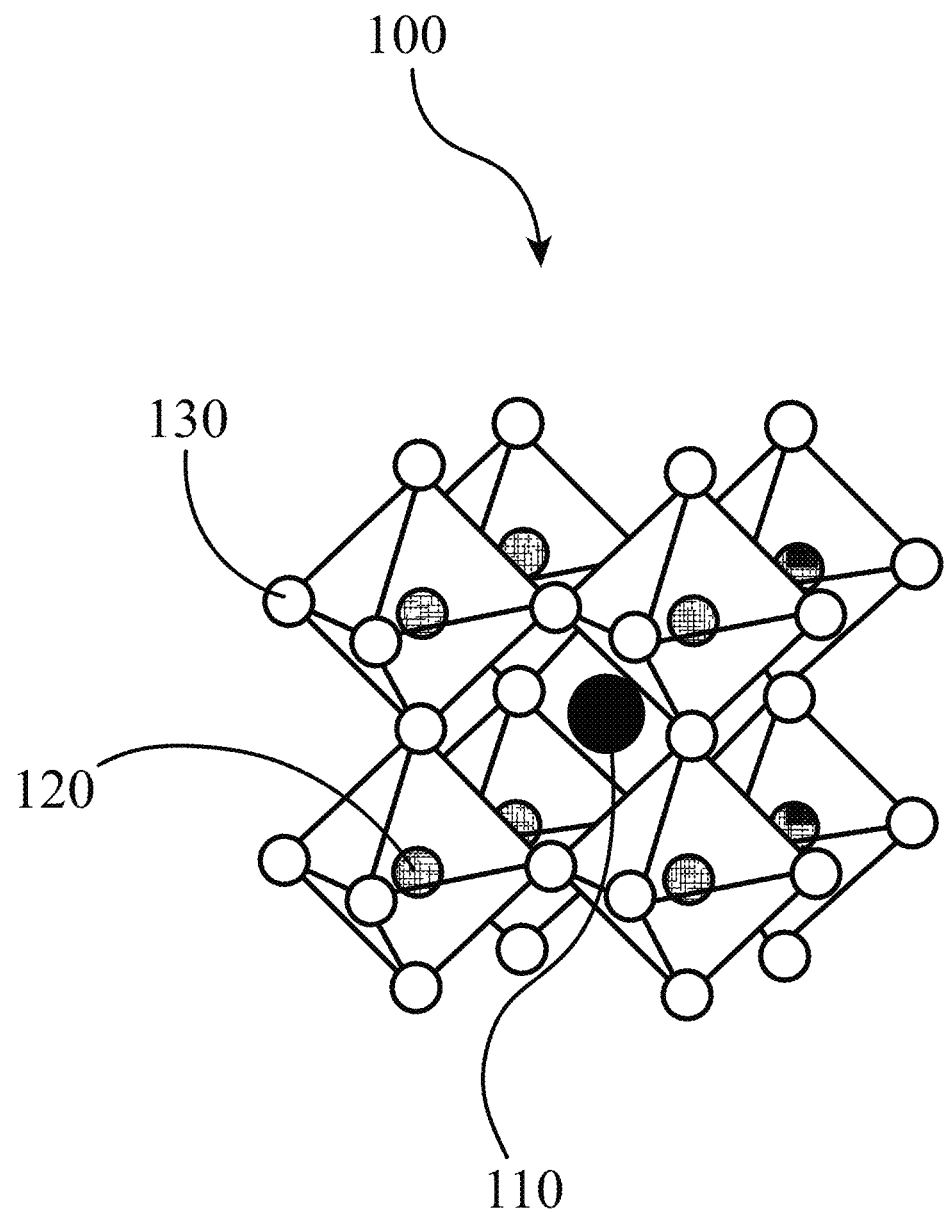
FIGS. 1A and 1B illustrate a perovskite in a corner-sharing, cubic phase arrangement, according to some embodiments of the present disclosure.

| 100 | perovskite |
| --- | --- |
| 110 | A-cation |
| 120 | B-cation |
| 130 | X-anion |
| 400 | method |
| 410 | device |
| 420 | perovskite precursor |
| 430 | additive |
| 440 | preparing |
| 450 | solution (i.e., ink) |
| 455 | applying |
| 457 | substrate |
| 458 | film/substrate |
| 460 | treating |
| 470 | intermediate device |
| 480 | finishing |
| 500 | first conducting layer |
| 510 | first additive layer (e.g., hole transfer layer (HTL)) |
| 520 | perovskite layer |
| 530 | second additive layer |
| 540 | electron transfer layer (ETL) |
| 550 | second conducting layer |

DETAILED DESCRIPTION

The present disclosure relates to perovskite precursor solutions and methods of using these solutions to manufacture perovskite-containing devices having superior physical properties and/or performance metrics. High efficiency perovskite solar cell device architectures typically include a layer of a hole transporting material (HTM), a layer of a light-absorbing (i.e., active) perovskite material, and a layer of an electron transporting material (ETM). Typically, each layer is deposited sequentially in separate, individual steps. The present disclosure provides formulations that, among other things, simplify the manufacturing process to fewer deposition steps. As described herein, in some embodiments of the present disclosure, at least an HTM layer and a perovskite layer are formed using a single coating step of a solution (i.e., ink) containing the perovskite precursors needed to form the targeted perovskite layer and an additive that self-assembles into a hole transporting layer (HTL) and/or the additive sufficiently modifies properties of an underlying layer so that it functions more effectively as an HTL.

After application of the solution to a substrate (e.g., an indium tin oxide layer (ITO)), due to conditions described herein, the additive contained within the solution may separate into a first layer and a second layer, with the perovskite active layer positioned adjacent to the first layer and/or positioned between the first layer and the second layer resulting from the additive. The first additive layer may collect and/or deposit onto the outer surface of a substrate and assemble into an ordered structure. In a final perovskite-containing device, a first additive layer positioned between the substrate and the perovskite active layer may function as an HTL and/or improve the hole-collecting functionality of the underlying layer. For example, in some embodiments of the present disclosure, an additive contained in the solution may transform an underlying layer, e.g., indium-doped tin oxide, to become a hole-selective contact. Among other things, it is believed that the second layer may improve the final device performance by passivating the surface of the perovskite layer, thereby improving the interfacial properties and the performance of the perovskite layer with its neighboring subsequently deposited electron transfer layer (ETL). Depending on the solution's composition and the solution processing conditions, a perovskite layer may form essentially free of the additive, as shown herein by depth profiling perovskite layers using time-of-flight secondary ion mass spectrometry (TOF-SIMS).

Therefore, as shown herein, a complete device may be fabricated by applying a precursor solution (that includes perovskite precursors and at least one additive) onto the surface of a first conducting layer (e.g., glass/ITO), forming (e.g., by heat treating) the HTM layer (from the additive) and a second additive layer with a solid perovskite layer positioned between, followed by the depositing of an ETL layer (e.g., $C_{60}$/BCP), and a second conducting layer (e.g., metal). This strategy provides multiple benefits, including simplification of the manufacturing process and overcoming surface wetting issues, which, in turn, leads to the manufacture of devices having excellent performance metrics, as shown herein.

Figure 1B:
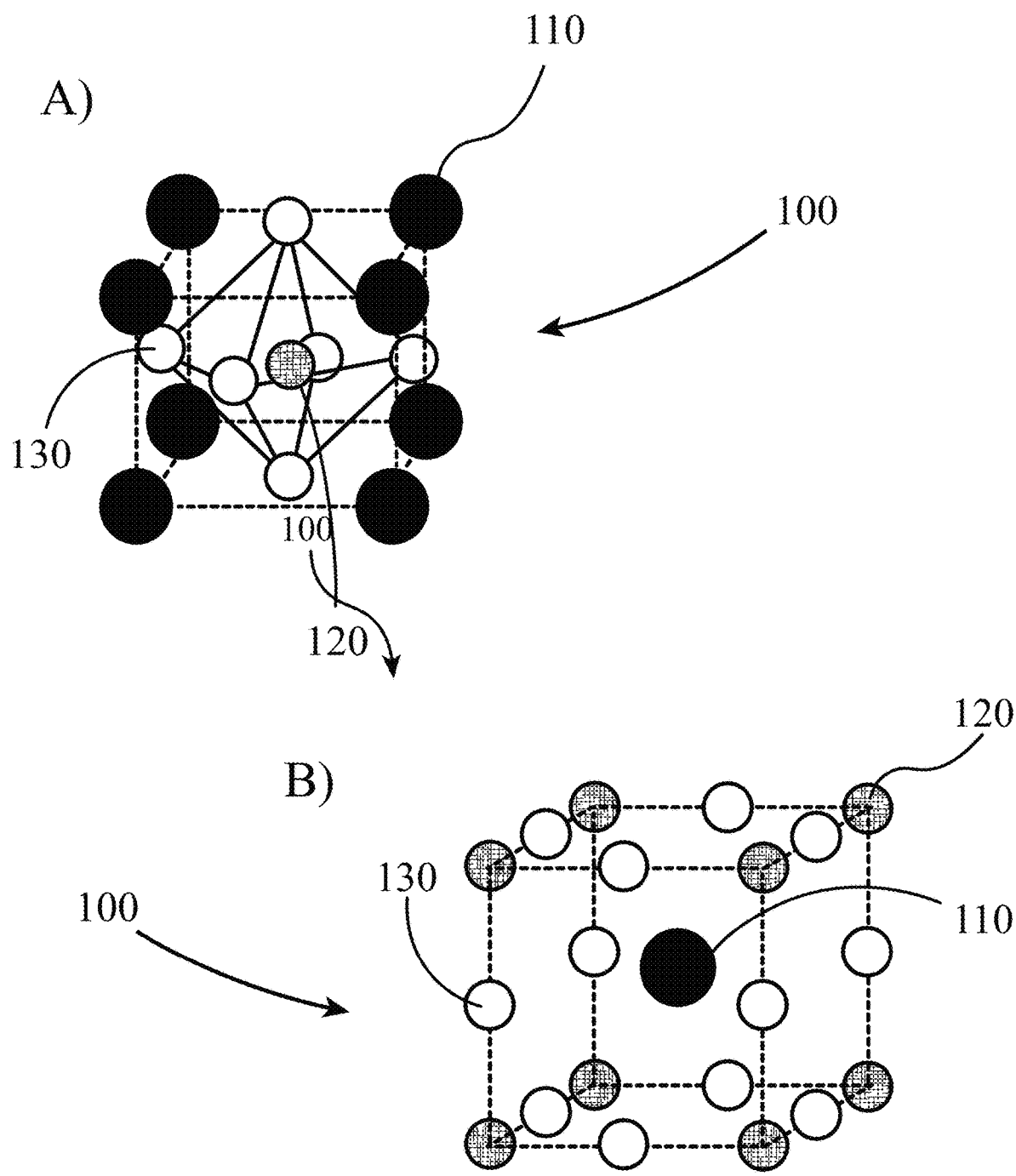

In general, the term "perovskite" refers to compositions having a network of corner-sharing $BX_6$ octahedra resulting in the general stoichiometry of $ABX_3$. FIGS. 1A and 1B illustrate that perovskites 100, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 1A illustrates that a perovskite 100 having an α-phase structure may be further characterized by eight $BX_6$ octahedra surrounding a central A-cation 110, where each octahedra is formed by six X-anions 130 surrounding a central B-cation 120 and each of the octahedra are linked together by "corner-sharing" of anions, X (130).

Panel A of FIG. 1B provides another visualization of a perovskite 100 in the α-phase, also referred to as the cubic phase. This is because, as shown in FIG. 1B, a perovskite in the α-phase may be visualized as a cubic unit cell, where the α-cation 120 is positioned at the center of the cube, an A-cation 110 is positioned at each corner of the cube, and an X-anion 130 is face-centered on each face of the cube. Panel B of FIG. 1B provides another visualization of the cubic unit cell of an α-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIG. 1B, the A-cations 110, the B-cations 120, and the X-anions 130 balance to the general formula $ABX_3$ of a perovskite, after accounting for the fractions of each atom shared with neighboring unit cells. For example, referring to Panel A of FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in Panel A of FIG. 1B, the stoichiometry simplifies to B=1, A=8*0.125=1, and X=6*0.5=3, or $ABX_3$. Similarly, referring again to Panel B of FIG. 1B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to Panel B of FIG. 1B, the X-anions 130 and the B-cations 120 of a perovskite in the α-phase are aligned along an axis; e.g., where the angle at the X-anion 130 between two neighboring B-cations 120 is exactly 180 degrees, referred to herein as the tilt angle. However, as shown in FIG. 2A, a perovskite 100 may assume other corner-sharing crystalline phases having tilt angles not equal to 180 degrees.

FIG. 2A illustrates that a perovskite can assume other crystalline forms while still maintaining the criteria of an $ABX_3$ stoichiometry with neighboring $BX_6$ octahedra maintaining X anion (130) corner-sharing. Thus, in addition to α-$ABX_3$ perovskites (in the cubic phase) having a tilt angle of 180 degrees, shown in Panel A of FIG. 2A, a perovskite may also assume a tetragonal crystalline phase (i.e., β-$ABX_3$) (see Panel B of FIG. 2A) and/or an orthorhombic crystalline phase (i.e., γ-$ABX_3$) (see Panel C of FIG. 2A), where the adjacent octahedra are tilted relative to the reference axes a, b, and c.

Figure 2B:
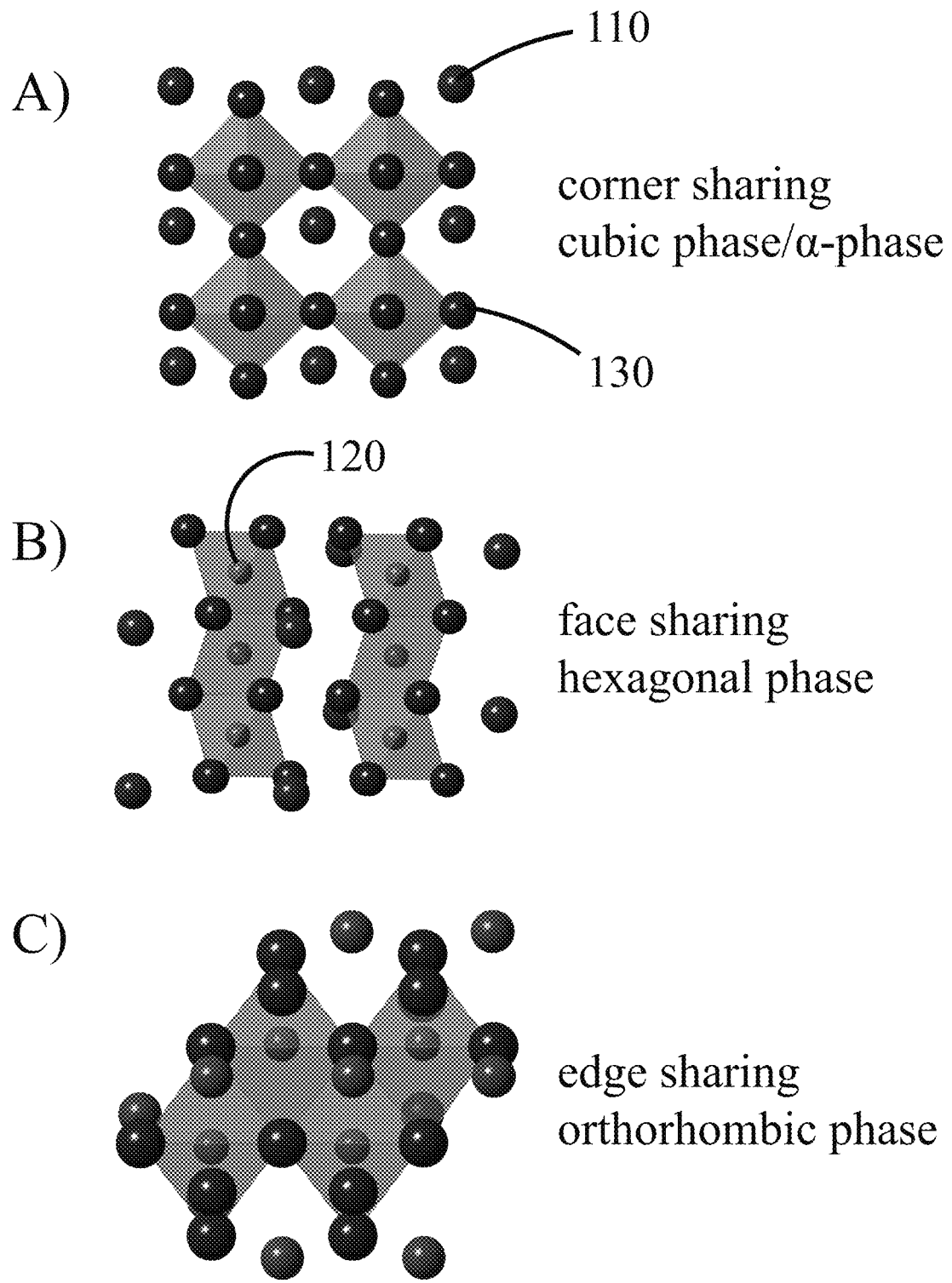
FIG. 2B illustrates a perovskite in one of the three possible phases, the cubic phase (i.e., α-phase), compared to two non-perovskite phases (i.e., non-corner sharing), according to some embodiments of the present disclosure.

FIG. 2B illustrates that the elements used to construct a perovskite, as described above, A-cations 110, B-cations 120, and X-anions 130, may result in 3D non-perovskite structures; i.e., structures where neighboring $BX_6$ octahedra are not X-anion 130 corner-sharing and/or do not have a unit structure that simplifies to the $ABX_3$ stoichiometry. Referring to FIG. 2B, Panel A illustrates a perovskite in the cubic phase, i.e., α-$ABX_3$, compared to a non-perovskite structure constructed of face-sharing $BX_6$ octahedra resulting in a hexagonal crystalline structure (see Panel B of FIG. 2B) and a non-perovskite structure constructed of edge-sharing $BX_6$ octahedra resulting in an orthorhombic crystalline structure (see Panel C of FIG. 2B).

Figure 3:
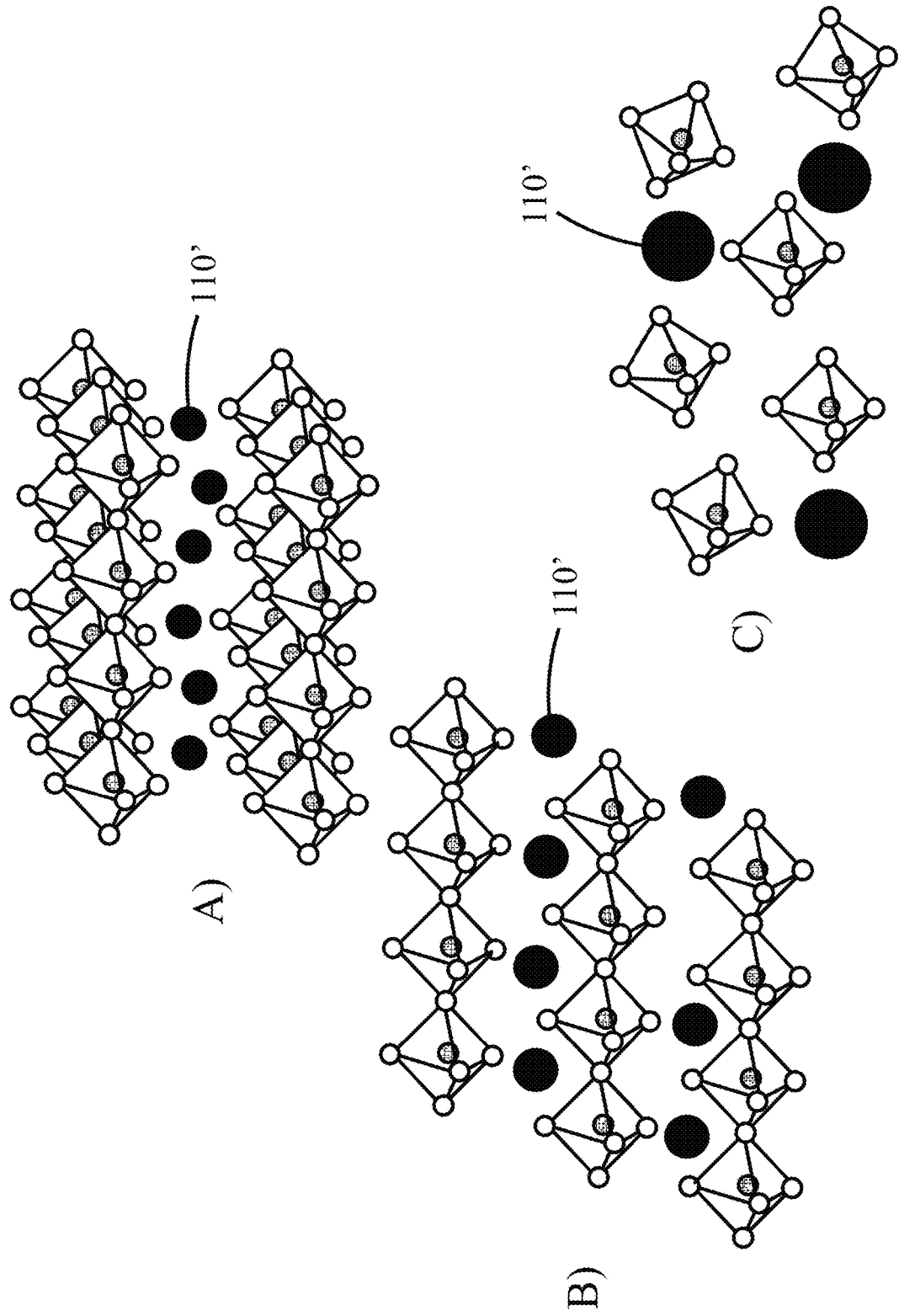
FIG. 3 illustrates 2D, 1D, and 0D perovskite-like structures, in Panels A), B), and C), respectively, according to some embodiments of the present disclosure.

Further, referring now to FIG. 3, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 3, such lower dimensional, perovskite-like structures still include the $BX_6$ octahedra, and depending on the dimensionality, e.g., 2D or 1D, may still maintain a degree of X-anion corner-sharing. However, as shown in FIG. 3, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 3, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}B_nX_{3n+1}$, where monovalent (m=2) or divalent (m=1) A' cations 110' can intercalate between the X-anions of 2D perovskite-like sheets. Referring to Panel B of FIG. 3, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 3, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material. For simplification, as used herein the term "perovskite" will refer to each of the structures illustrated in FIGS. 1A through 3, unless specified otherwise.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl (C4), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_3Br_x$. Thus, a perovskite 100 may have more than one halogen element, where the various halogen elements are present in non-integer quantities, e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 1A and 1B, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

The methods and compositions described herein may be applied to devices that include perovskite composition and/or organic compositions, for example, perovskite solar cells, perovskite light emitting diodes, organic solar cell, and/or organic light-emitting diodes. Other devices that may take advantage of the compositions and/or methods described herein include displays and sensors.

As described herein, in some embodiments of the present disclosure, an additive for synthesizing at least an HTM layer and a perovskite layer from a single solution that includes the additive and the perovskite precursors, in a single manufacturing step, is [4-(3,6-dimethyl-9H-carbazol-9-yl)butyl]phosphonic acid (Me-4PACz). Other additives that may be used instead of, or in addition to Me-4PACz include other alkylated and/or alkoxylated phosphonic acid functionalized carbazoles, with examples including Me-2PACz [(2-(3,6-dimethyl-9H-carbazol-9-yl)ethyl)phosphonic acid], MeO-4PACz [(4-(3,6-dimethoxy-9H-carbazol-9-yl)butyl)phosphonic acid], MeO-2PACz [(2-(3,6-dimethoxy-9H-carbazol-9-yl)ethyl)phosphonic acid], 2PACz [(2-(9H-carbazol-9-yl)ethyl)phosphonic acid], 4PACz [(4-(9H-carbazol-9-yl)butyl)phosphonic acid], Br-2PACz [(2-(3,6-dibromo-9H-carbazol-9-yl)ethyl)phosphonic acid], Br-4PACz [(4-(3,6-dibromo-9H-carbazol-9-yl)butyl)phosphonic acid], Me-6PACz [(6-(3,6-Dimethyl-9H-carbazol-9-yl)hexyl)phosphonic acid], and/or combinations thereof. In general, any molecule having a hydrocarbon chain having between 1 and 10 carbon atoms terminating at a first end with at least one of sulfur, fluorine, amine, a carboxylic acid group, and/or a phosphonic acid group and terminating at a second end with an aromatic functional group having a size approximately the same as a carbazole may be used as in additive using the methods described herein. The structures of Me-2PACz, Me-4PACz, MeO-4PACz, 2PACz and MeO-2PACz are shown in Scheme 1 below.

Scheme 1

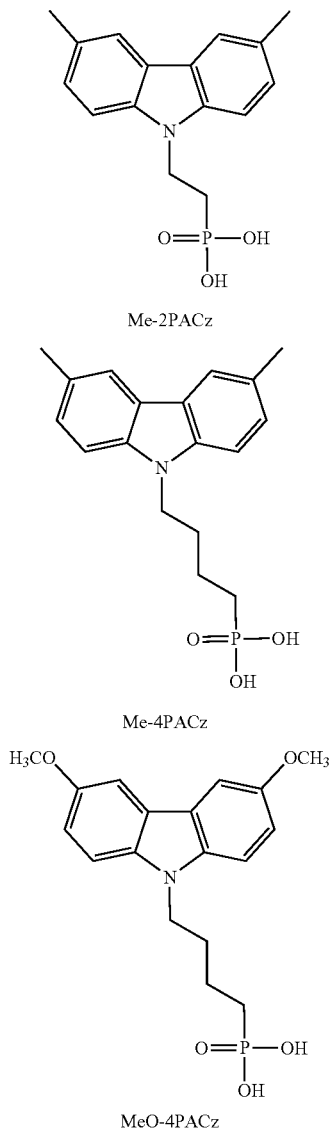

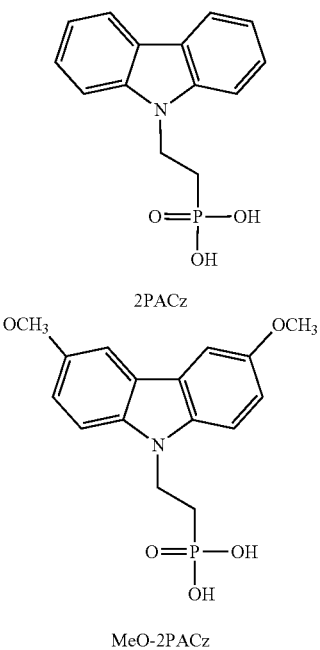

2PACz

MeO-2PACz

Structure 1 illustrates a generalized structure of an additive that may be included in a solution (i.e., ink), which also includes perovskite precursors, for the forming of a perovskite active layer positioned between two layers of the additive, or for forming a perovskite active layer adjacent to a single additive layer, according to some embodiments of the present disclosure.

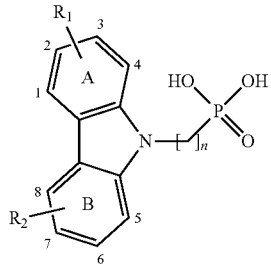

Structure 1

Referring to Structure 1, n may be between 1 and 10, or between 2 and 6, or between 3 and 4 (all ranges inclusive). Thus, the nitrogen atom of the carbazole may be connected to the phosphonic acid group by a hydrocarbon chain having between 1 and 10 carbon atoms, or between 2 and 6 carbon atoms, or between 3 and 4 carbon atoms. In some embodiments of the present disclosure, the hydrocarbon chain may be a straight chain or a branched chain. In some embodiments of the present disclosure, the hydrocarbon chain may be saturated or unsaturated. In some embodiments of the present disclosure, the hydrocarbon chain connecting a carbazole group to a phosphonic acid group may include elements in addition to carbon and hydrogen, for example, at least one atom of nitrogen, oxygen, phosphorus, and/or a halogen. In some embodiments of the present disclosure, the functional headgroup of the molecule may be, in addition to and/or in place of a phosphonic acid, at least one of a carboxylic acid, an ammonium, thiol, a boronic acid (—B(OH)$_2$). In some embodiments of the present disclosure. The functional head group of the additive may emanate from other positions on the carbazole.

Referring again to Structure 1, $R_1$ and $R_2$ may be the same functional group or different functional groups. In some embodiments of the present disclosure, at least one of $R_1$ and/or $R_2$ may include a hydrocarbon chain having between 1 and 8 carbon atoms. In some embodiments of the present disclosure, at least one of $R_1$ and/or $R_2$ may be a straight hydrocarbon chain or a branched hydrocarbon chain. As indicated in Structure 1, each of $R_1$ and $R_2$ may be covalently bonded to any of the aromatic rings' carbon atoms. Referring again to Structure 1, in some embodiments of the present disclosure $R_1$ may be bonded to the aromatic ring labeled A at any one of the carbons labeled 1, 2, 3, or 4 and $R_2$ may be independently bonded to the aromatic ring labeled B at any one of the carbons labeled 5, 6, 7, or 8. In some embodiments of the present disclosure $R_1$ may be bonded to the aromatic ring labeled A at the carbon labeled 2 and $R_2$ may be bonded to the aromatic ring labeled B at the carbon labeled 7.

Scheme 1 illustrates examples of $R_1$ and $R_2$ bonded to specific carbon atoms, however, this is provided for exemplary purposes and is not intended to be limiting. In some embodiments of the present disclosure, at least one of $R_1$ and/or $R_2$ may independently be a saturated hydrocarbon chain or an unsaturated hydrocarbon chain. In some embodiments of the present disclosure, at least one of $R_1$ and/or $R_2$ may independently include elements in addition to carbon and hydrogen, for example, at least one atom of nitrogen, oxygen, phosphorus, sulfur, selenium, and/or a halogen. In some embodiments of the present disclosure, at least one of $R_1$ and/or $R_2$ may independently include an alkyl group, an alkoxy group, an aromatic group, and combinations thereof. Examples of alkyl groups for at least one of $R_1$ and/or $R_2$ include a methyl group, an ethyl group, an n-propyl group, an iso-propyl group, and combinations thereof. Examples of alkoxy groups for at least one of $R_1$ and/or $R_2$ include a methoxy group, an ethoxy group, an n-propoxy group, and/or an iso-propoxy group. Examples of an aromatic group include a phenyl group or benzene ring.

Figure 4:
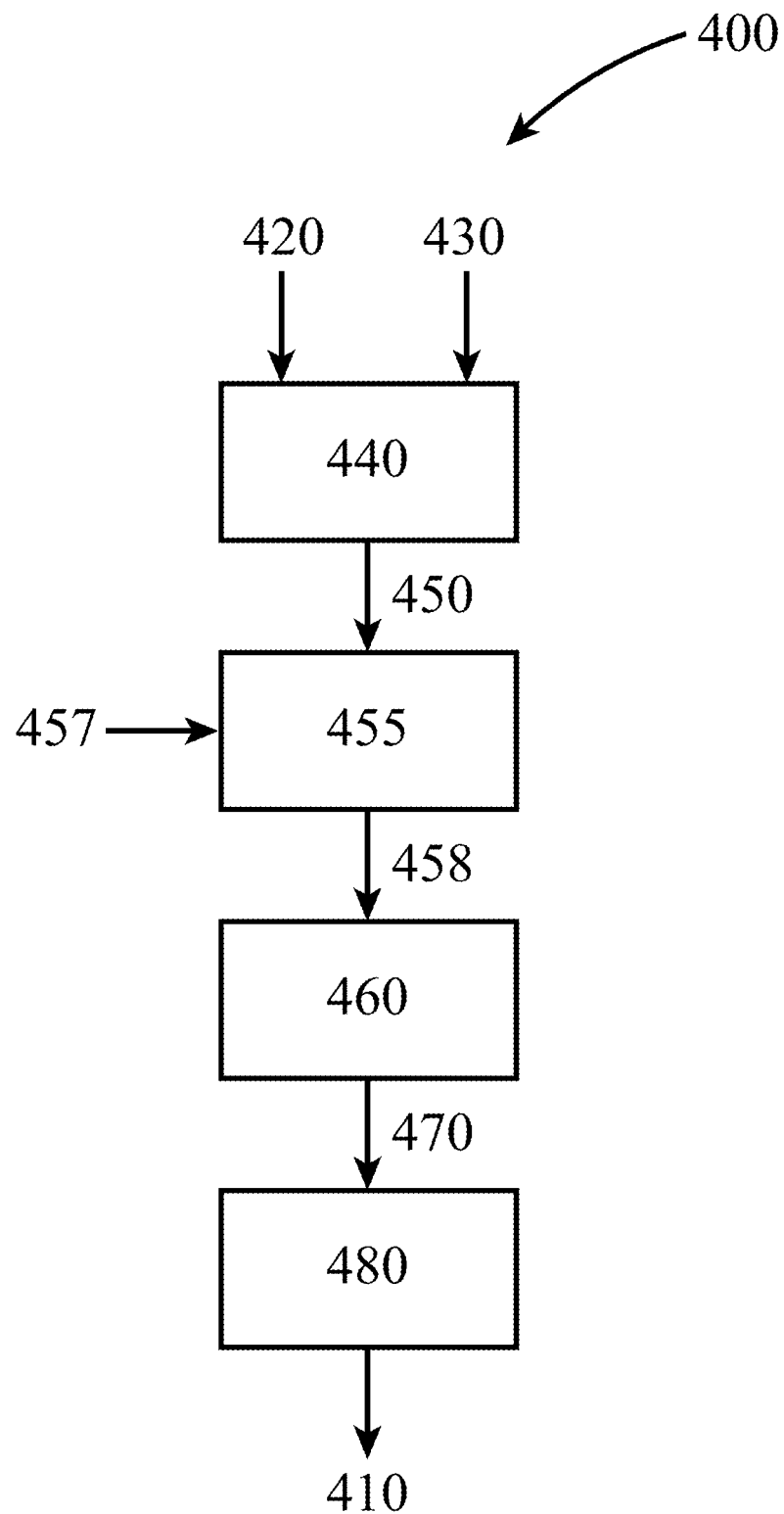
FIG. 4 illustrates a method for producing a device that includes a hole transfer layer (HTL) and a perovskite layer, according to some embodiments of the present disclosure.
Figure 5:
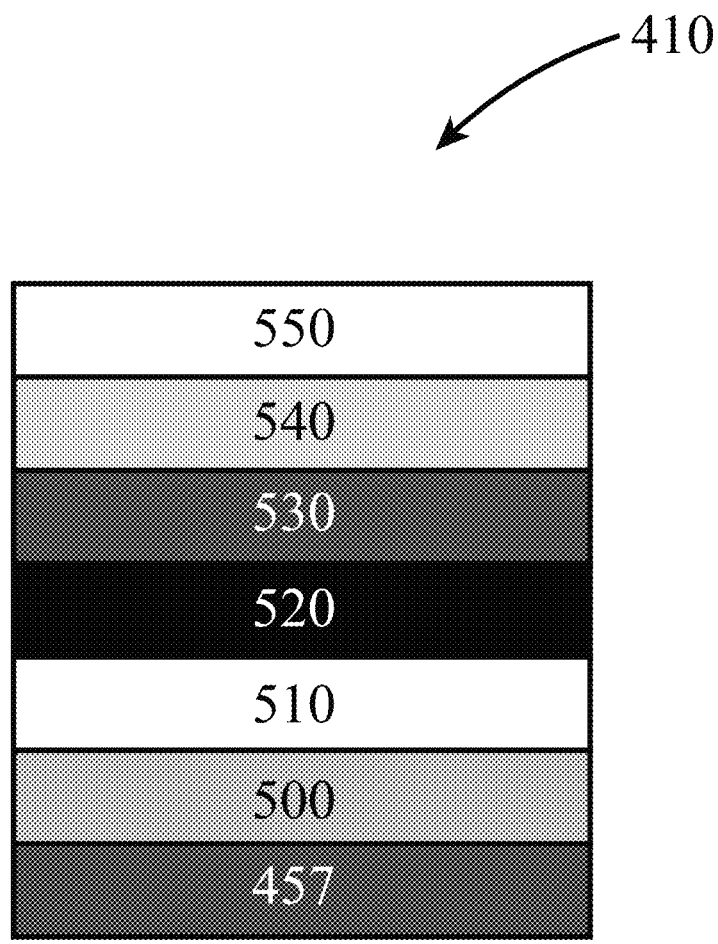
FIG. 5 illustrates a device manufacturing according to a method like that illustrated in FIG. 4, according to some embodiments of the present disclosure.

FIG. 4 illustrates an exemplary method 400 for manufacturing a device 410, with an exemplary device illustrated in FIG. 5. As shown herein, such a method 400 may utilize a solution 450 that includes at least one additive 430 and the perovskite precursor(s) 420 needed to synthesize in a single deposition step both an HTL and a perovskite layer 520. As shown in FIG. 4, a method 400 may begin with a preparing 440 of a solution 450 by combining at least one perovskite precursor 420 and at least one additive 430 with any other material(s) needed to produce a solution 450 capable of being applied to a substrate 457. For example, additional materials used for the preparing 440 of the solution 450 may include a solvent to, among other things, dissolve the perovskite precursors 420 and/or other materials, which may assist with acquiring fluid properties that enable the successful application of the solution 450 to the substrate 457 (e.g., liquid viscosity). Examples of solvents that may be used in a preparing 440 step to create a solution 450 may include dimethylformamide (DMF) and/or dimethyl sulfoxide (DMSO). Other solvents applicable to the methods described herein include at least one of n-methyl-2-pyrrolidone, gamma-butyrolactone, acetonitrile, alcohols (such as 2-methoxyethanol, methanol, ethanol etc.), water, and other polar solvents. The exact formulation of a solution 450 will depend on a variety of factors, including the material of construction of the substrate 457 and the final perovskite composition desired for the perovskite layer 520.

In some embodiments of the present disclosure, an additive 430 (see Scheme 1 and Structure 1) may be provided to a solution during the preparing 440 at a concentration relative to the total volume of the solution. For example, an additive 430 may be added at a concentration up to 20 mg/ml, or between greater than zero mg/ml and 2 mg/ml. The concentration of the additive 430 may be set to a value that enables the formation of a layer of additive molecules (e.g., one or more carbazoles) above and/or a layer of additive molecules below the perovskite film. For example, the concentration of the additive 430 may be calculated based on substrate area, intended perovskite film thickness, molecular density, and amount of solvent to cover the substrate. The additive concentration may be adjusted to, among other things, improve the quality of the grain size, the photoluminescence (PL) lifetime, and/or the mobility of ions within the perovskite films, and to improve the device performance.

In some embodiments of the present disclosure, the preparing 440 may be performed at a temperature between 20° C. and 150° C. In some embodiments of the present disclosure, the preparing 440 may be completed by providing mechanical agitation to the solution 450. For example, the preparing 440 may be performed using a stirred tank reactor, batch, and/or continuous fluid mixer such as a microfluidic mixer or a scaled version of a fluid handling device to mix the components of the solution 450 prior to coating (e.g., application to a substrate). In some embodiments of the present disclosure, the preparing 440 may be completed by mixing the solution 450 in a stirred tank reactor for a period of time up to an hour or longer. In some embodiments of the present disclosure, the preparing 440 may include mixing of the components of the solution 450 using at least one of ultrasound and/or a vortex mixer.

Referring again to FIG. 4, once the solution 450 has been prepared, a method 400 may continue with the applying 455 of the solution 450 to a substrate 457 to form a liquid film of the solution 450 on the substrate 457, referred to herein as a film/substrate 458. In some embodiments of the present disclosure, a substrate 457 may include the material for a first conducting layer 500 for the device 410 being manufactured. For example, a substrate 457, e.g., a glass layer, may include a transparent conducting oxide positioned on the glass layer, where the transparent conducting oxide may include at least one of indium-doped tin oxide (ITO), indium zinc oxide (IZO), fluorine doped tin oxide (FTO), a metal, and/or other conductors. Additionally, if applied onto a multijunction solar cell, the perovskite layer 520 may be deposited onto a multijunction device stack. So, in some embodiments of the present disclosure, a substrate 457, for example glass, may be provided with a first conductive layer 500, for example ITO, already positioned on the substrate 457, such that the solution 450 is applied to a surface of the first conducting layer 500. The molecular additive and spontaneous layer formation may also be used in conjunction with a more traditional HTL such as deposition onto a $NiO_x$, PTAA, PEDOT:PSS, p-TPD, and/or some other HTL to improve the hole extraction. The applying 455 may be performed using at least one of spin coating, dip coating, curtain coating, blade coating, spraying, and/or any other suitable method for applying a liquid solution to a solid surface.

Referring again to FIG. 4, once a film/substrate 458 (with the substrate 458 including a first conducting layer 500) has been formed by the applying 455 of the solution 450 to a substrate 457, the method 400 may continue with the treating 460 of the film/substrate 458, resulting in the forming of an intermediate device 470 having a substrate 457, a first conducting layer 500, an HTL constructed of the additive, and a perovskite layer 520, as illustrated in FIG. 5. During the treating 460, the liquid film of the solution 450 may transform into a solid perovskite layer 520 with the transfer of the additive 420 from the bulk liquid film to the outer surface of the perovskite layer 520 and/or the interface between the perovskite layer 520 and the first conducting layer 500 (e.g., ITO layer), thereby creating an additive containing first layer 510 having HTM properties at the perovskite/ITO interface and/or a second additive layer 530 positioned on the outward facing surfacing of perovskite layer 520.

The treating 460 may include at least one of heating the film/substrate 458, the addition of an anti-solvent (not shown) to a surface of the liquid ink film, exposing a surface of the film to a gas stream, and/or placing the wet film into vacuum chamber. In some embodiments of the present disclosure, the treating 460 may include heating the film/substrate 458 to a temperature above room temperature (approximately between 20° C. and 25° C.). In some embodiments of the present disclosure, the treating 460 may include heating the film/substrate 458 to a temperature between 20° C. and 200° C. In some embodiments of the present disclosure, the treating 460 may include contacting a surface of the film of the film/substrate 458 with an anti-solvent that includes at least one of chlorobenzene, toluene, anisole, diethyl ether, ethyl acetate, and/or methyl acetate. In some embodiments of the present disclosure, the treating 460 may include the hot casting of the perovskite films prepared by different methods (blade-coating, spin-coating, printing, drop-casting, or slot die coating) without using anti-solvent. In some embodiments of the present disclosure, the treating 460 may include the extraction of the solvent by placing the film/substrate 458 into vacuum. In some embodiments of the present disclosure, the treating 460 may include contacting a surface of the film of the film/substrate 458 with a gas stream including at least one of nitrogen, helium, argon, and/or air. In some embodiments of the present disclosure, a gas stream used for treating 460 may be substantially dry or humidified.

Thus, in some embodiments of the present disclosure, the treating 460 may result in an intermediate device 470 that includes a first additive layer 510 (e.g., an HTL) and a perovskite layer 520. In this example, the first additive layer 510 may be positioned between the perovskite layer and a first conducting layer 500. In some embodiments of the present disclosure, the treating 460 may result in an intermediate device 470 that includes a first additive layer 510 (e.g., an HTL), a perovskite layer 520, and a second additive layer 530, where the perovskite layer 520 is positioned between the first additive layer 510 and the second additive layer 530.

Referring again to FIG. 4, in some embodiments of the present disclosure, a method 400 that includes a preparing 440, an applying 450, and a treating 460 may result in an intermediate device 470 that includes (see FIG. 5) a substrate 457, a first conducting layer 500, an HTL constructed of the additive 430, a perovskite layer 520, and a second additive layer 530. In some embodiments of the present disclosure, a first additive layer 510, acting as an HTL, may be constructed of at least one of an alkylated and/or an alkoxylated phosphonic acid functionalized carbazole (see Scheme 1 and Structure 1), with examples including Me-2PACz, Me-4PACz, and MeO-4PACz. In some embodiments of the present disclosure, a first additive layer 510 constructed of such a functionalized carbazole material may, and acting as an HTL, may have a thickness of between about one functionalized carbazole molecule and 10 functionalized carbazole molecules. In some embodiments of the present disclosure, a first additive layer 510, performing the function of an HTL, containing a functionalized carbazole material may have a thickness between 0.1 nm and 10 nm. In some embodiments of the present disclosure, a perovskite layer 520 may have a thickness between 0.1 nm and 100 µm. In some embodiments of the present disclosure, a second additive layer 530 containing a functionalized carbazole material may have a thickness between 0.1 nm and 100 nm. As previously stated, in some embodiments of the present disclosure, a second additive layer 530 may passivate the surface of the perovskite layer 520 that is eventually in physical contact with an ETL 540.

Referring again to FIG. 4, a method 400 may conclude with one or more finishing 480 steps, as needed on a particular manufacturing line, to produce a specific device 410 of interest. Thus, in some embodiments of the present disclosure, a method 400 may continue with the depositing of an ETL 540 (see FIG. 5) onto the perovskite layer 520 and/or the second additive layer 530. This exemplary first finishing step (not shown) to deposit an ETL 540 may be followed by a second finishing step (not shown) for depositing a second conducting layer 550 onto the ETL 540. Therefore, as shown in FIG. 5, in some embodiments of the present disclosure, a method 400 like that illustrated in FIG. 4, may result in the manufacture of a device 410 having, in order, a substrate 457 (e.g., glass), a first conducting layer 500 (e.g., ITO), an HTL that includes the additive 430, a perovskite layer 520, a second additive layer 530 that includes the additive 430, an ETL 540, and a second conducting layer 550. Materials for an ETL 550 include at least one of tin oxide and/or a fullerene such as $C_{60}$ in combination with bathocuproine (BCP), a hole blocking layer. The exemplary method 400 illustrated in FIG. 4 and exemplary device 410 illustrated in FIG. 5 are provided for illustrative purposes. Other methods, using additives 430 as described herein may include more or fewer steps, resulting in devices that may include more layers, fewer layers, or the same number of layers in the final device architecture. Such methods and devices are considered within the scope of the present disclosure.

Referring again to FIG. 5, without wishing to be bound by theory, the exemplary device 410 is shown with a distinct HTL (i.e., 510 first additive layer) positioned on a distinct first conducting layer 500. As described above, an HTL may result from the self-assembling of the additive 430. So, as described above, the layer resulting from the self-assembling additive 430 may form as a distinct layer on the first conducting layer 500, also a distinct layer. The result is a layer or a combination of layers that behave as an HTL. Thus, a first additive layer 510 resulting from a self-assembling additive 430 may by itself act as an HTL; i.e., the first additive layer 510 may itself be an HTL. However, from a functional perspective, it may be the combination of the layer resulting from the self-assembling additive 430 positioned on a first conducting layer 500 that provides the hole-transfer characteristics. In other words, the forming of a first layer 510 of the additive on the first conducting layer 500, e.g., ITO, may result in a first conducting layer 500 that behaves like an HTL. Regardless, as described herein, the deposition of a layer of additive 430, referred to herein as the first additive layer 510 for simplicity, on a first conducting layer 500, results in a device 410 having one or both of these layers, a distinct HTL and/or a first conducting layer 500 that is modified by the additive such that it behaves like an HTL, by providing the hole-transfer properties needed for the device 410 to function as a solar cell.

As described above, the present disclosure relates to, among other things, a single solution processing step for manufacturing high-efficiency PSCs enabled by simultaneously forming an HTL and/or a hole selective contact and a highly passivated perovskite active layer. The phosphonic acid additives were mixed directly into the perovskite precursor solution, which resulted in the phosphonic acid additives self-assembling from the perovskite precursor onto an ITO substrate upon treating, resulting in the formation of an excellent hole selective contact. For the example of Me-4PACz as the additive, the Me-4PACz also passivated defects, which improved the optoelectronic properties of the final solid perovskite layers, delivering 22.6% PCE for 1.56 eV bandgap PSCs and 20% for 1.68 eV wide bandgap PSCs, in addition to providing long-term operational stability.

Figure 6:
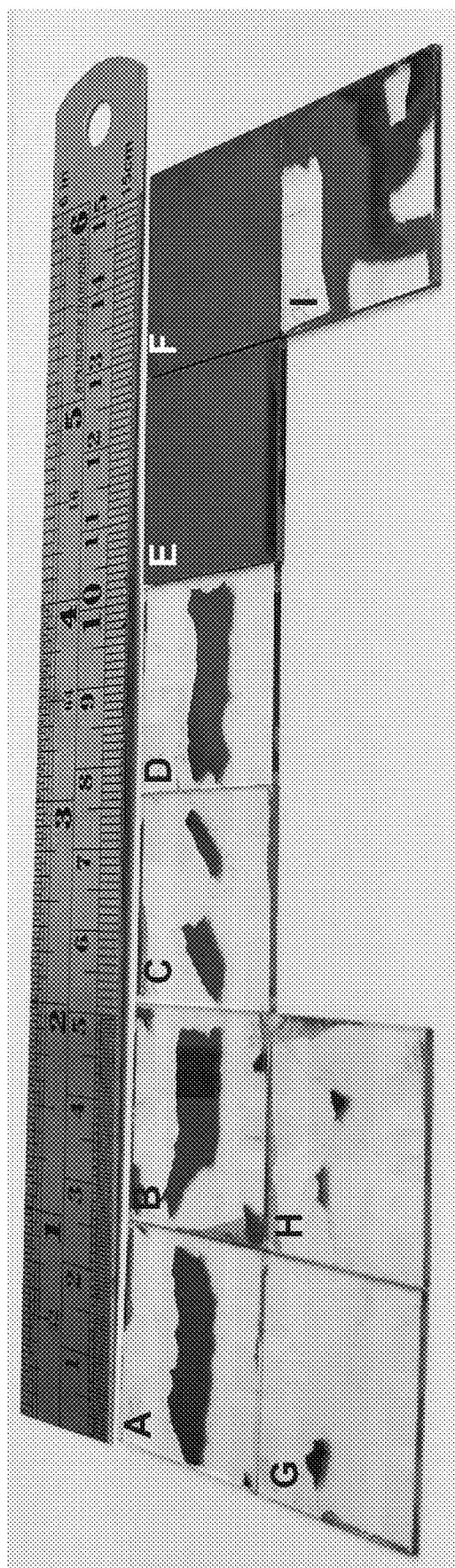
FIG. 6 illustrates photographic images of perovskite layers manufactured using the methods described herein at different conditions, according to some embodiments of the present disclosure.
Figure 7:
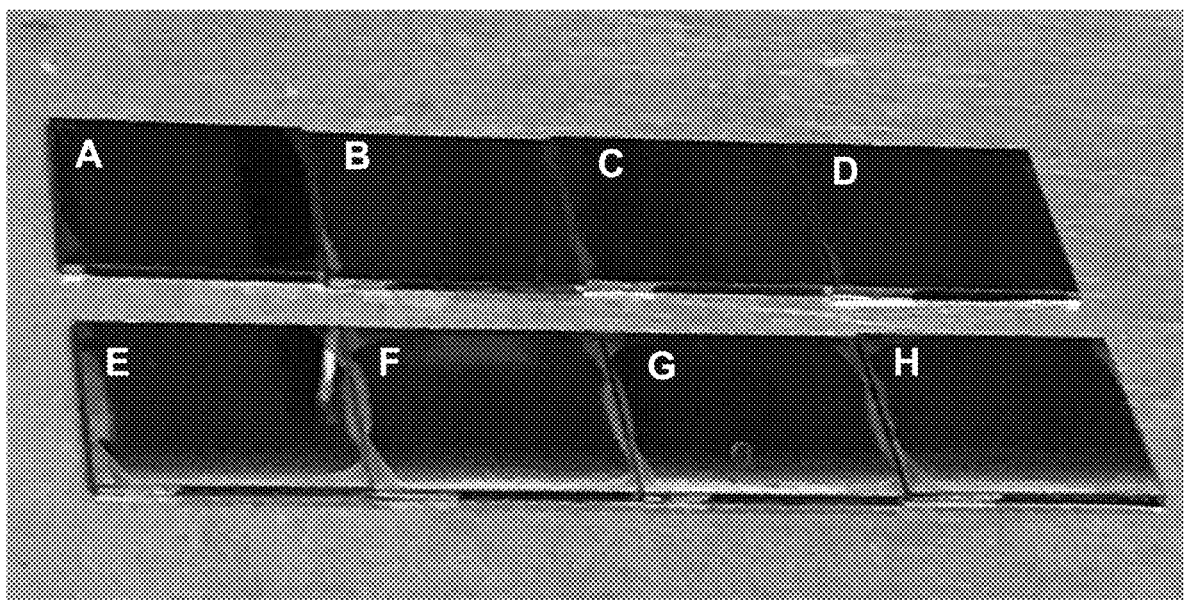
FIG. 7: Panels A) to D) illustrate photographic images of ITO/perovskite manufactured using a precursor solution having 0.5 mg/ml 2PACz, according to some embodiments of the present disclosure. The perovskite precursor solution was spin-coated on the ITO surface at 2000 rpm for 2 s and 4000 rpm for 20 s. Panels E) to H) illustrate photographic images of devices having the architecture ITO/2PACz SAM/"neat" perovskite. For these devices, a solution having 1 mg/ml 2PACz in ethanol was spin-coated on the ITO surface at 4000 rpm for 30 s and the "neat" perovskite precursor solution was spin-coated on ITO/SAM at 2000 rpm for 2 s and 4000 rpm for 20 s.

In one example, phosphonic acid additives with carbazole-containing molecules (e.g., Me-4PACz) were introduced to a precursor solution to make a perovskite having a ~1.56 eV bandgap with the composition of $Cs_{0.05}(FA_{0.92}MA_{0.08})_{0.95}Pb(I0.92Br_{0.08})_3$ (FA, formamidinium; MA, methylammonium) in 4:1 DMF:DMSO solvent with various concentrations of Me-4PACz added between 0 and 2 mg/ml. As defined herein, a perovskite layer synthesized from a perovskite precursor-containing solution that also contained an additive (e.g., with Me-4PACz) is referred to as a "target" perovskite and a perovskite layer synthesized from a perovskite precursor solution absent an additive (e.g., no Me-4PACz included) is referred to as a "neat" perovskite. The perovskite precursor solutions for synthesizing "target" perovskites were directly deposited onto ITO-coated glass substrates without the prior deposition of an HTL onto the ITO-coated glass substrates. In parallel, neat perovskite layers were also formed on glass/ITO (i.e., substrate/first conducting layer) and glass/ITO/Me-4PACz (i.e., substrate/first conducting layer/HTL). The neat perovskite layers deposited on ITO/Me-4PACz showed very poor coverage due to poor wetting, which may be due to the methyl substitutions of this carbazole-containing additive (see FIG. 6, which is described more below), compared to neat perovskite layers deposited on ITO/2PACZ (i.e., first conducting layer/HTL) (see FIG. 7). The target perovskite layer synthesized from a perovskite precursor solution containing Me-4PACz achieved full coverage on a glass/ITO surface comparable to the neat perovskite layer deposited on glass/ITO resulting from a perovskite precursor solution having no additive in its recipe.

Referring again to FIG. 6, the conditions used to synthesize each perovskite layer A-I are described below:
(Panel A) ITO/Me-4PACz SAM/neat perovskite (referring to an ITO conducting layer positioned beneath a Me-4PACz self-assembled HTL layer positioned beneath a perovskite layer made without any additive). A 0.5 mg/ml Me-4PACz in ethanol solution was spin-coated on an ITO substrate at 4000 rpm for 30 seconds and annealed at 100° C. for 10 minutes. The neat perovskite film was subsequently spin-coated onto the ITO/SAM device at 2000 rpm for 2 seconds and 4000 rpm for 20 seconds.
(Panel B) ITO/Me-4PACz SAM/neat perovskite. 0.5 mg/ml Me-4PACz in ethanol was spin-coated on ITO substrate at 4000 rpm for 30 seconds and annealed at 100° C. for 10 minutes. The neat perovskite film was spin-coated on ITO/SAM at 4000 rpm for 22 seconds.

(Panel C) ITO/Me-4PACz SAM/neat perovskite. 1 mg/ml Me-4PACz in ethanol was spin-coated on ITO substrate at 4000 rpm for 30 seconds and annealed at 100° C. for 10 minutes. The neat perovskite film was spin-coated on ITO/SAM at 2000 rpm for 2 seconds and 4000 rpm for 20 seconds.

(Panel D) ITO/Me-4PACz SAM/neat perovskite. 1 mg/ml Me-4PACz in ethanol was spin-coated on ITO substrate at 4000 rpm for 30 seconds and annealed at 100° C. for 10 minutes. The neat perovskite film was spin-coated on ITO/SAM at 4000 rpm for 22 seconds.

(Panel E) ITO/neat perovskite. The neat perovskite film was spin-coated on ITO at 2000 rpm for 2 seconds and 4000 rpm for 20 seconds.

(Panel F) ITO/target perovskite processed with 0.5 mg/ml Me-4PACz in precursor. The target perovskite film was spin-coated on ITO at 2000 rpm for 2 seconds and 4000 rpm for 20 seconds.

(Panel G) ITO/Me-4PACz SAM/neat perovskite washed away/redeposited neat perovskite. The neat perovskite film processed with the same conditions described for Panel A was washed away with DMF and a new neat perovskite layer was redeposited onto the Me-4PACz HTL at 2000 rpm for 2 seconds and 4000 rpm for 20 seconds.

(Panel H) ITO/Me-4PACz SAM/neat perovskite washed away/redeposited neat perovskite. The neat perovskite film processed with the same conditions described for Panel B was washed away with DMF and redeposited neat perovskite at 2000 rpm for 2 s and 4000 rpm for 20 s.

(Panel I) ITO/target perovskite washed away/redeposited neat perovskite. The target perovskite film processed with the same conditions described for Panel F was washed away with DMF and redeposited neat perovskite at 2000 rpm for 2 s and 4000 rpm for 20 s.

Figure 8A:
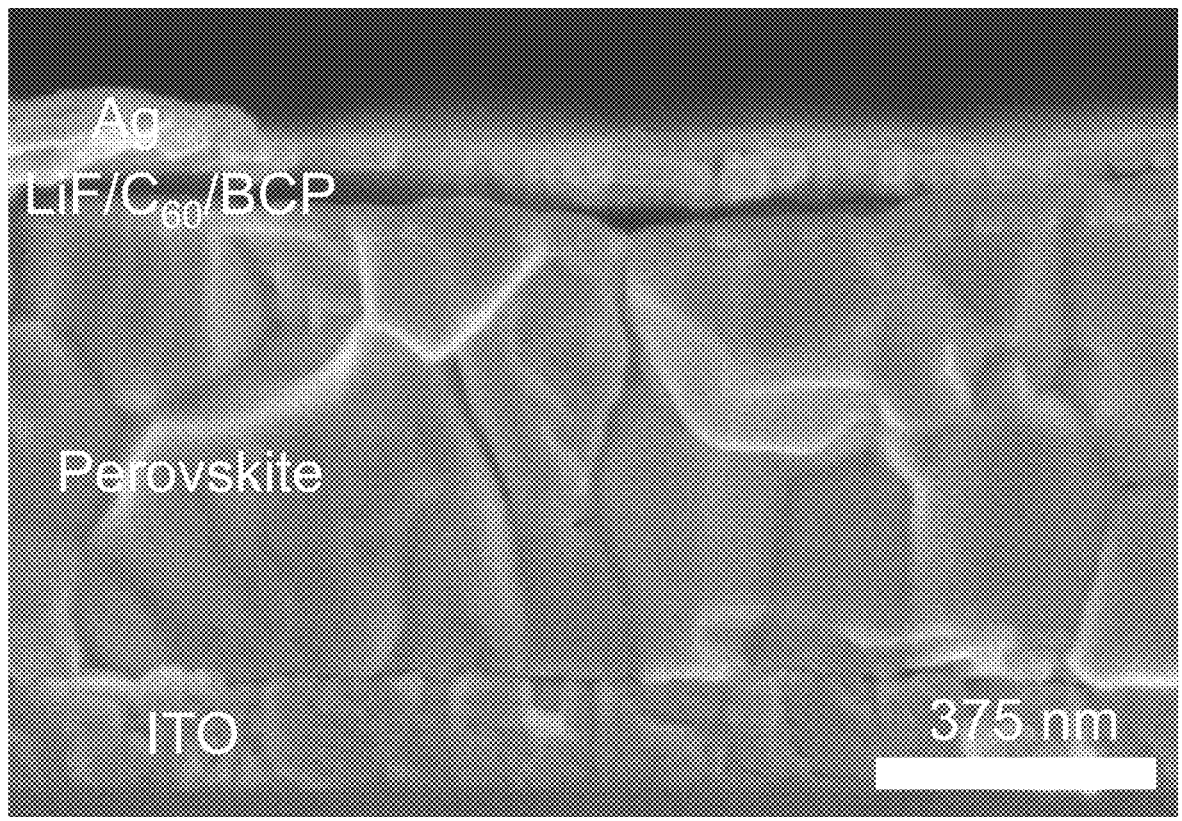
FIG. 8A (9) illustrates a scanning electron microscopy (SEM) cross-section image of a target PSC processed with 0.5 mg/ml Me-4PACz in the perovskite precursor solution, according to some embodiments of the present disclosure.
Figure 8B:
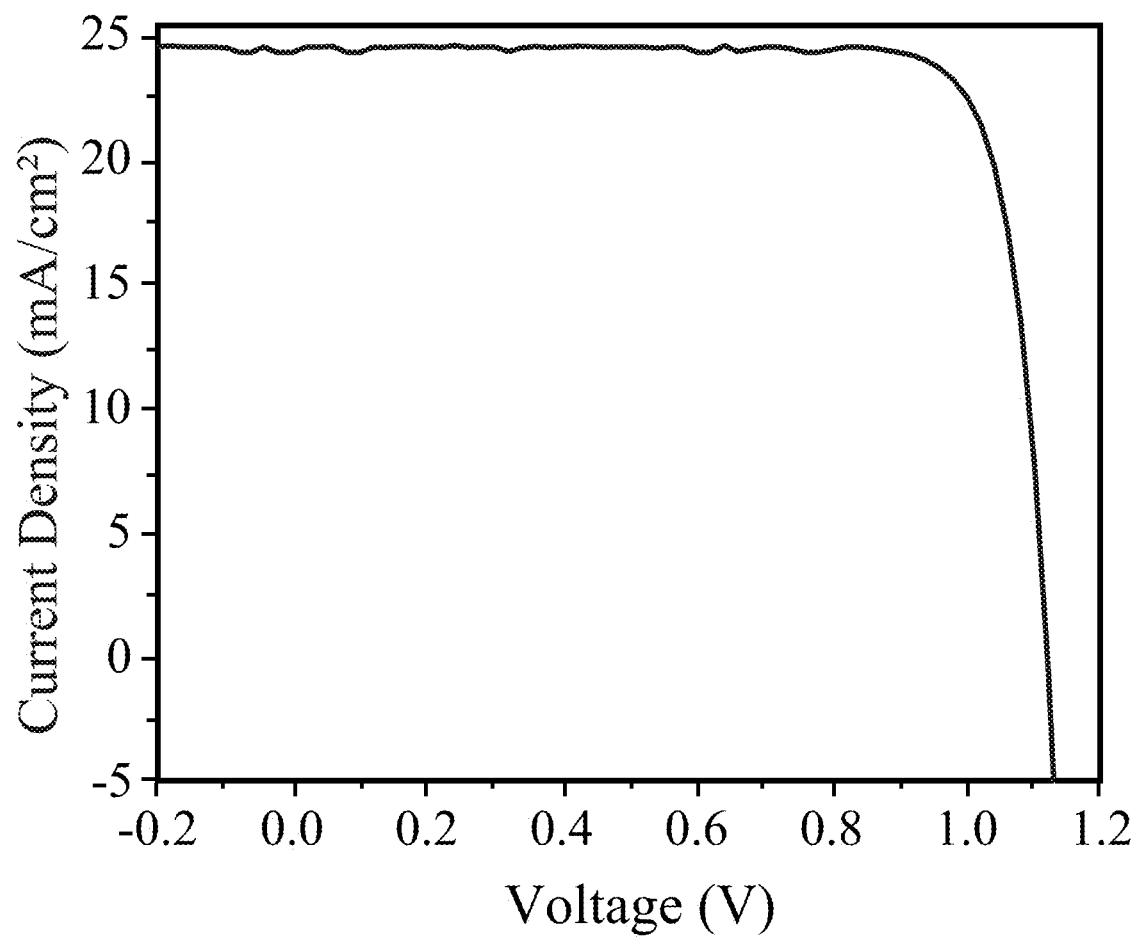
FIG. 8B (9) illustrates the curve of the best-performing PSC processes using Me-4PACz in the perovskite precursor solution, according to some embodiments of the present disclosure. PCE=22.6%; $J_{SC}$=24.5 mA/cm²; $V_{OC}$=1.12 V; FF=0.823.
Figure 9:
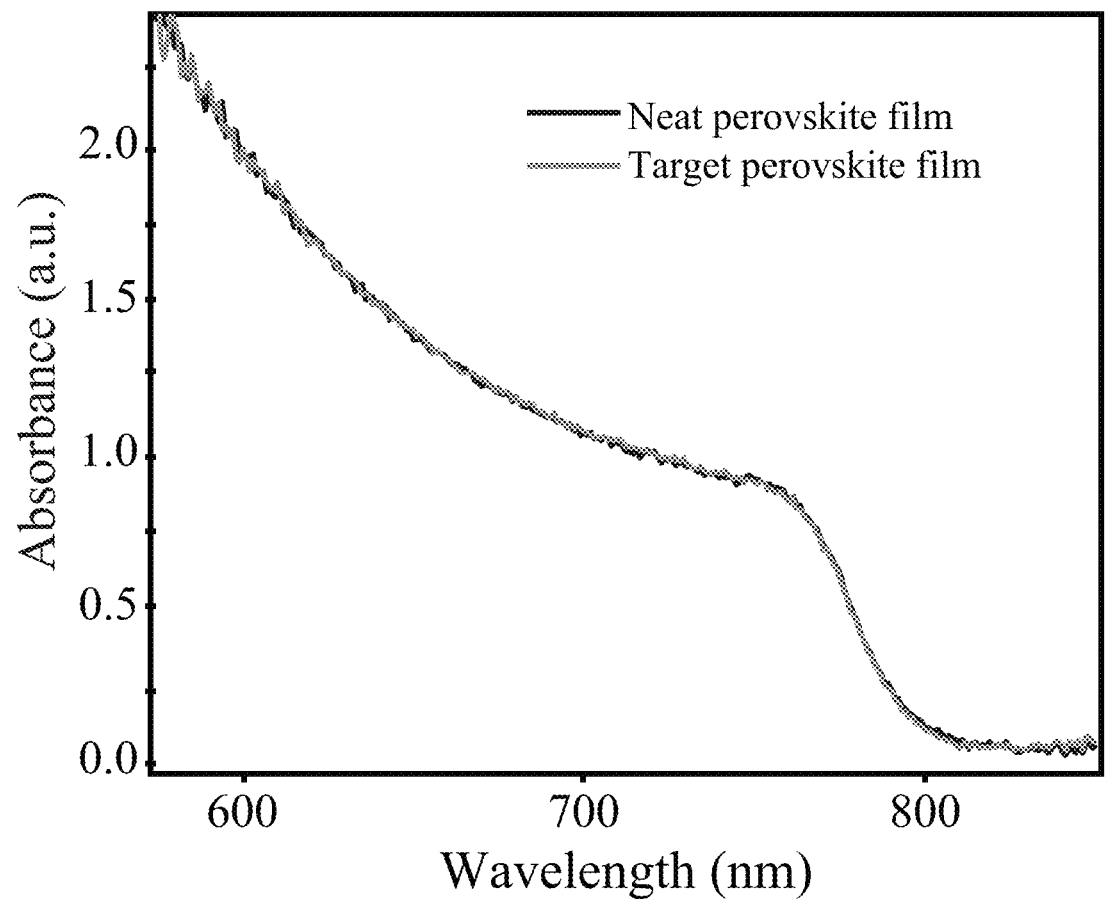
FIG. 9 illustrates ultraviolet-visible (UV-Vis) absorption spectra for a "neat" perovskite film and a "target" perovskite layer manufactured using a precursor solution without and with Me-4PACz in additive contained in the solution, respectively, according to some embodiments of the present disclosure.
Figure 10:
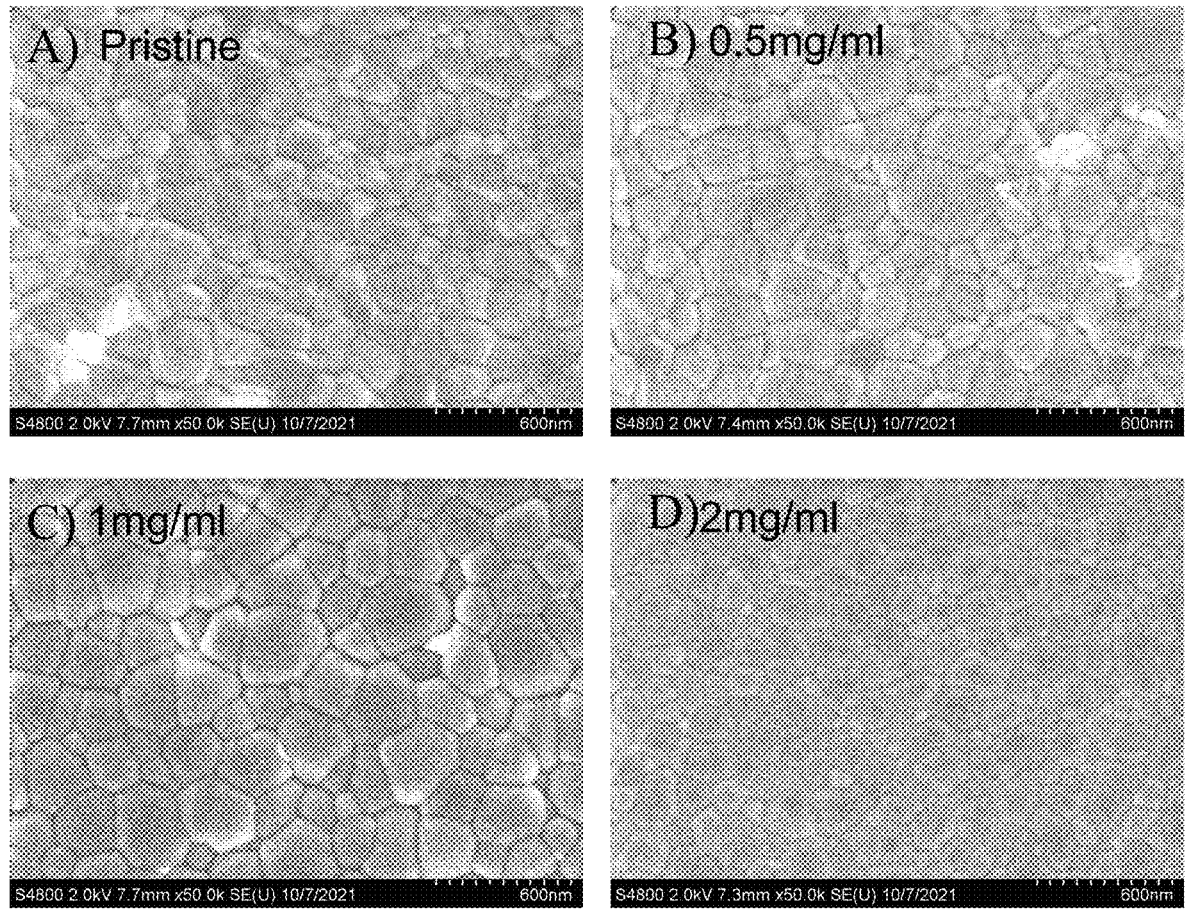
FIG. 10 illustrates SEM images of perovskite layers manufactured using different Me-4PACz concentrations in precursor solutions, according to some embodiments of the present disclosure. SEM images of neat perovskite layer (Panel A), perovskite layer processed with 0.5 mg/ml Me-4PACz in precursor (Panel B), perovskite layer processed with 1 mg/ml Me-4PACz concentrations in precursor (Panel C), and perovskite layer processed with 1 mg/ml Me-4PACz in precursor (Panel D).
Figure 11:
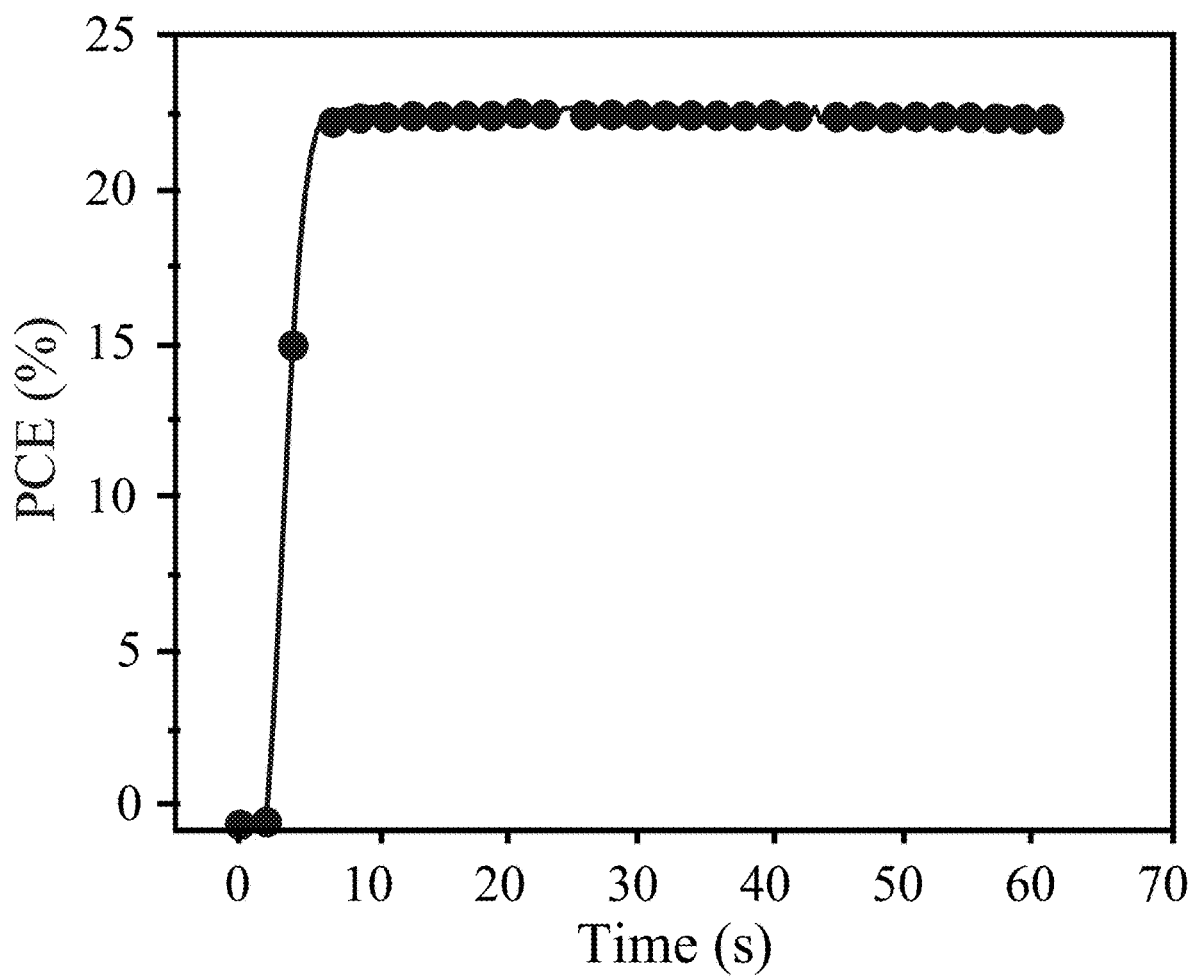
FIG. 11 illustrates the stabilized power output (SPO) at 0.98 V measured for a best-performing "target" device manufactured using an additive in the precursor solution, according to some embodiments of the present disclosure.

The thickness of the resulting perovskite layers was about 650 nm (see FIG. 8A) and there was no change in bandgap between perovskite layers synthesized from precursor solutions containing Me-4PACz as an additive to perovskite layers synthesized from precursor solutions having no additive (see FIG. 9). Top-view SEM images (see FIG. 10) show that the average grain size of a perovskite film resulting from a precursor solution containing the additive Me-4PACz (at an additive concentration of about 0.5 mg/ml) was slightly larger than that of a "neat" perovskite layer. The additive concentration was then increased to about 2 mg/ml, which resulted in a reduction in grain size, indicating that there appears to be an optimal concentration of the additive molecules for ideal perovskite crystallization. In some embodiments of the present disclosure, a perovskite layer may be characterized by grains having a characteristic length between 100 nm and 500 nm. The structure of the p-i-n devices fabricated using these perovskites was glass/ITO/perovskite/LiF (1 nm)/$C_{60}$ (25 nm)/BCP (6 nm)/Ag (100 nm) (corresponding to substrate/first conducting layer/perovskite layer/ETL/second conducting layer, with the additive eventually present (after the treating step) as an HTL positioned between first conducting layer and the perovskite layer. The current density-voltage (J-V) characteristics show that the "target" device with an apparent optimal Me-4PACz concentration (~0.5 mg/ml) delivered a PCE measured by J-V scan of 22.6% and a stabilized power output (SPO) of 22.4% (see FIG. 8B and FIG. 11, respectively).

To gain insight into the SAM (i.e., additive) separation and perovskite crystallization process, both the "target" and "neat" devices were characterized using depth profiling with time-of-flight secondary ion mass spectrometry (TOF-SIMS) (see Panels B and A, respectively, of FIG. 8C). This analysis reveals for the "target" devices, a pronounced phosphorous (P) signal from the Me-4PACz located at both the ITO-perovskite interface and the perovskite-electron transport layer (ETL) interface (see Panel B of FIG. 8C), which indicates that during crystallization the forming perovskite expels the Me-4PACz additive molecules from the final perovskite layer. This suggests that the additive is transported out of the forming perovskite layer to the top and bottom interfaces of the perovskite layer with its neighboring ETL and ITO layer (i.e., first conducting layer), respectively. Next, the "target" perovskite layer was removed by dissolving it in DMF, which yielded a clear ITO/glass substrate. Then a "neat" perovskite layer was deposited onto the same ITO/glass substrate that previously supported the "target" perovskite layer and TOF-SIMS depth profiling was completed again on the "neat" perovskite layer. The resultant device still showed the P signal at the bottom ITO/perovskite interface but no P signal at the top perovskite/ETL interface (see Panel C of FIG. 8C).

Figure 8D:
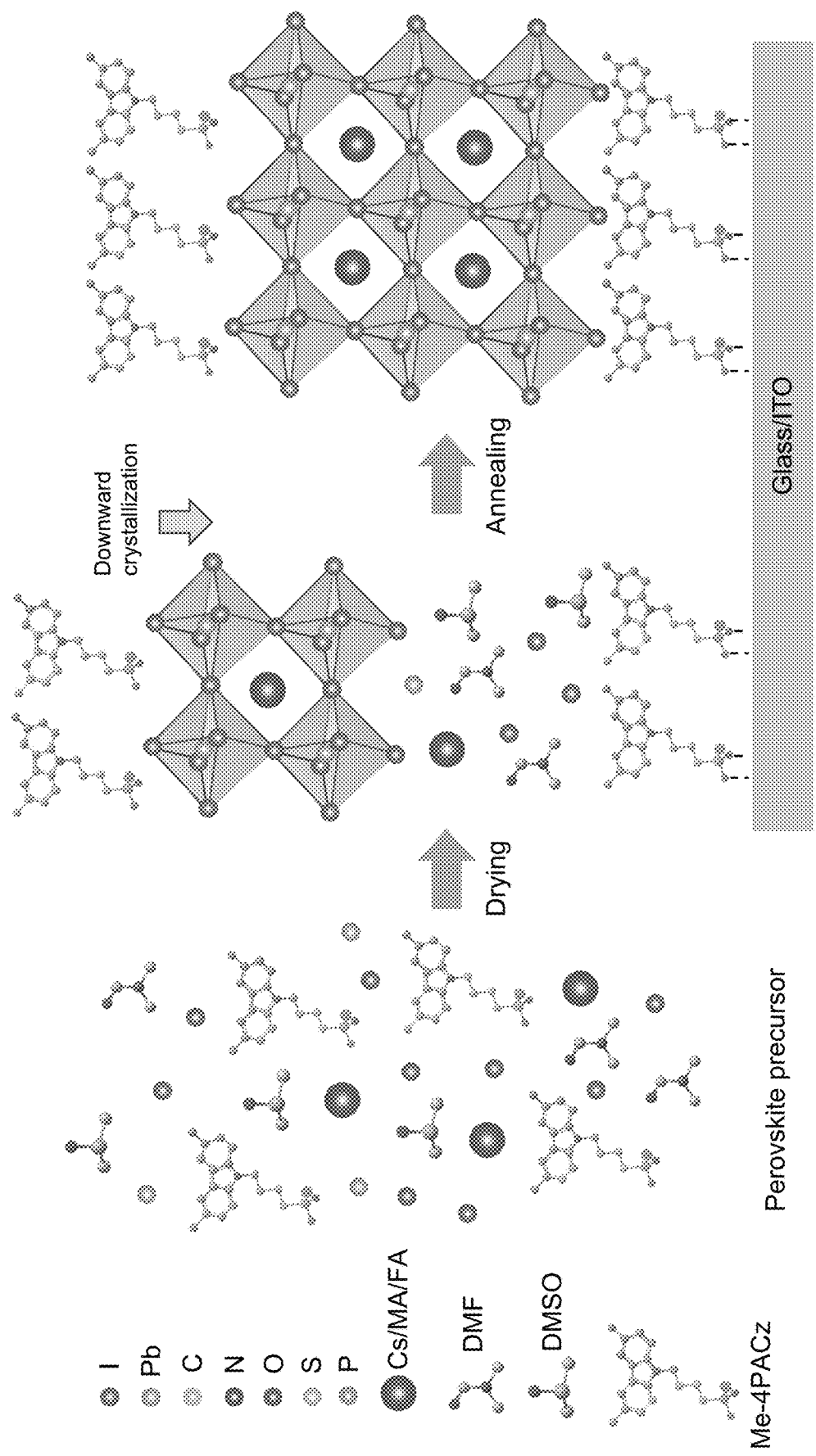
FIG. 8D (previously panel F of FIG. 9) illustrates a representation of SAM separation and the perovskite crystallization process, according to some embodiments of the present disclosure.
Figure 12:
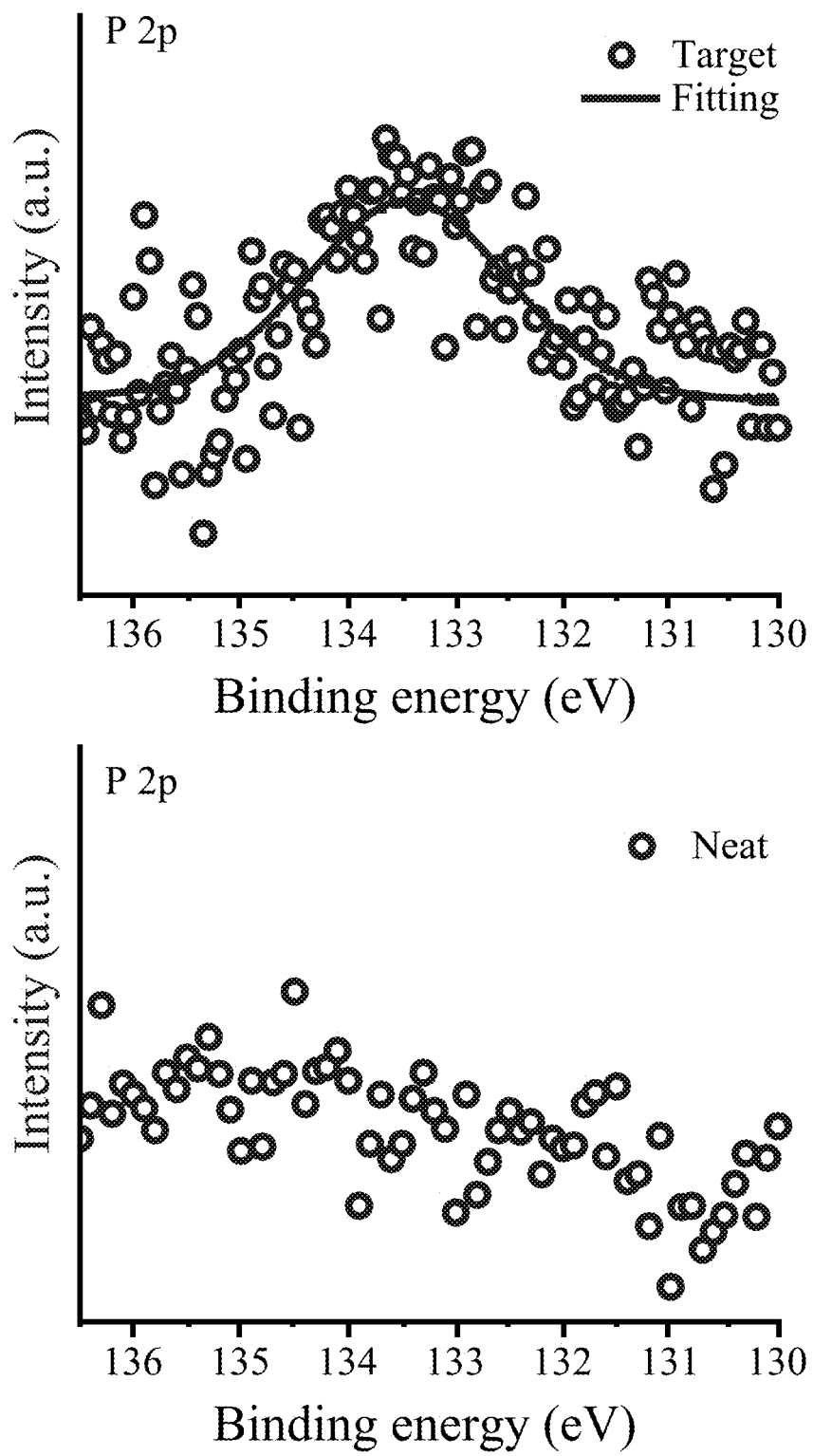
FIG. 12 illustrates x-ray photoelectron spectroscopy (XPS) spectra for P 2p on ITO-coated surfaces after the originally deposited perovskite layers have been removed to show residual P from the SAM still attached to the ITO surface, according to some embodiments of the present disclosure. The perovskite layers with or without the additive were cast and then removed with DMF. The top panel shows "target" perovskite layers and bottom panel shows "neat" perovskite layers.

The poor wetting of the perovskite precursor-containing solution onto the substrate indicated that the self-assembled additive layer remained on the ITO surface (presumably due to the methyl groups of the Me-4PACz remaining from the earlier-deposited "target" perovskite layer). In addition, a phosphorus signal of similar magnitude previously obtained from the "target" perovskite was observed at the ITO-perovskite interface when depth profiling this newly applied "neat" film, synthesized without Me-4PACz additive in the perovskite precursor-containing solution (see Panel B of FIG. 8C). This result was further confirmed by X-ray photoelectron spectroscopy (XPS) (see FIG. 12), showing the presence of phosphorous on the ITO surface after the "target" perovskite film was washed away, remaining as a residual from the originally deposited "target" layer. Perovskite films are believed to follow a top-to-bottom downward crystallization process initialized by the evaporation of residual solvent from the top surface of the liquid layer of the precursor solution. Therefore, it may be surmised that the Me-4PACz additive contained in the perovskite precursor solution is transferred downward to, and concentrated on, the ITO surface during the perovskite crystallization process (see FIG. 8D). The phosphonic acid headgroups of the additive may then bind strongly to the ITO substrate and forming a layer of SAM upon annealing. Further, residual Me-4PACz may then remain on the top surface of the perovskite layer, thereby passivating surface defects that would otherwise diminish the device performance. Me-4PACz is too large to be incorporated into the perovskite crystal's lattice and no substantial P signal was detected throughout the film thickness, although very small amounts may be present at grain boundaries. These results demonstrate the ability to simultaneously, in a single treating step using a single solution containing both additive(s) and perovskite precursors, form a SAM layer that behaves as an HTL (i.e., additive layer) constructed from the additive (e.g., a phosphonic acid functionalized carbazole) and a perovskite layer. Further, only the perovskite layer is removed upon treatment with DMF (the SAM layer remains).

Figure 13A:
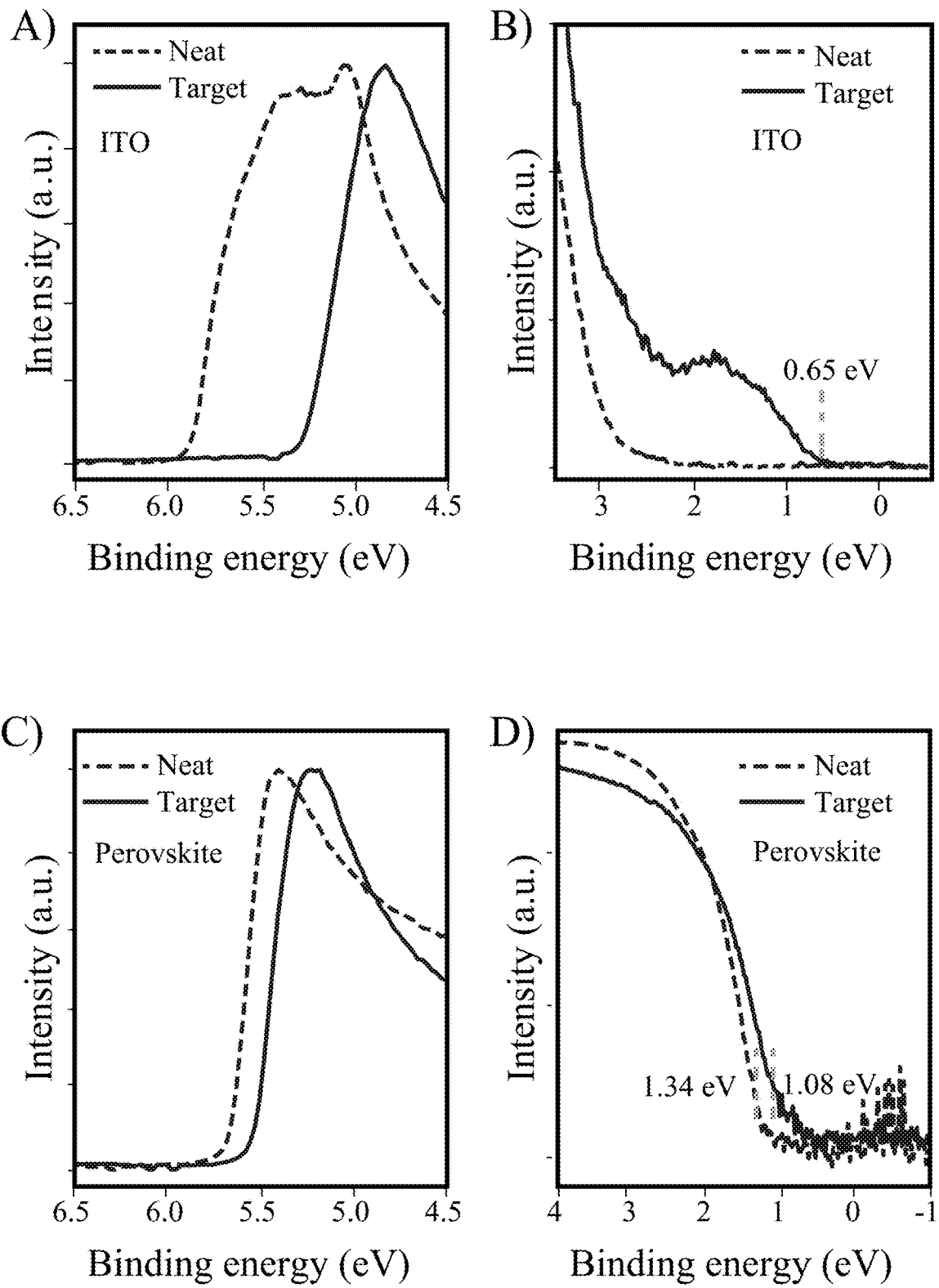
FIG. 13A illustrates ultraviolet photoelectron spectroscopy (UPS) (10.2 eV excitation) of the secondary electron cutoff (Panel A) and valence band (Panel B) regions of the ITO surfaces after washing away "neat" perovskite and "target" perovskite layers, respectively, and UPS of the secondary electron cutoff (Panel C) and valence band (Panel D) regions of the "neat" and "target" perovskite layers, respectively, according to some embodiments of the present disclosure.
Figure 13B:
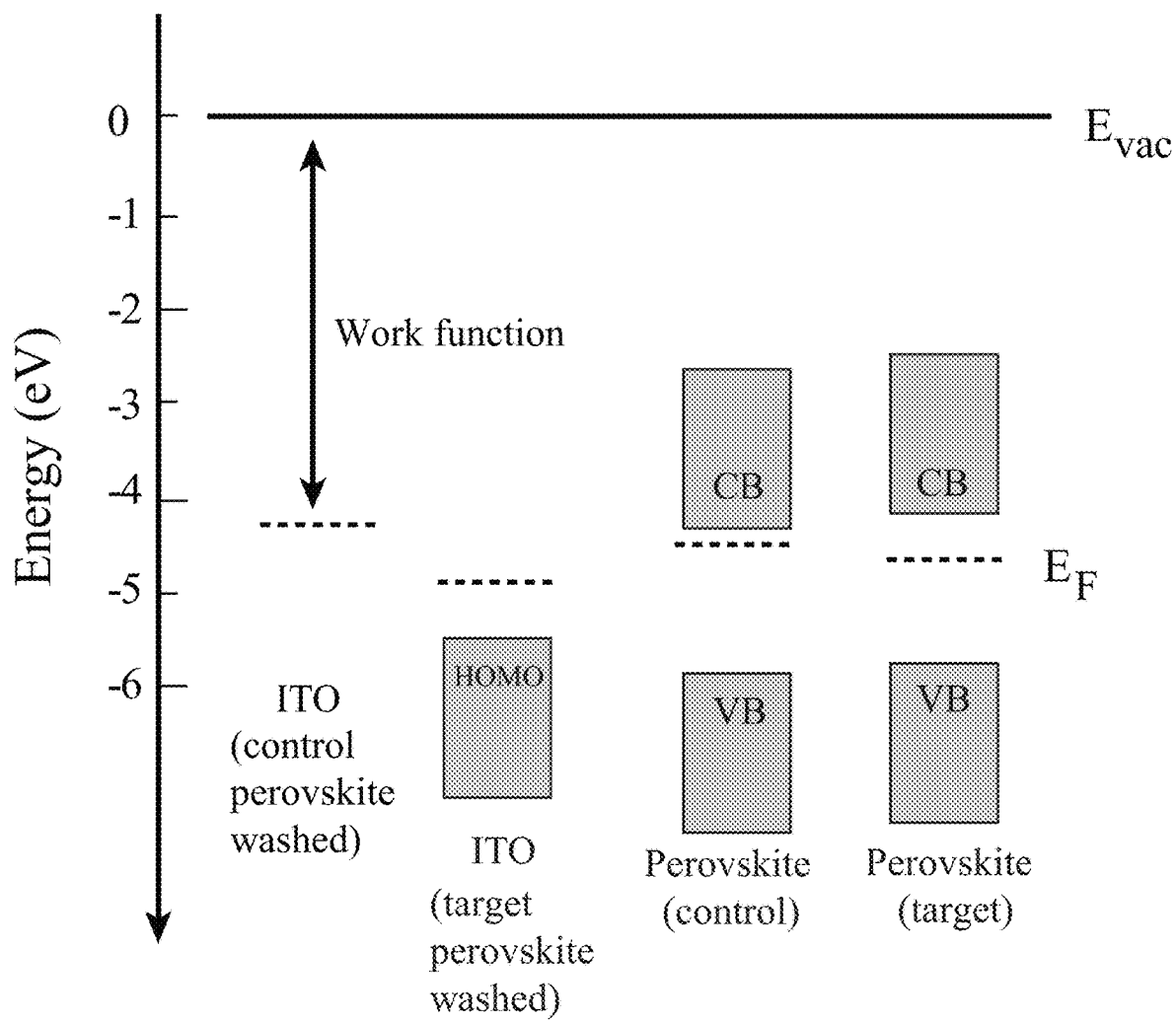
FIG. 13B illustrates an energy-level scheme extracted from the UPS data illustrated in FIG. 13A, according to some embodiments of the present disclosure.
Figure 14:
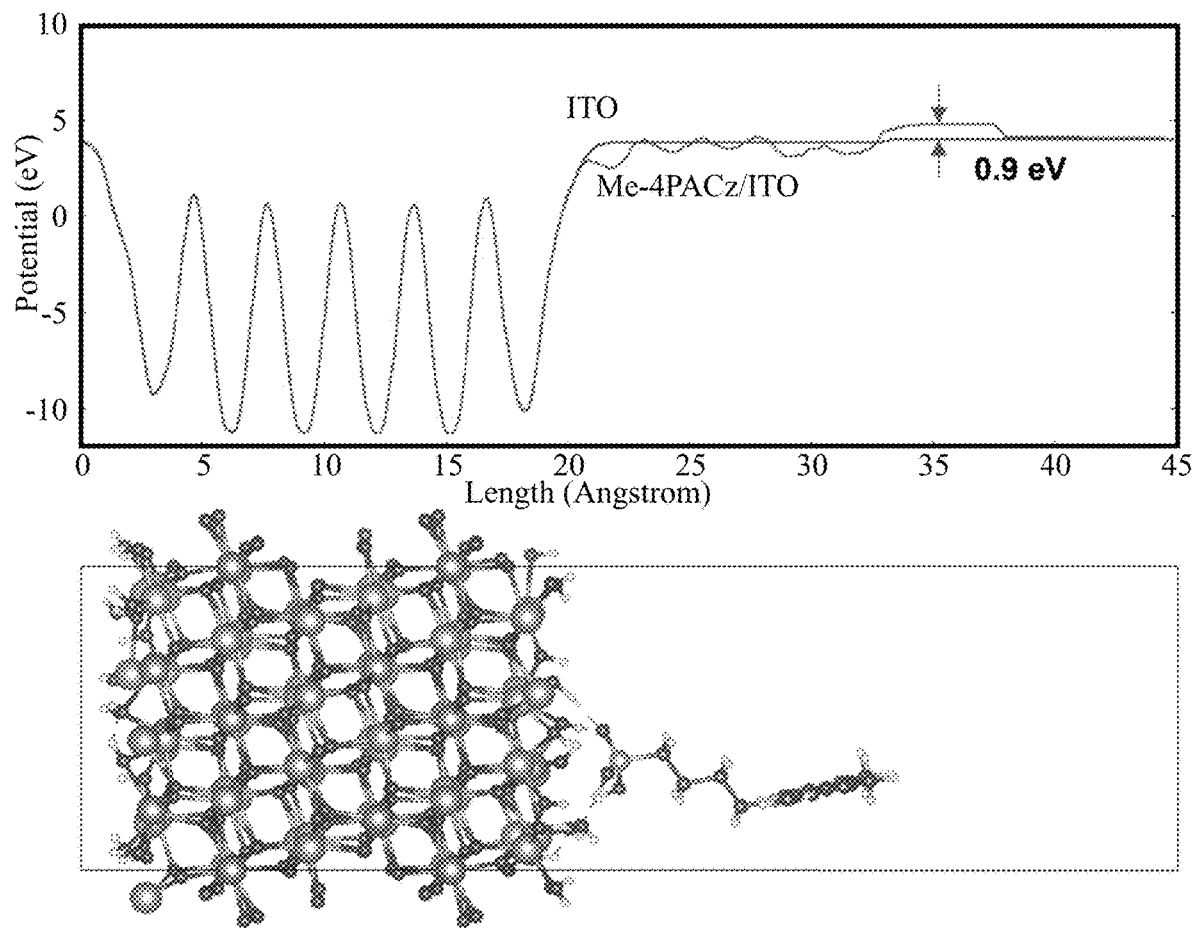
FIG. 14 illustrates planar averaged electrostatic potential (top) and crystal structure (bottom) of an ITO/Me-4PACz interface, according to some embodiments of the present disclosure.

Next, the electronic structure of ITO substrates and perovskite films were studied by ultraviolet photoelectron spectroscopy (UPS). As before, the perovskite films were removed by contacting them with DMF and the work function ($\Phi$) of the exposed ITO surfaces were measured. A larger change was observed in the $\Phi$ measured for the exposed ITO surfaces resulting from devices originally having "neat" perovskite layers to those resulting from devices originally having "target" perovskite layers; from 4.33 eV (identical to that of bare ITO) to 4.94 eV, respectively (see Panel A of FIG. 13A). DFT calculations show that the electric dipole moment of Me-4PACz increased the local vacuum energy level, thus causing an increase in the $\Phi$ (see FIG. 14). A clear signature was also detected from the Me-4PACz on ITO with a highest-occupied molecular orbital (HOMO) of 5.59 eV for the ITO layer after rinsing away the target perovskite with solvent (see Panel B of FIG. 13A). The $\Phi$ of the perovskite layer also changed from 4.54 eV ("neat") to 4.66 eV ("target") (see Panel C of FIG. 13A), and the valence band maximum (VBM) changed from 5.88 eV ("neat") to 5.74 eV ("target") (see Panel D of FIG. 13A), revealing that the "target" perovskite layer became less n-type compared to the "neat" film (see FIG. 13B). The VBM of the target perovskite aligns well with that of the HOMO of Me-4PACz on the ITO layer after the "target" perovskite was removed by solvent treatment. Therefore, Me-4PACz likely promotes extraction of the photo-generated holes at the perovskite-ITO interface, while also serving to increase the selectivity of the ITO (i.e., first conducting layer).

Figure 15A:
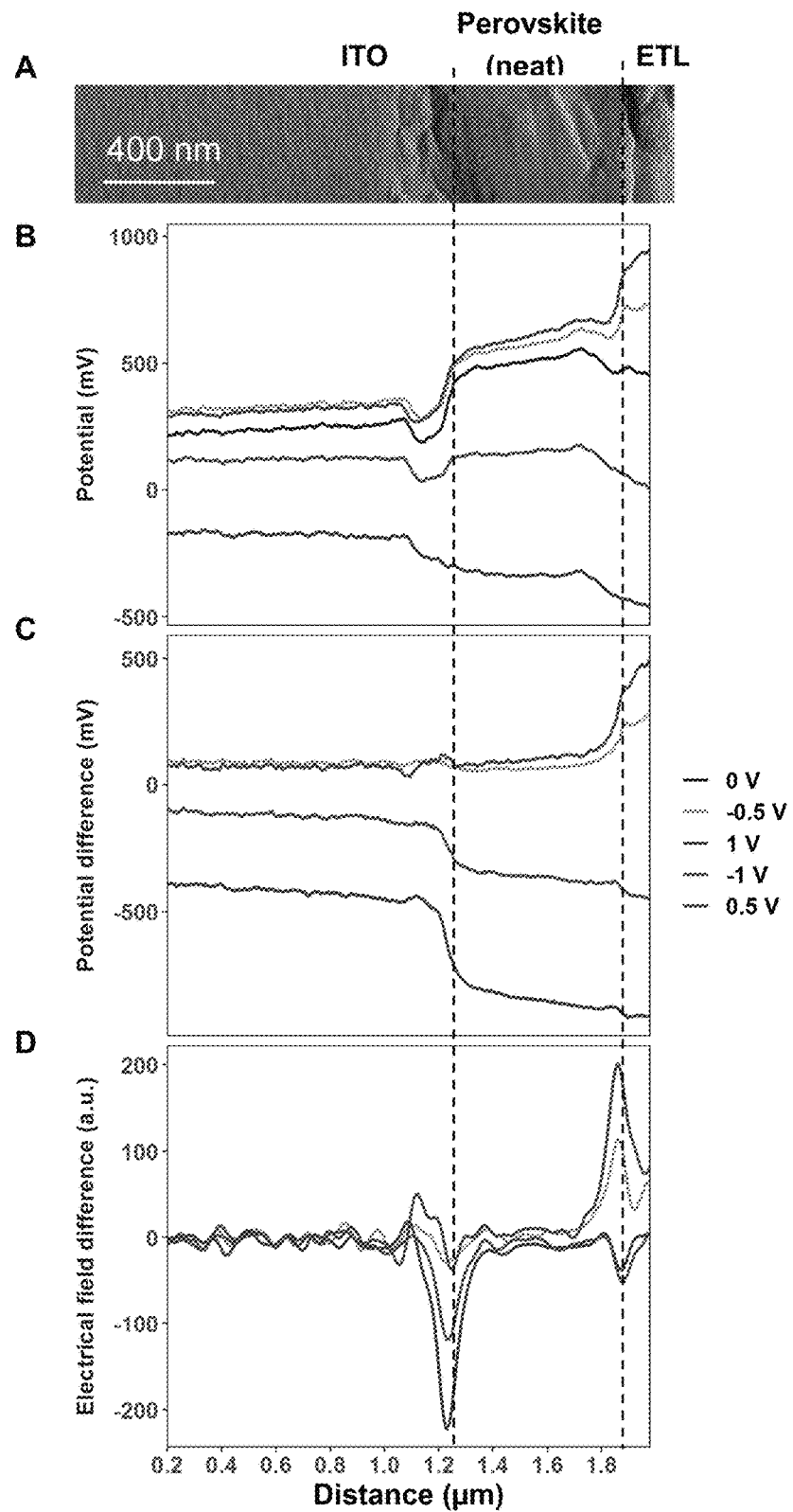
FIG. 15A illustrates Kelvin probe force potential profiling of solar cell devices made according to some embodiments of the present disclosure. (Panel A) AFM image of a cross-section of a "neat" perovskite device. (Panels B to D) Potential profiling (Panel B), potential difference (Panel C), and electrical field difference (Panel D) of a "neat" perovskite device.
Figure 15B:
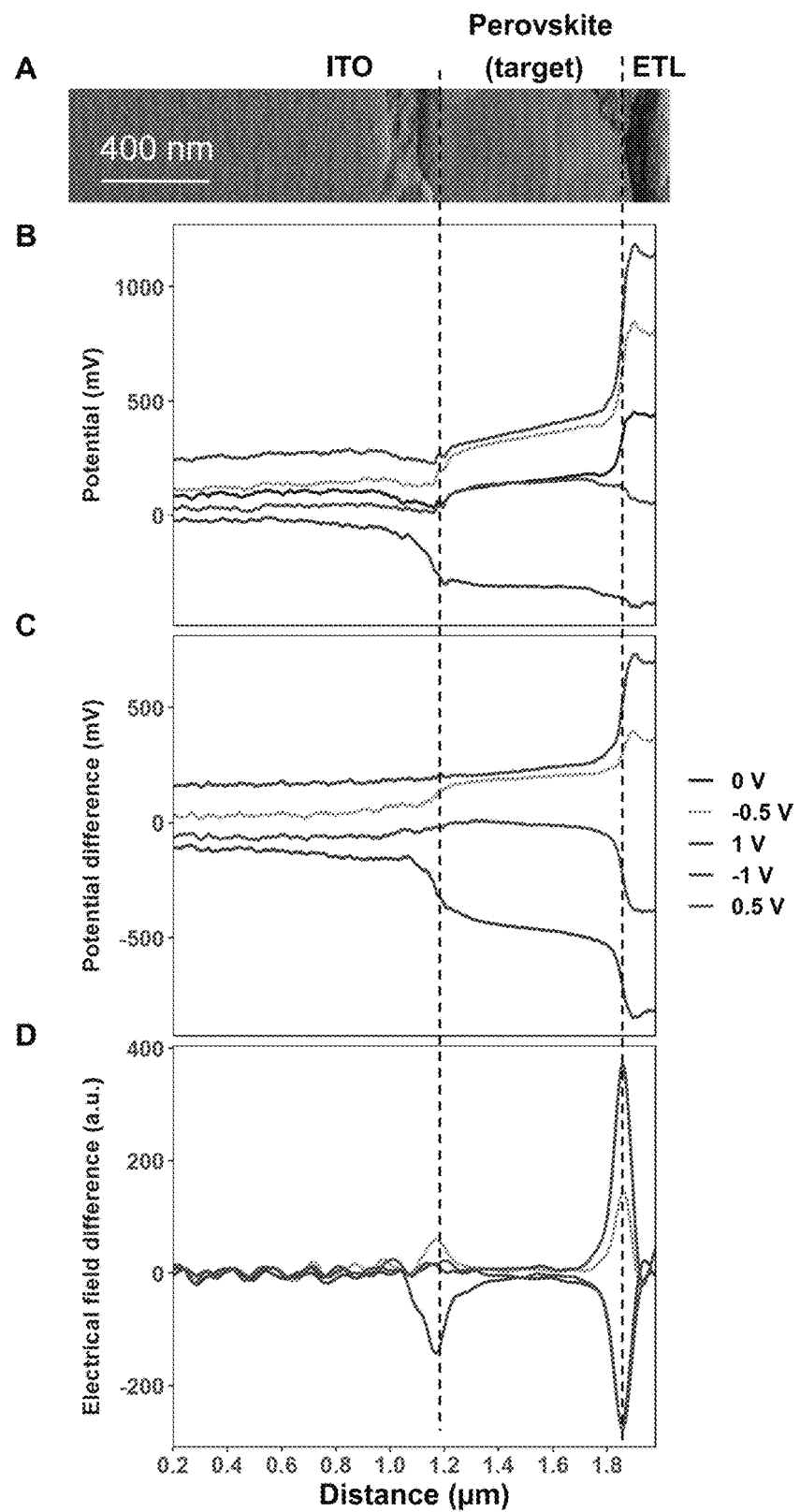
FIG. 15B illustrates Kelvin probe force potential profiling of solar cell devices made according to some embodiments of the present disclosure. (Panel A) AFM image of a cross section of a "target" perovskite device. (Panel B to D) Potential profiling (Panel B), potential difference (Panel C), and electrical field difference (Panel D) of a "target" perovskite device.
Figure 16:
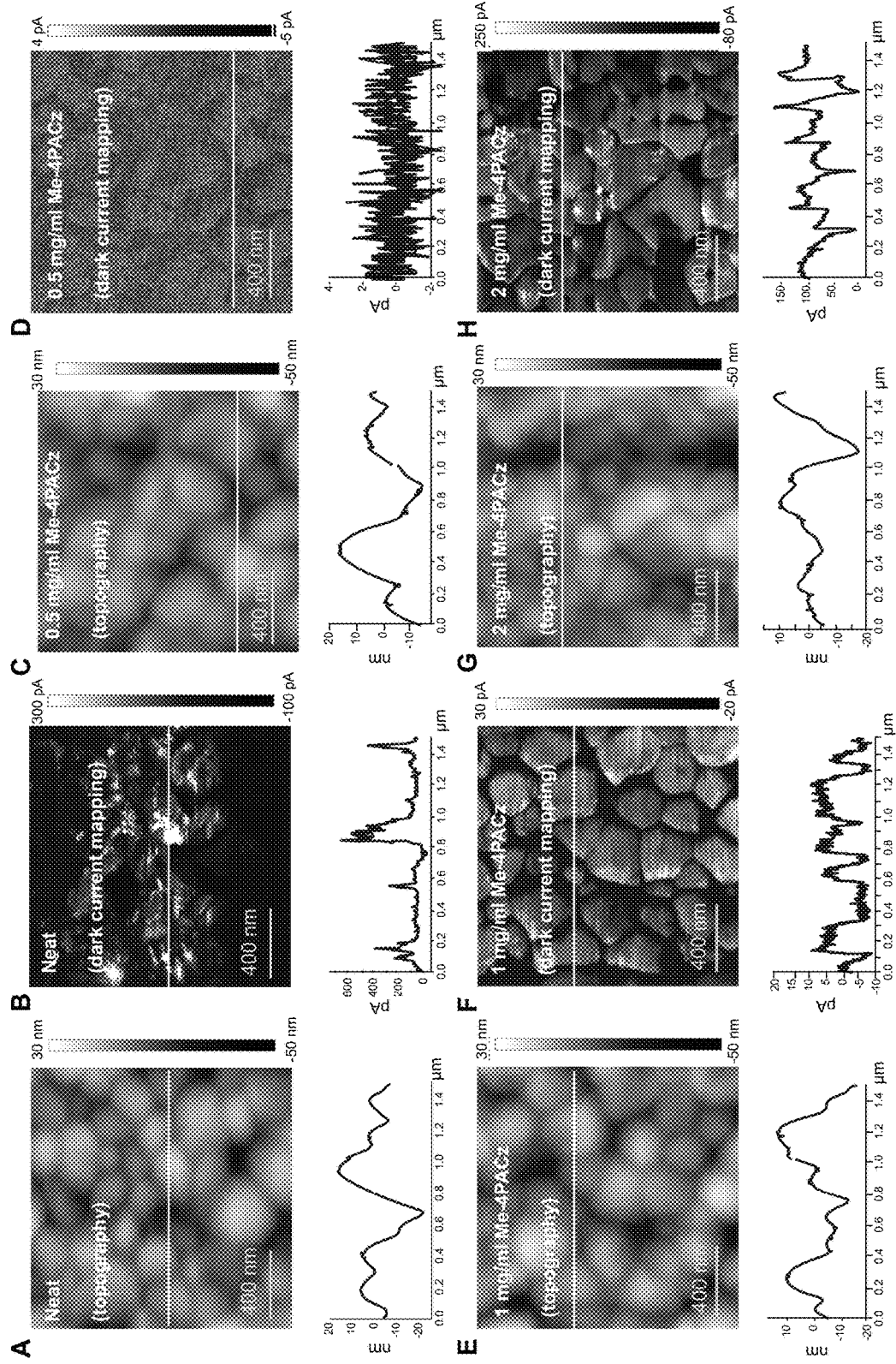
FIG. 16 illustrates AFM topography images (Panel A) and c-AFM dark current mapping (Panel B) of a "neat" perovskite layer. AFM topography images (Panel C) and c-AFM dark current mapping (Panel D) of a perovskite layer manufactured using 0.5 mg/ml Me-4PACz additive in a perovskite precursor solution, according to some embodiments of the present disclosure. AFM topography images (Panel E) and c-AFM dark current mapping (Panel F) of a perovskite layer manufacturing using 1 mg/ml Me-4PACz additive in a perovskite precursor solution. AFM topography images (Panel G) and c-AFM dark current mapping (Panel H) of perovskite layer manufacture using 2 mg/ml Me-4PACz additive in a perovskite precursor solution. Corresponding to the horizontal line in each image, a line scan of the topography or current signal is shown below each image.

Next, cross-sectional nanometer-scale Kelvin probe force microscopy (KPFM) was used to probe the charge extraction barriers by analyzing the differences of electric-field across the top interface and the bottom interface of the perovskite layers. By taking the first derivative of the potential difference, the electric-field distribution relative to the metallurgical interfaces was determined. A significant potential barrier was observed at the ITO-perovskite interface, presumably induced by a mismatch of energetic alignment at the ITO-perovskite interface (see FIGS. 15A and 15B). The potential barrier at the ITO-perovskite interface is remarkably reduced for the perovskite layer synthesized with Me-4PACz in the perovskite precursor solution, which may facilitate hole extraction at the ITO-perovskite interface. Dark current mapping by conductive atomic force microscopy (C-AFM) showed that the perovskite layers synthesized with the "optimized" Me-4PACz concentration showed the smallest dark current compared to both the "neat" perovskite layer and the "target" perovskite layer synthesized with the relatively high Me-4PACz concentration (see FIG. 16).

Figure 13C:
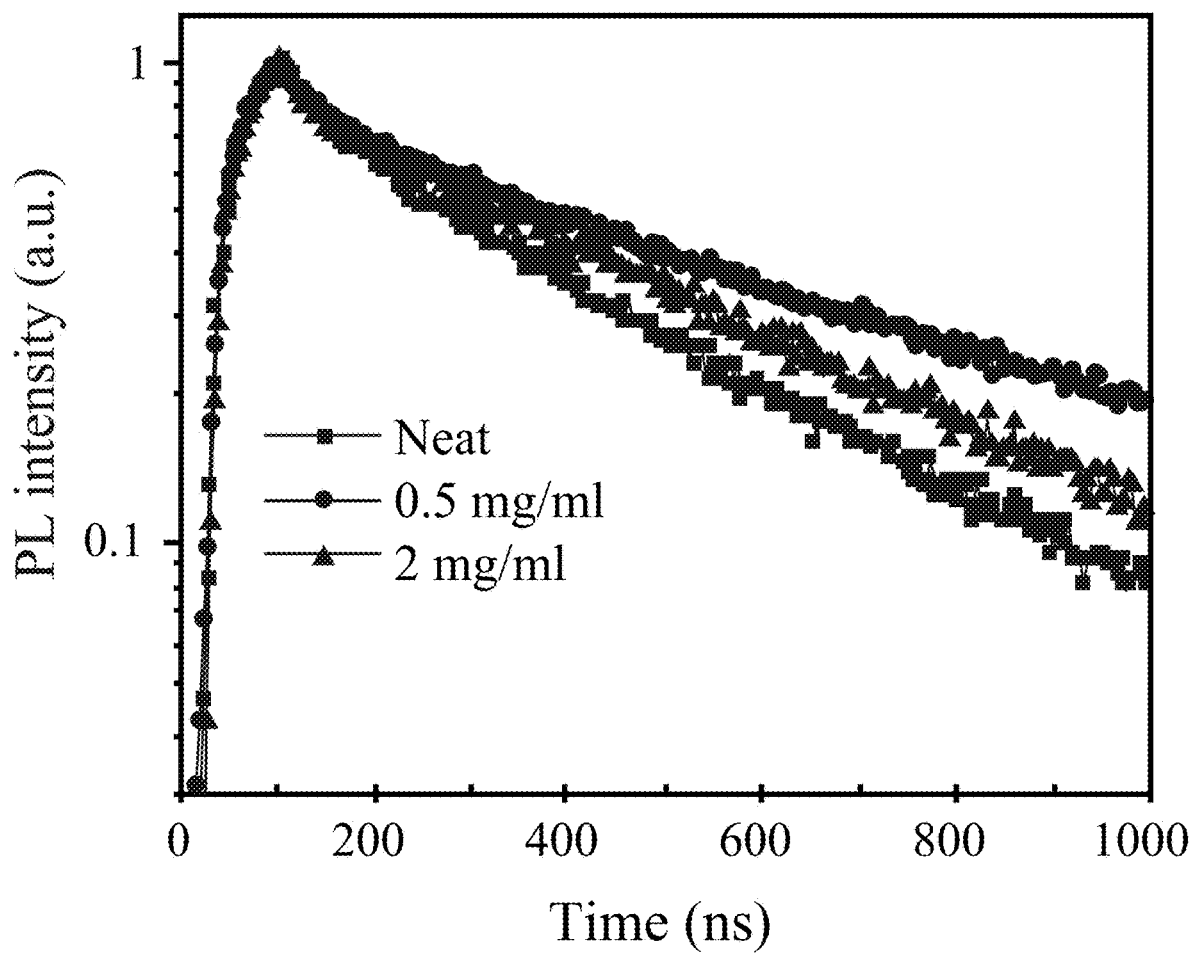
FIG. 13C illustrates time-resolved photoluminescence (TRPL) data of perovskite layers with different Me-4PACz additive concentrations on glass substrates, according to some embodiments of the present disclosure.
Figure 13D:
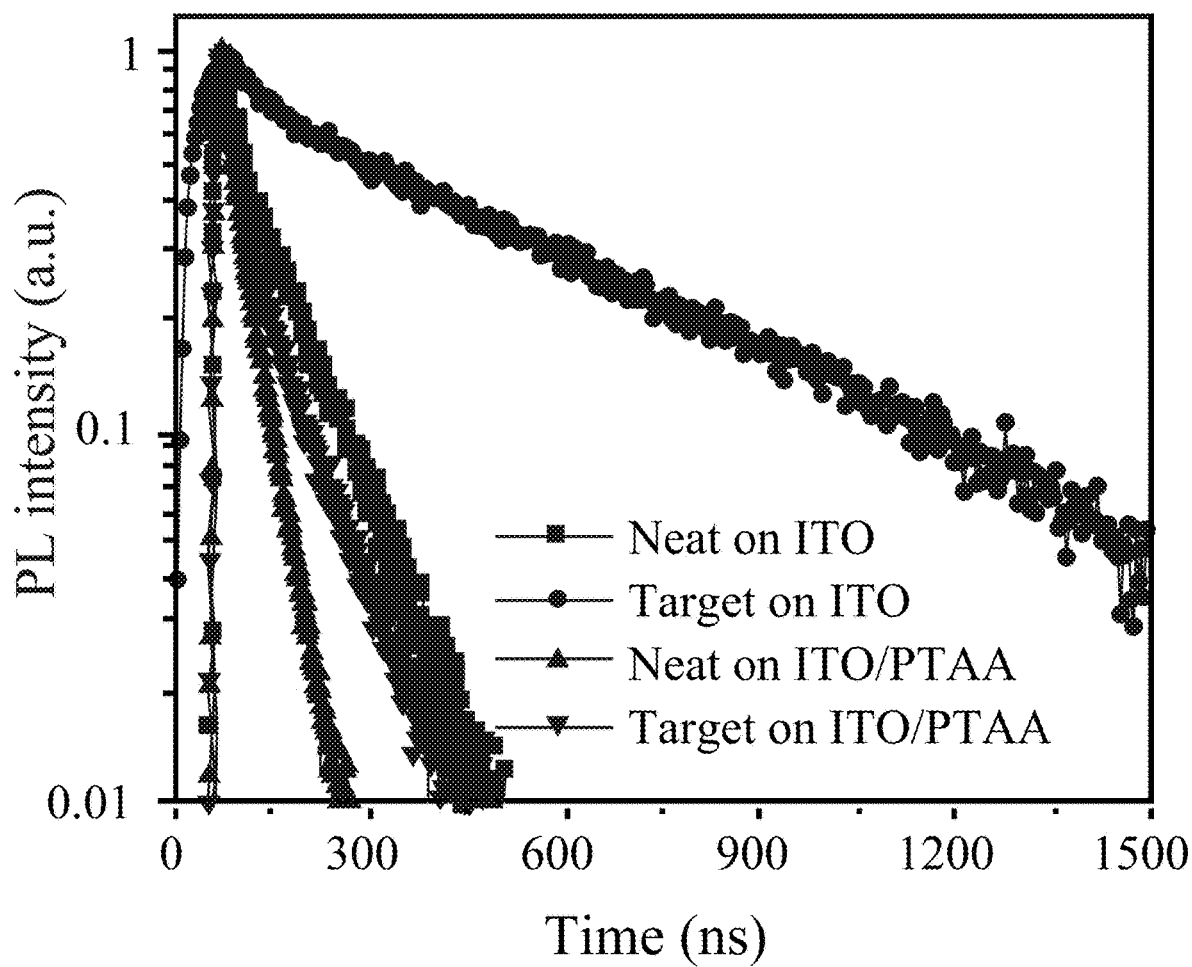
FIG. 13D illustrates TRPL data of perovskite layers on ITO and ITO/PTAA surfaces, according to some embodiments of the present disclosure.
Figure 17:
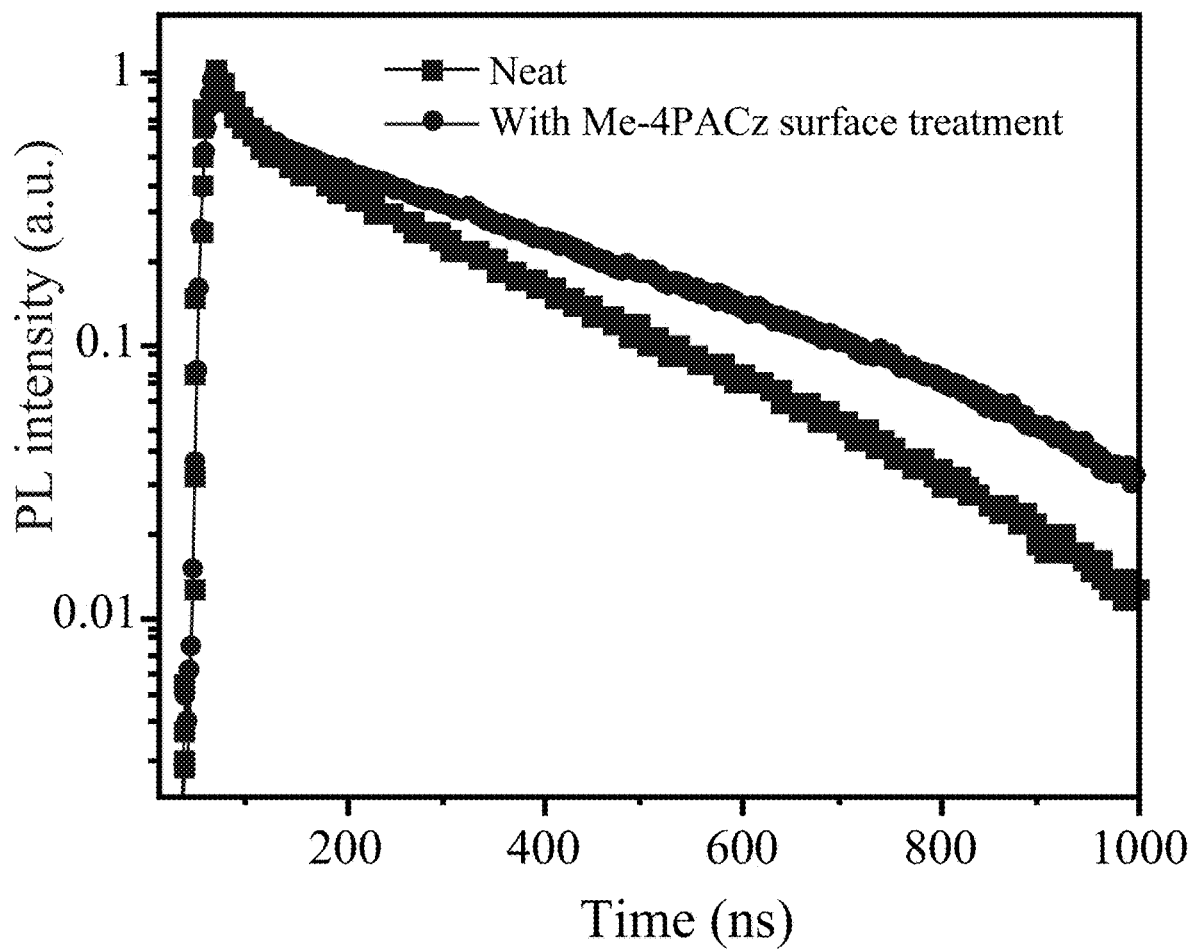
FIG. 17 illustrates TRPL of a "neat" perovskite layer and a "neat" perovskite layer made with a separately deposited Me-4PACz surface treatment, according to some embodiments of the present disclosure. 0.5 mg/ml Me-4PACz in IPA was spin-coated on the surface of perovskite film at 4000 rpm for 30 s for the perovskite layer with Me-4PACz surface treatment.

Time-resolved photoluminescence (TRPL) was performed on the perovskite layers on glass, perovskite layers on glass/ITO, and perovskite layers on glass/ITO/PTAA to study the ability of Me-4PACz to reduce recombination. TRPL for a perovskite layer on glass substrates showed that the "target" perovskite layer fabricated with a solution having 0.5 mg/ml Me-4PACz additive demonstrated the longest lifetime of 518 ns compared to 345 ns for the "neat" perovskite film (see FIGS. 13C and 13D), which suggests that Me-4PACz passivates defects. TRPL was also measured for the glass/perovskite films with and without Me-4PACz surface treatment, where the perovskite surface was treated by applying a Me-4PACz isopropanol solution (0.5 mg/ml) to the glass/perovskite surface. It was observed that the perovskite layer treated with this Me-4PACz/isopropanol solution showed longer lifetimes than those measured for an untreated "neat" perovskite layer (see FIG. 17), which further confirmed defect passivation. Therefore, hole-selective phosphonic acid groups may increase the carrier lifetime of neighboring perovskite layers. The lifetimes of the perovskite layers with Me-4PACz on glass/ITO were similar to those measured for perovskite layers deposited directly on glass, suggesting that SAMs do not introduce excessive non-radiative recombination losses.

Figure 13E:
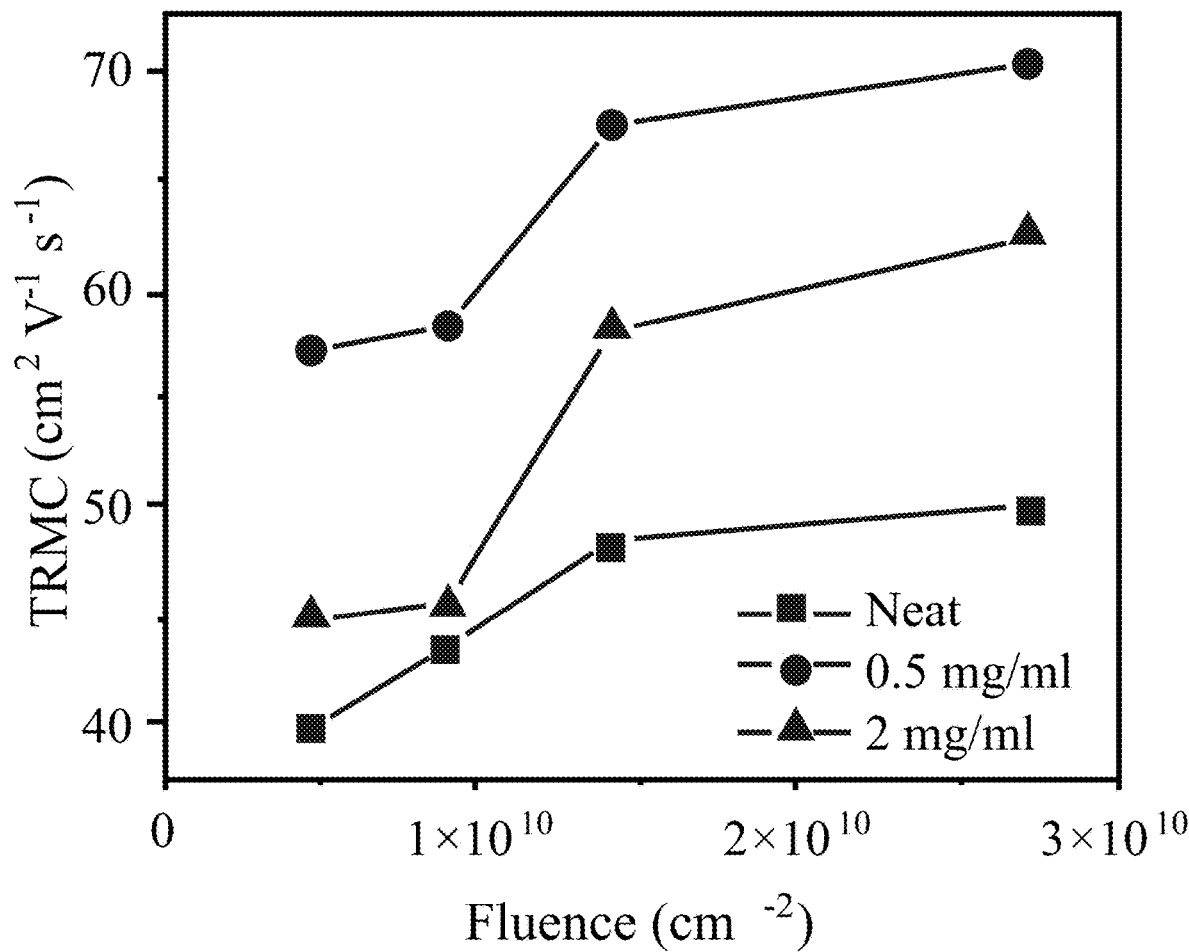
FIG. 13E illustrates time-resolved microwave conductivity (TRMC) measurements on the perovskite layers produced using different Me-4PACz concentrations on quartz, according to some embodiments of the present disclosure.

Time-resolved microwave conductivity (TRMC) measurements were also completed on the perovskite films on quartz substrates. A "target" perovskite layer shows a higher effective carrier mobility than a "neat" perovskite (see FIG. 13E), which most likely originates from a reduced trapping density and is also consistent with the lifetime trends in perovskite films with and without Me-4PACz on glass/ITO/PTAA.

Figure 18:
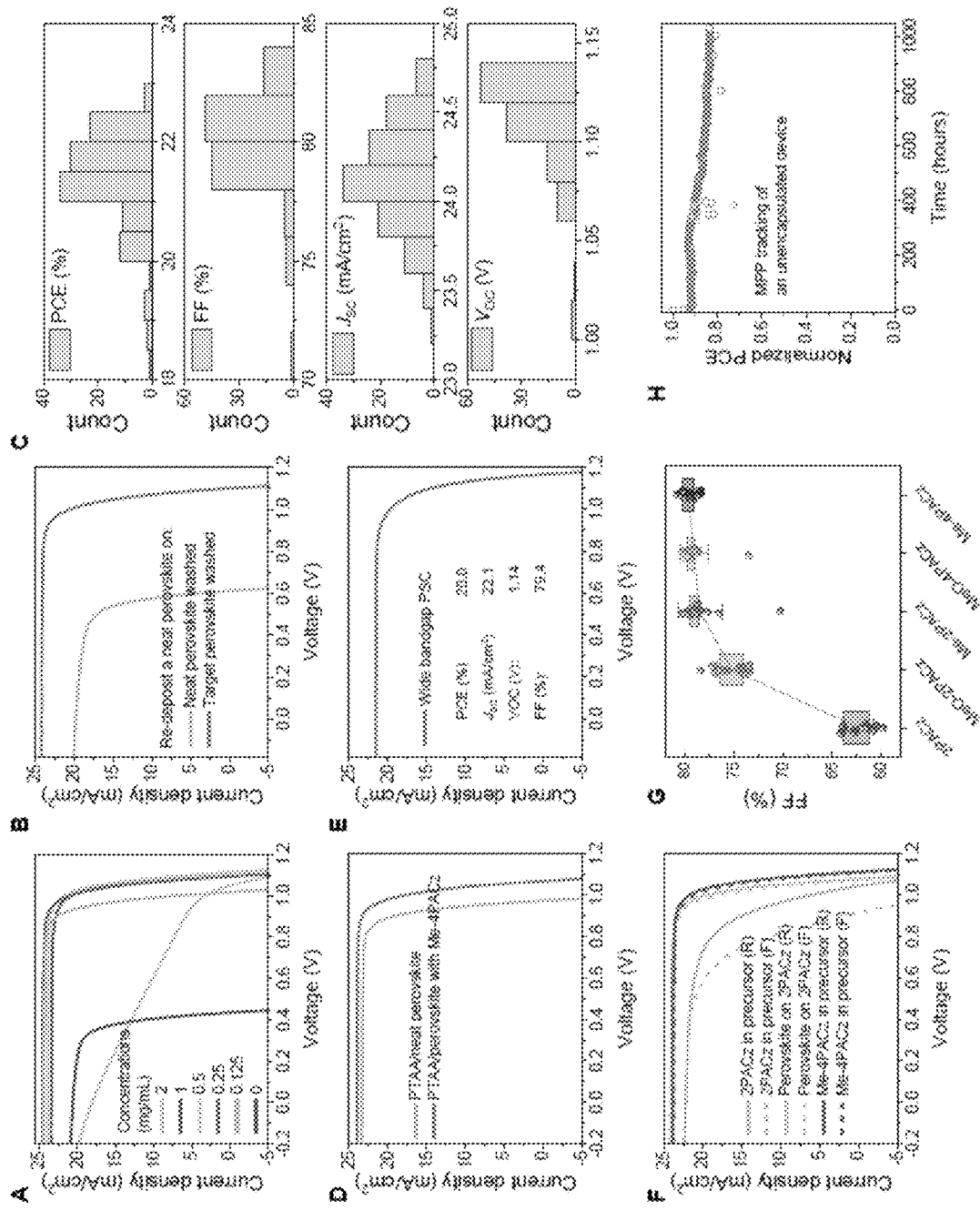
FIG. 18 illustrates device photovoltaic characteristics for devices manufactured according to some embodiments of the present disclosure. (Panel A) Me-4PACz concentration-dependent device J-V characteristics. (Panel B) J-V curve of PSCs fabricated on a ITO surface after washing off a prior perovskite layer. For the blue curve, the washed off "target" perovskite was synthesized using a perovskite precursor solution that contained the Me-4PACz additive, and the yellow curve shows a "neat" perovskite redeposited over a washed off "neat" perovskite layer; i.e., the starting perovskite solution did not contain Me-4PACz. (Panel C) The PV parameters distribution of 130 devices. Panel (D) J-V curve of the PSCs with and without the Me-4PACz on ITO/PTAA. (Panel E) J-V curve of the target wide bandgap (1.68 eV) PSCs. (Panel F) J-V curve from both forward (F) and reverse (R) scan of the perovskite devices on ITO/2PACz and perovskite devices fabricated with 2PACZ and Me-4PACz in the perovskite precursor solution. (Panel G) Comparison of fill factor values of PSCs fabricated with different phosphonic acids in the perovskite precursor solution. All data are from 90 devices (18 devices for each phosphonic acid). (Panel H) Operational stability of target PSCs. Normalized PCE as a function of time under the following conditions: 1-sun continuous illumination, MPP tracking, unencapsulated, flowing $N_2$ atmosphere, and 40° C. temperature.
Figure 25:
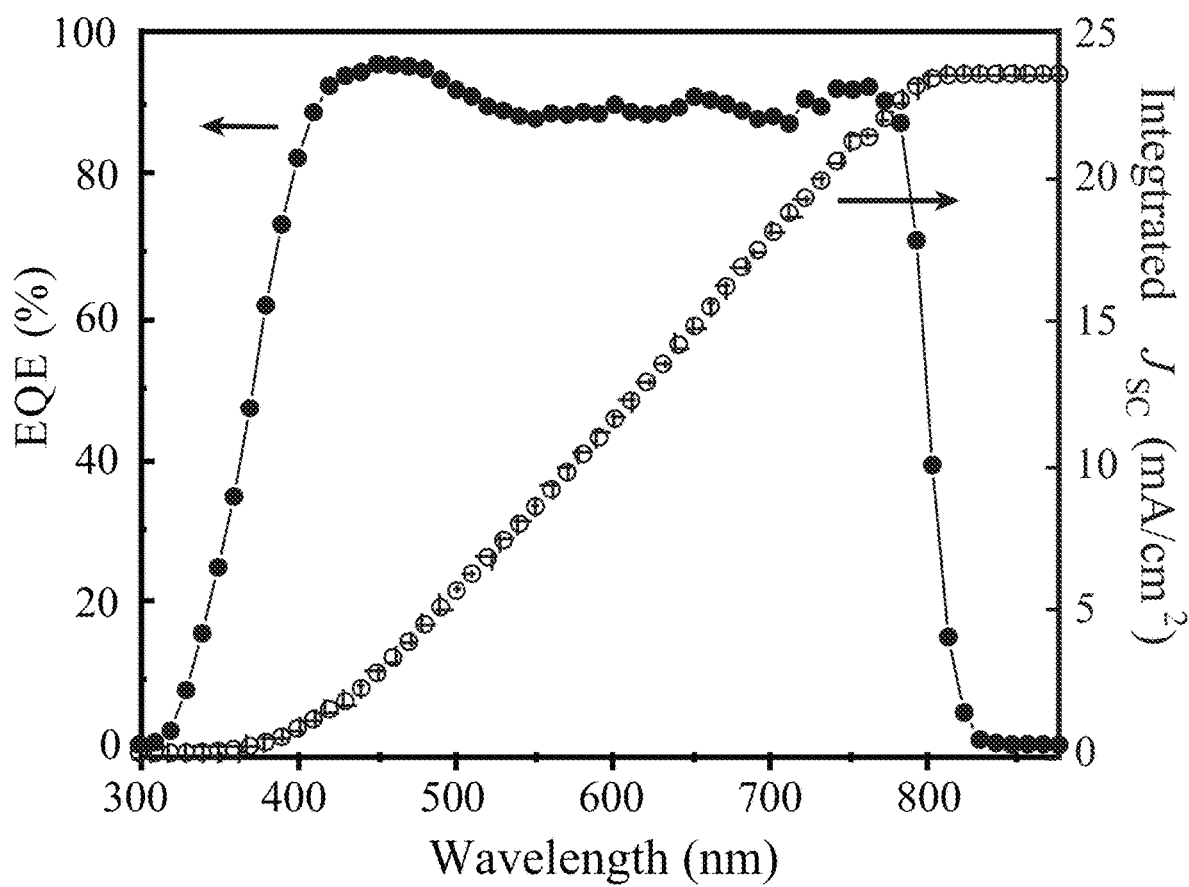
FIG. 25 illustrates an EQE spectrum of a 1.56 eV "target" device, according to some embodiments of the present disclosure.

To highlight the ability to spontaneously form a SAM hole-selective contact and perovskite layer in a single solution-processing step, the device performances of p-i-n perovskite solar cells were evaluated. Panel A of FIG. 18 illustrates the Me-4PACz concentration-dependent J-V curves, demonstrating that the PCEs of the devices are highest when the concentration of additive used in the precursor solution to synthesize the perovskite layer is between 0.25 and 1.0 mg/ml. At higher Me-4PACz concentrations, the performance dropped dramatically mainly because of a reduced shunt resistance. The PCEs of the devices with lower Me-4PACz concentration decreased slightly mainly from a loss of $V_{OC}$, presumably due to some portions of ITO surface directly contacting the perovskite layer. The EQE was integrated against the solar spectrum to estimate a $J_{SC}$ of 23.6 mA/cm$^2$ in agreement with the J-V measurement (deviation<5%) (see FIG. 25). The PSCs showed minor hysteresis (see Panel F of FIG. 18) and good reproducibility (see Panel C of FIG. 18).

As shown in the TOF-SIMS illustrated in FIG. 8C, a perovskite layer may be removed, while still leaving the Me-4PACz SAM. To isolate the SAM hole-injection effect from the effect that Me-4PACz may play on the top of the film and at grain boundaries within the film, devices were fabricated via perovskite layer removal and redeposition of neat perovskite layers onto substrates that were previously coated with either "target" perovskite layers or "neat" perovskite layers; i.e., perovskite layers made from a precursor solution containing an additive such as Me-4PACz, or perovskite layers made from a precursor solution containing no additive, respectively. The "neat" perovskite layer deposited on a substrate previously coated with a "target" perovskite layer demonstrated a PCE of 21.7%. The device fabricated with a "neat" perovskite layer on the ITO surface with a "neat" perovskite layer washed off (see Panel B of FIG. 18) demonstrated a very poor efficiency of 8.6%. This further demonstrates that the Me-4PACz additive in a perovskite precursor solution forms a robust SAM on an ITO surface. These devices showed similar device PV parameters with the target devices, especially $V_{OC}$, indicating that a Me-4PACz layer (i.e., the second additive layer) on the top surface of the perovskite layer does not introduce non-radiative recombination losses. To confirm the passivation role of Me-4PACz as indicated from TRPL study, devices were made, constructed of perovskite layers deposited on ITO/PTAA stacks, with the perovskite layer deposited on the ITO surface. These devices demonstrated improved PCE from 18.7% to 21%, mainly from an increase of the $V_{OC}$ (see Panel D of FIG. 18). It should be noted that this strategy could also be applied to other device structures such as PTAA or NiO$_x$ based p-i-n devices to modify the surfaces, proving synergistic benefits of typical HTMs and SAM hole extraction contact.

Figure 19:
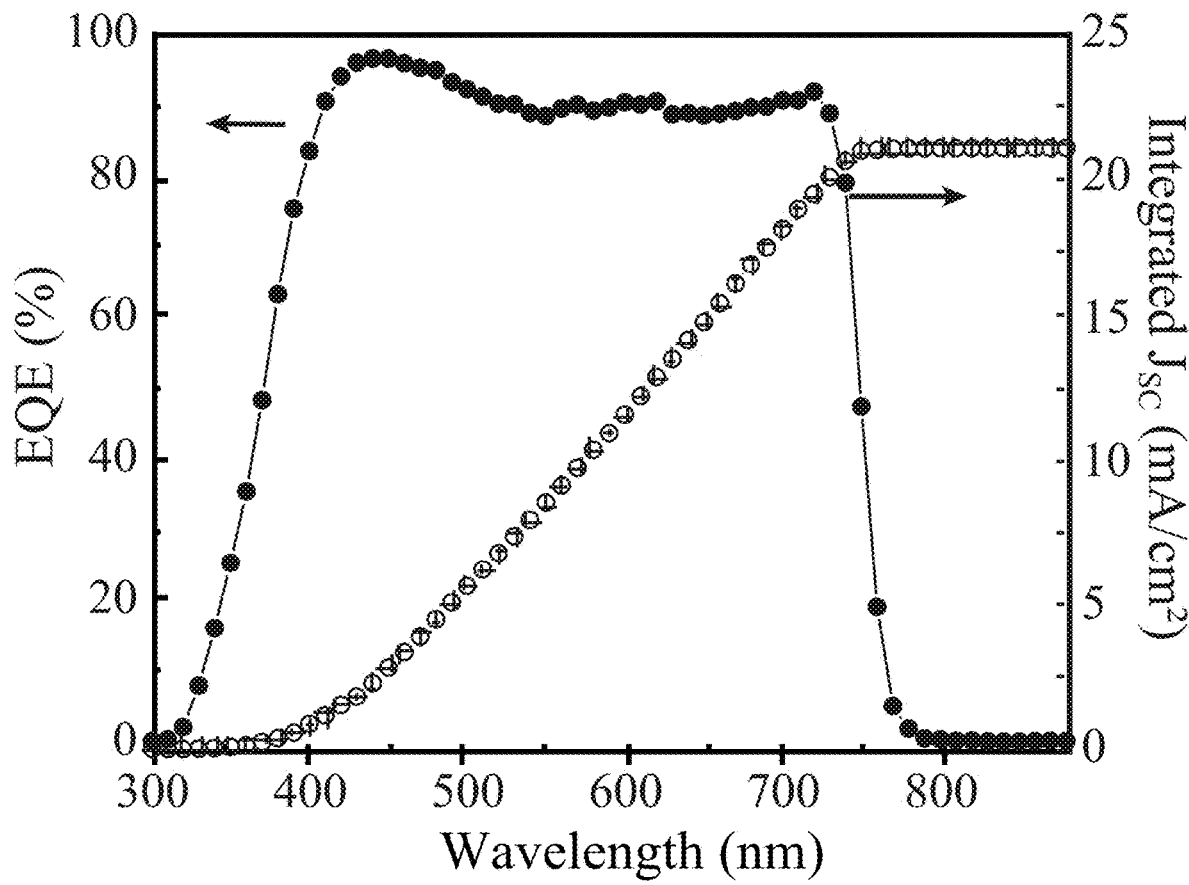
FIG. 19 illustrates an EQE spectrum of a "target" 1.68 eV wide bandgap device, according to some embodiments of the present disclosure.
Figure 20:
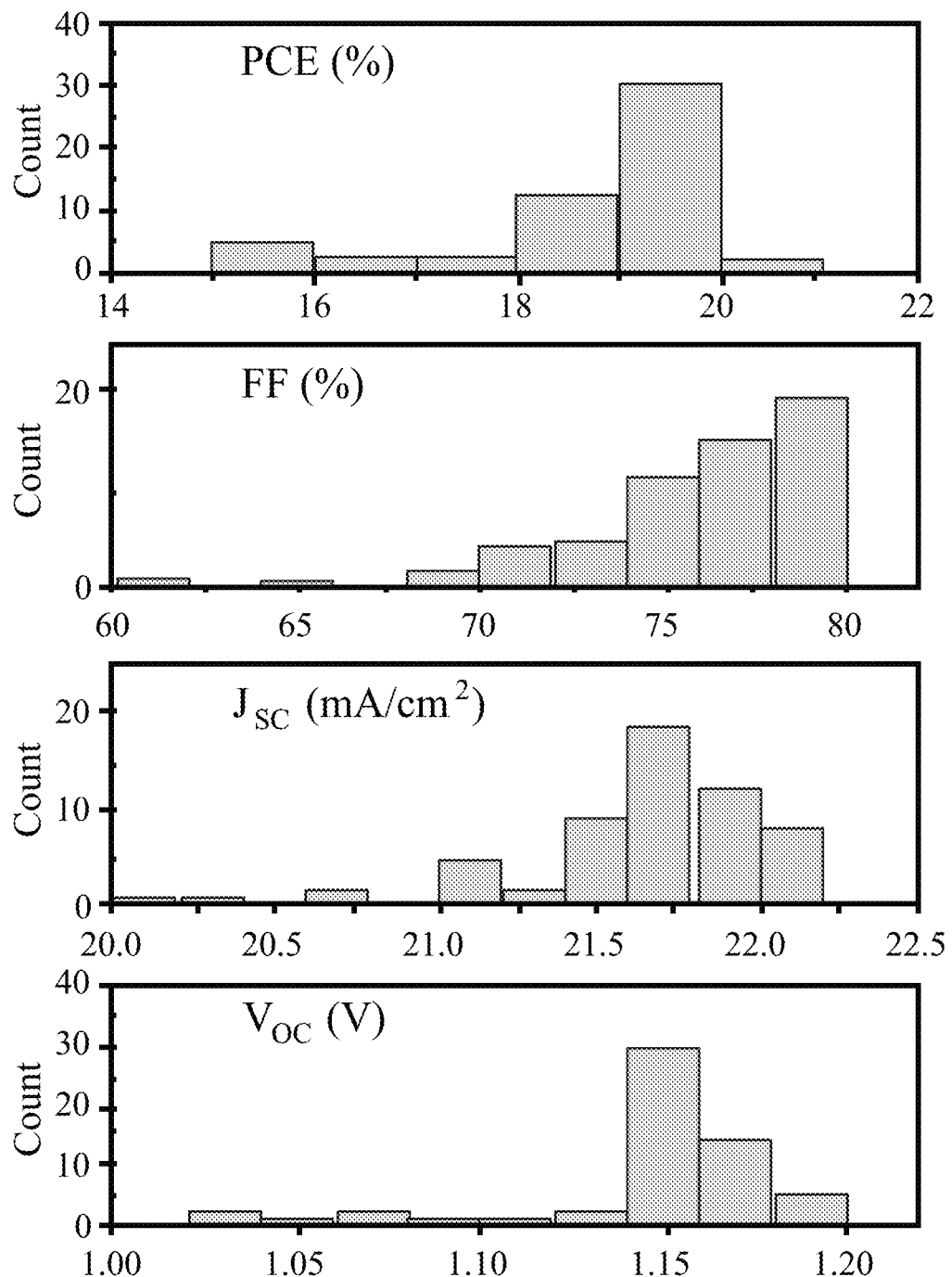
FIG. 20 illustrates histograms of PV parameters measured for 58 wide bandgap devices, according to some embodiments of the present disclosure.
Figure 21:
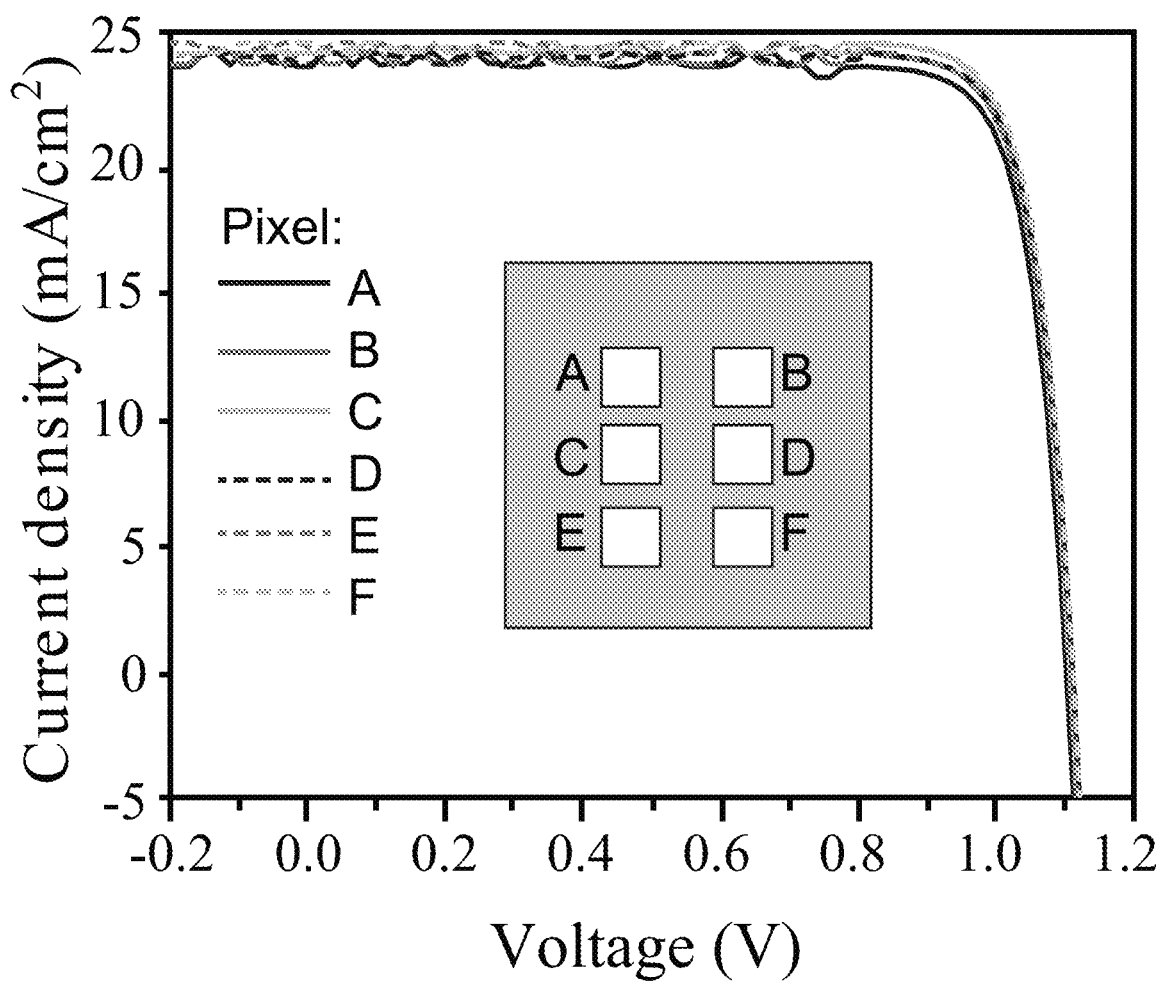
FIG. 21 illustrates a J-V curve of six pixels on a PSC fabricated with Me-4PACz used in the perovskite precursor solution, according to some embodiments of the present disclosure.
Figure 22:
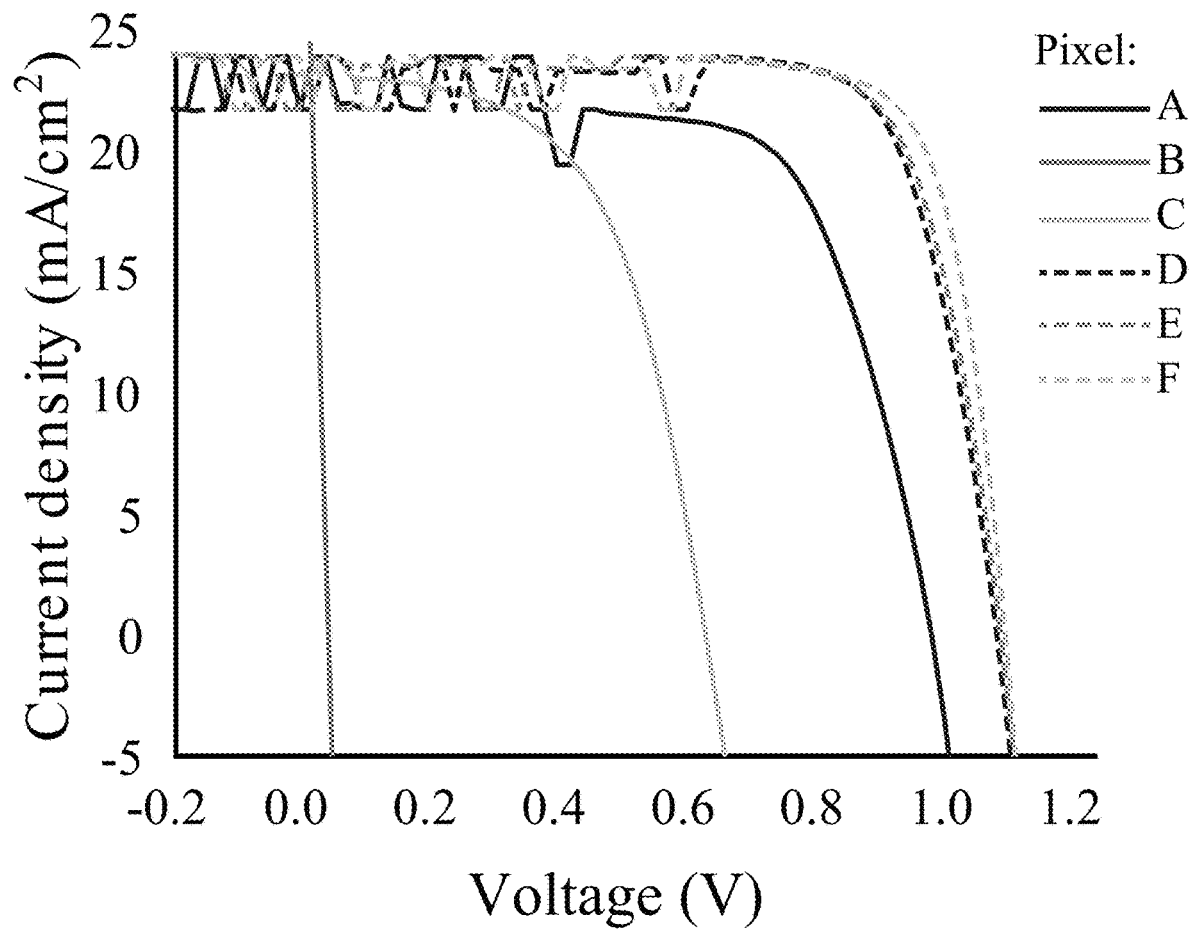
FIG. 22 illustrates a J-V curve of six pixels on a PSC fabricated with 2PACz used in the perovskite precursor solution, according to some embodiments of the present disclosure.
Figure 23:
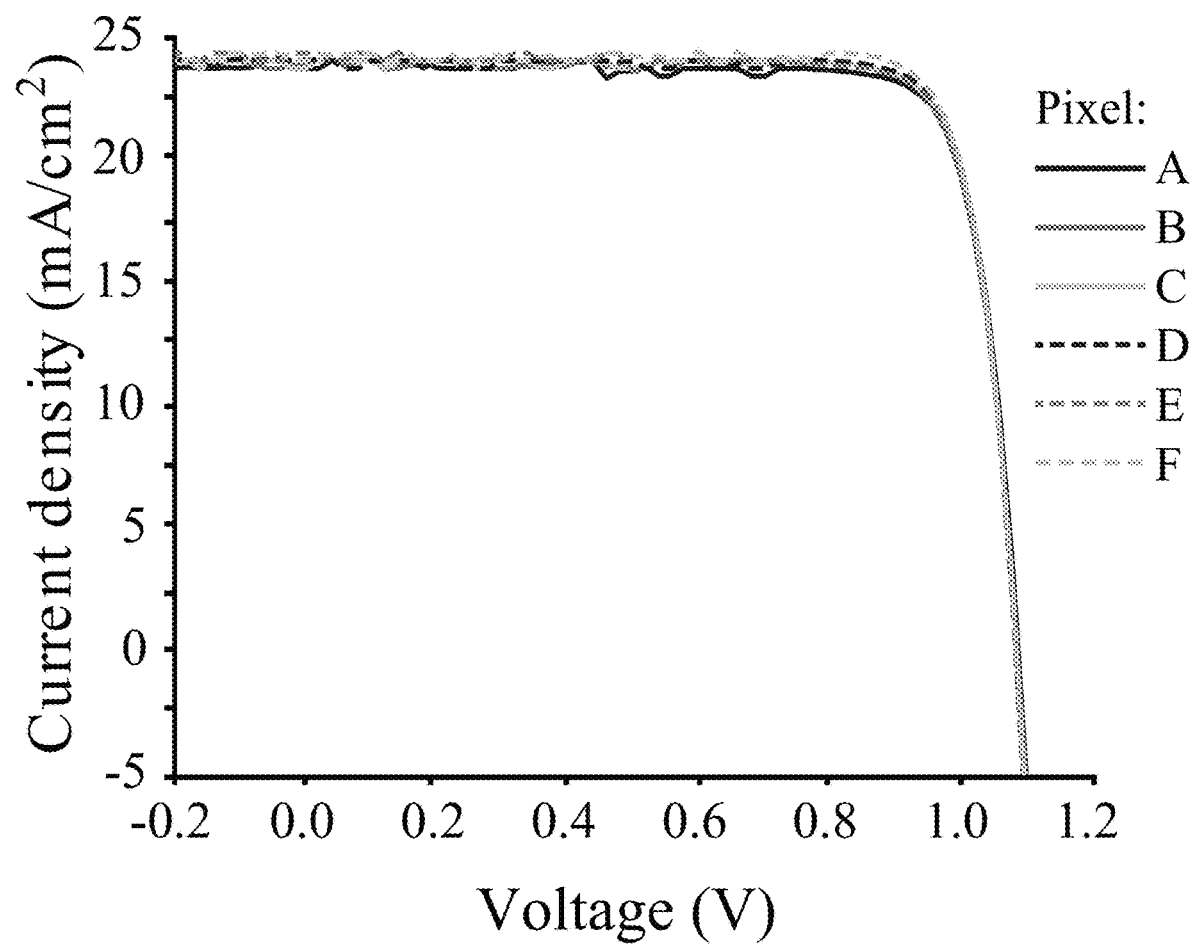
FIG. 23 illustrates a J-V curve of six pixels on a PSC fabricated on ITO surface having a 2PACz SAM positioned thereon, according to some embodiments of the present disclosure.

To demonstrate the generality of this concept, the methods described herein was tested on a wide bandgap composition Cs$_{0.05}$FA$_{0.8}$MA$_{0.15}$Pb(I$_{0.75}$Br$_{0.25}$)$_3$ ($E_G$~1.68 eV), which is commonly used for perovskite-silicon tandem PVs, and the target devices showed PCEs of 20.0% (see Panel E of FIG. 18). The integrated $J_{SC}$ (see FIG. 19, 21.0 mA/cm$^2$) derived from the EQE spectrum matched well with the $J_{SC}$ from the J-V scan. The wide-bandgap PSCs showed good reproducibility (see FIG. 20). The long-term stability of unencapsulated PSCs using MPP tracking under 1-sun illumination at 40° C. with $N_2$ flow shows an estimated T80>1000 hrs (see Panel H of FIG. 18).

Next, experiments like that described above for Me-4PACz were also completed using the phosphonic acid molecule, 2PACz, as a hole selective contact for PSCs. The devices fabricated with 2PACz in the precursor showed lower FF (63.7% vs. 82.2% from the reverse scan) and larger hysteresis (hysteresis index (HI)=0.19 vs. 0.02) compared with target devices fabricated with Me-4PACz in the precursor (see Panel F of FIG. 18) and devices made from depositing 2PACz SAMs and perovskite layers sequentially. The HI is calculated according to the equation HI=(PCE$_R$−PCE$_F$)/PCE$_R$, where PCE$_F$ and PCE$_R$ represent the PCE measured from the forward and reverse scans, respectively. Device were also fabricated with perovskite layers deposited on 2PACz SAMs, and the resultant devices showed much higher FF (81.9% from the reverse scan) and much smaller device efficiency deviation of different pixels on the same substrate compared with the devices fabricated using solutions containing 2PACz in the precursor solution (see Panel F of FIG. 18 and FIG. 21-23). These results indicates that 2PACZ does not simultaneously form densely packed monolayers on ITO in the same manner as Me-4PACz. The larger Me-4PACz molecules are apparently more efficiently transferred, as the solid perovskite layer forms, from the perovskite solution to the ITO-perovskite interface and the stronger lateral van der Waals interactions may help organize the molecules into high grafting density and well-ordered SAM.

Figure 24:
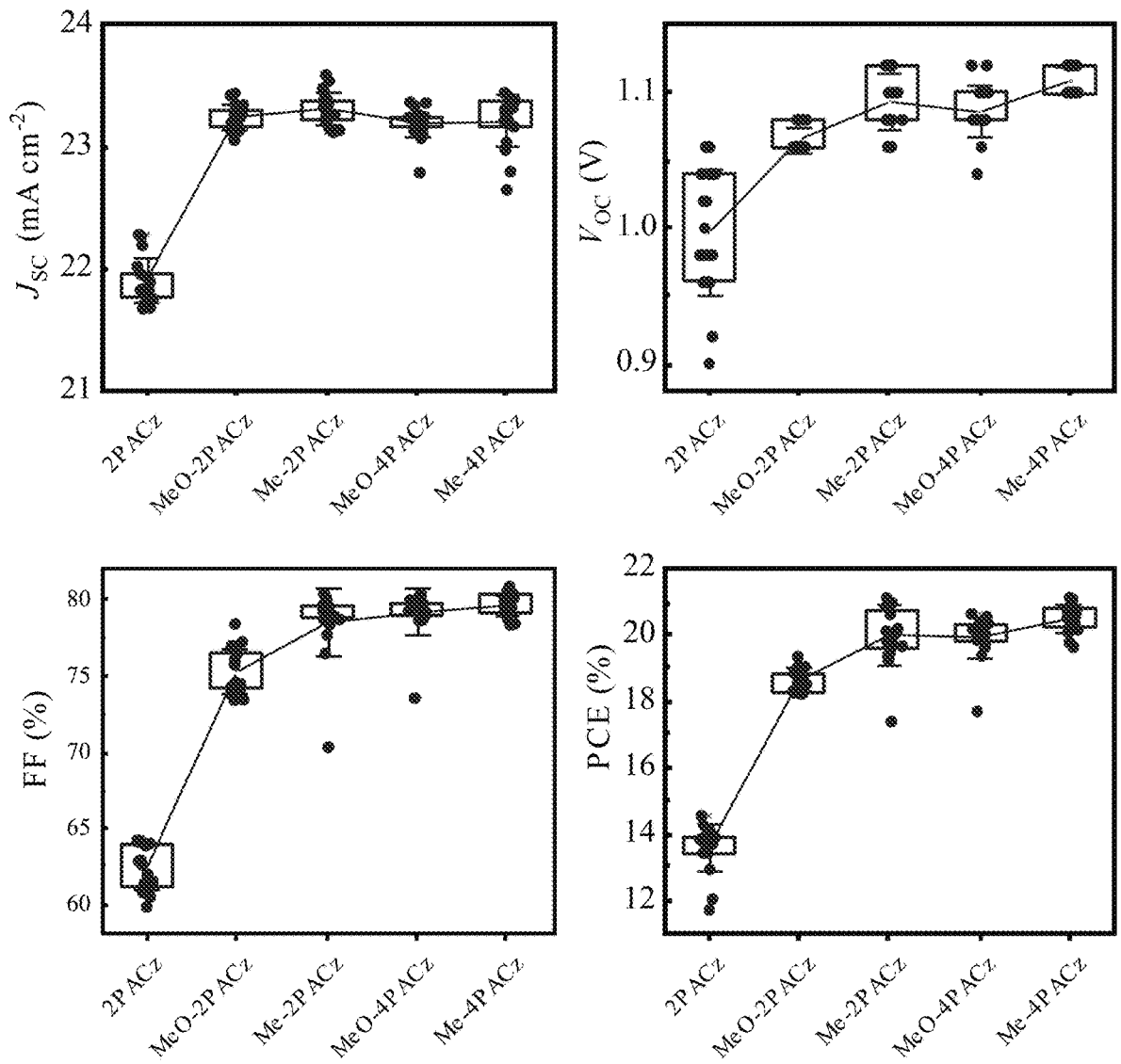
FIG. 24 illustrates PV parameters analysis for 90 devices (18 devices for each phosphonic acid) fabricated with different phosphonic acids in the perovskite precursor solution, according to some embodiments of the present disclosure.

To further broaden the concepts described herein, the PV parameters of devices fabricated with different phosphonic acid containing additives were studied. The complete list of additives studied is as follows: (2PACz, MeO-2PACZ [(2-(3,6-dimethoxy-9H-carbazol-9-yl)ethyl)phosphonic acid], Me-2PACz [(2-(3,6-dimethyl-9H-carbazol-9-yl)ethyl)phosphonic acid], MeO-4PACz[(4-(3,6-dimethoxy-9H-carbazol-9-yl)butyl)phosphonic acid], and Me-4PACz). As described above for Me-4PACz, these additives were included in the perovskite precursor solution and treated to form, in a single step, both the perovskite layer and an HTL constructed of the additive. Results are shown in Panel G of FIG. 18 and FIG. 24. The devices fabricated using a smaller phosphonic acid additive, 2PACz, show lower PV merits ($J_{SC}$(21.5-22.5 mA cm$^{-2}$), $V_{OC}$ (0.9-1.06 V), FF (60-65%), and PCE (11.5-14.5%)). This is presumably because the 2PACz molecules may not provide complete coverage of the underlying ITO layer, thereby allowing portions of the perovskite layer to make direct contact, shunts, with the ITO layer. On the other hand, when the size of the phosphonic acid functionalized additive was increased by the addition of two methyl groups or two methoxy groups, a dramatic improvement was observed in the resultant device: FF to ~75% for MeO-2PACZ and ~78% for Me-2PACz. This is presumably due to improved hole extraction resulting from better coverage of phosphonic acid containing molecules on ITO. The FF was further improved to ~79% and 80% for the devices with phosphonic acid additives with longer alkyl spacer, MeO-4PACz and Me-4PACz, respectively.

Figure 26A:
FIG. 26A illustrates a photograph of a "target" perovskite module (6.5×7 $cm^2$), according to some embodiments of the present disclosure.
Figure 26B:
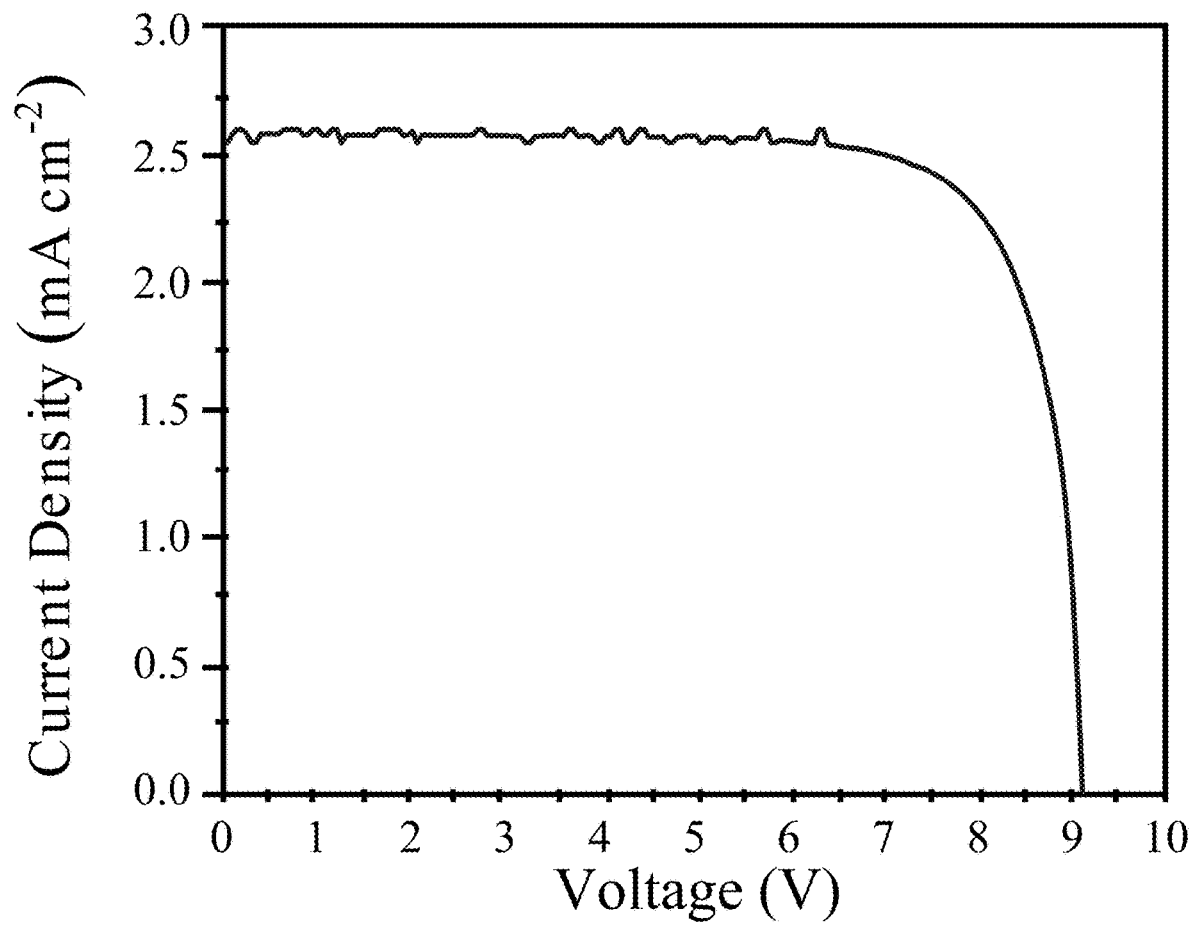
FIG. 26B illustrates a J-V curve of a "target" perovskite module, and the illumination aperture area was 30 $cm^2$ (8 cells, a geometric fill factor of 91%), according to some embodiments of the present disclosure. PCE=18.59%; $J_{SC}$=2.59 mA/$cm^2$; $V_{OC}$=9.088 V; FF=0.790.
Figure 26C:
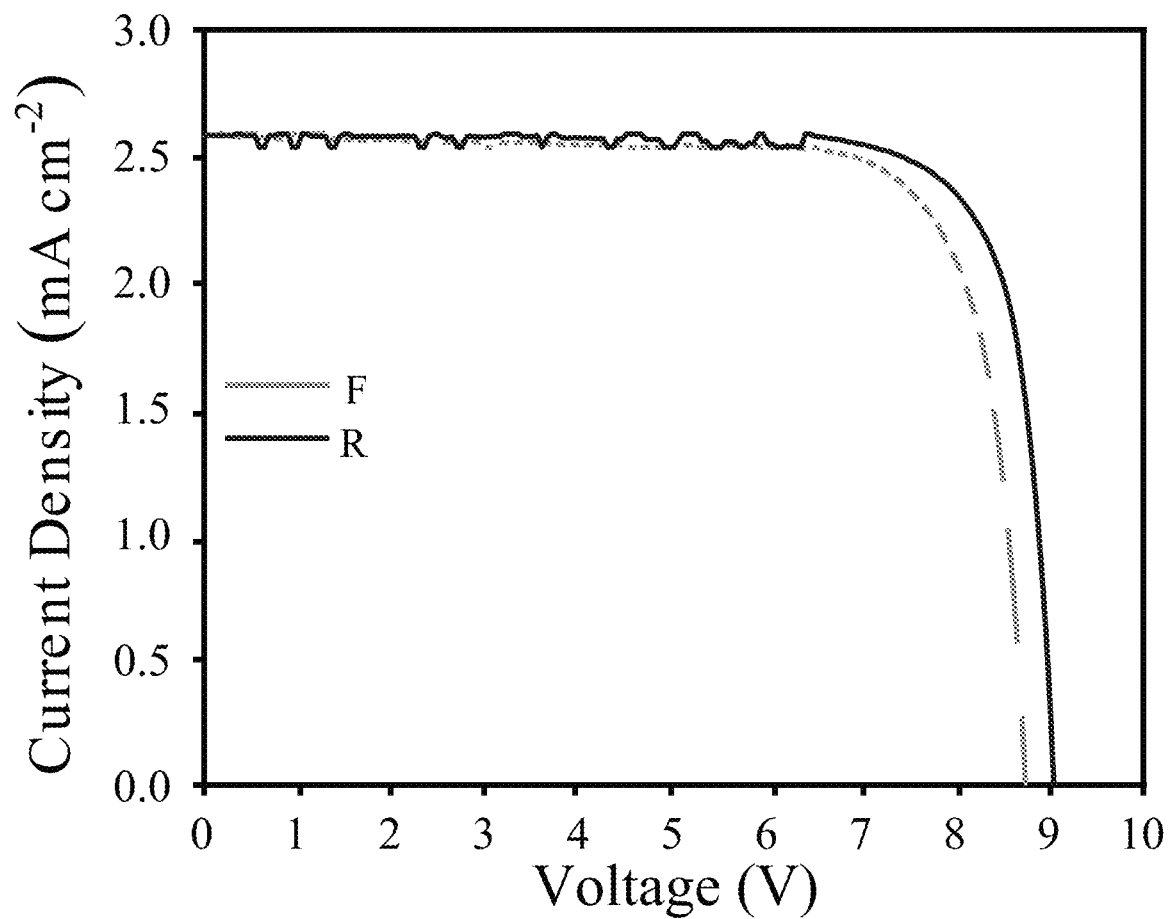
FIG. 26C illustrates a hysteresis analysis of perovskite modules at a scan rate of 50 mV/s, according to some embodiments of the present disclosure. Forward metrics: PCE=17.83%; $J_{SC}$=2.59 mA/$cm^2$; $V_{OC}$=8.738 V; FF=0.787. Reverse metrics: PCE=18.49%; $J_{SC}$=2.59 mA/$cm^2$; $V_{OC}$=9.031 V; FF=0.791.
Figure 26D:
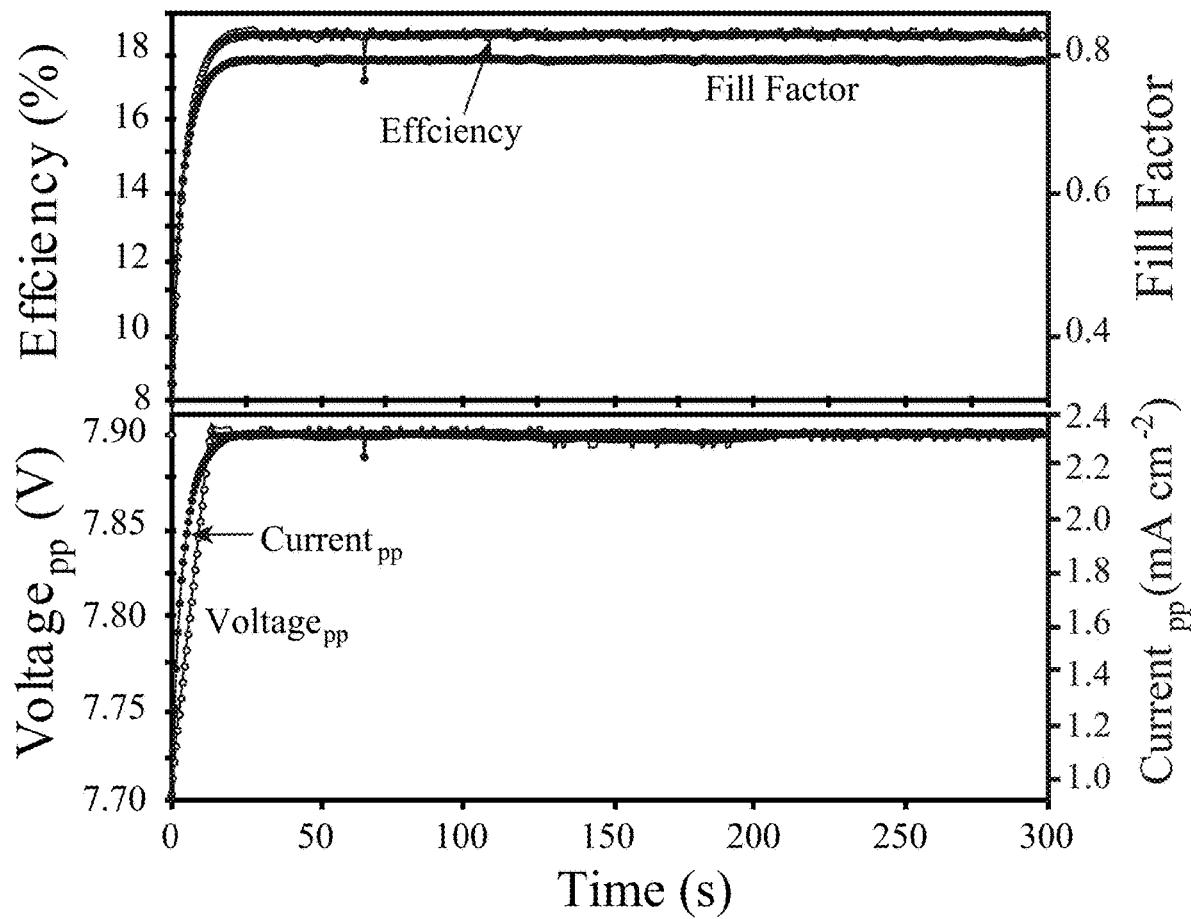
FIG. 26D illustrates the stabilized power output (SPO) of an unencapsulated "target" perovskite module, according to some embodiments of the present disclosure.

High performance and scalability are both critical for the commercialization of the perovskite PV technology. Therefore, the uniformity and the upscaling compatibility of the single-solution-step processing method described herein was evaluated by fabricating perovskite modules having the device architecture of glass/ITO/perovskite/PCBM/BCP/Ag. The modules with 8 subcells showed efficiencies of 18.59%, with $V_{OC}$=9.088 V; $J_{SC}$=2.59 mA cm$^{-2}$; and FF=0.790 (see FIG. 26B) (corresponding to 20.43% with an active area 27.6 cm$^2$, a geometric fill factor of 91%) from reverse scan. The module shows a hysteresis index (HI) of 0.035 (see FIG. 26C). When compared to small area devices, the modules replicate almost all the PV parameters of the small devices and in particular the FF.

Figure 27:
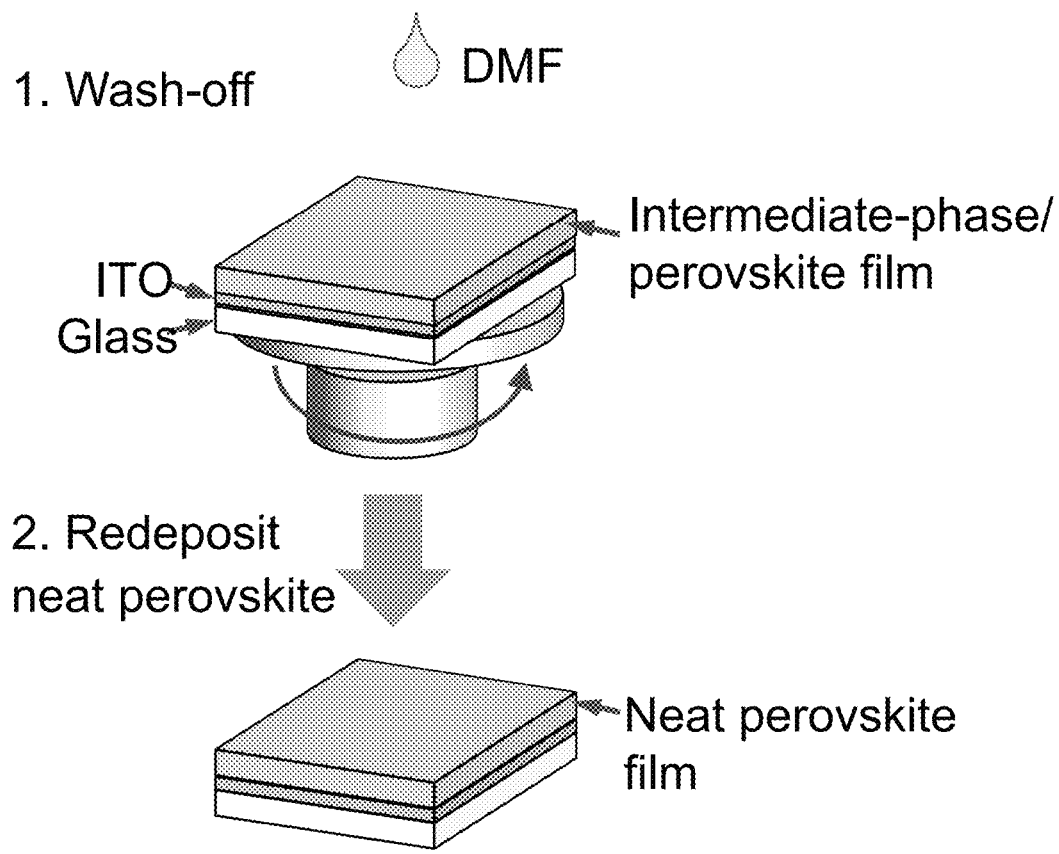
FIG. 27 illustrates a schematic for washing off (i.e., removing) and intermediate-phase and/or perovskite film, followed by the redeposition of a neat perovskite film onto the original substrate, according to some embodiments of the present disclosure.
Figure 28:
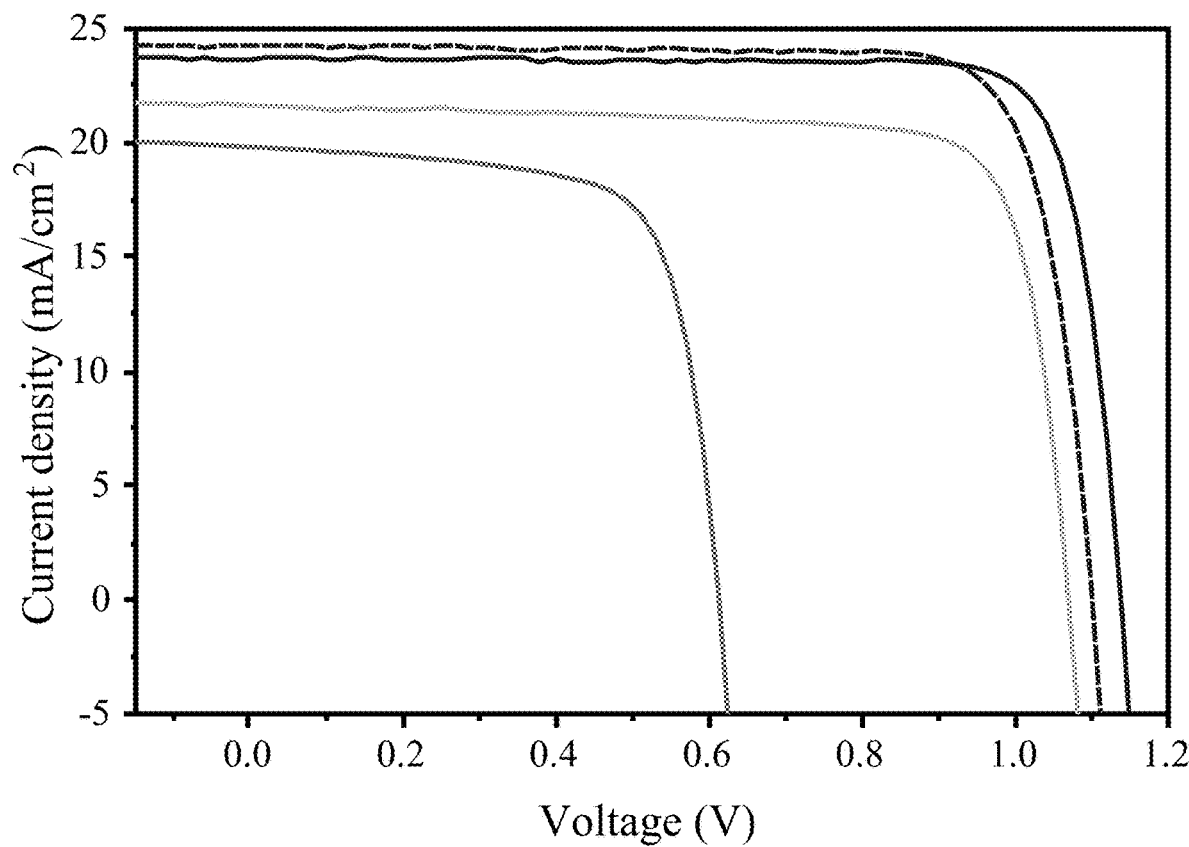
FIG. 28 illustrates J-V characteristics of neat PSCs fabricated on substrates with the intermediate-phase and/or perovskite film washed off, according to some embodiments of the present disclosure. Darkest line=Target; Intermediate darkness line=Neat perovskite film washed off; Light line=Target intermediate-phase film washed off; Dashed line=Target perovskite film washed off.

To investigate the dynamics of SAM formation, an intermediate-phase perovskite layer containing Me-4PACz, while still partially wet, was washed off (i.e., removed) using DMF. Then a neat perovskite layer was deposited onto the same substrate, per the method illustrated in FIG. 27. The resulting device demonstrated a PCE of only 18.4% (see FIG. 28). This device demonstrated an inferior performance to a target device (VOC of 1.08 V versus 1.14 V and fill factor (FF) of 78.9% versus 83.3%), indicative of SAM-free regions leading to direct contact between the ITO and perovskite (see Panel E of FIG. 18). Therefore, one may conclude that the SAM was loosely packed and incomplete before perovskite crystallization.

Neat PSCs were also manufactured on substrates from which a target perovskite film had been washed off after full crystallization. The resulting device showed a much higher PCE (21.7% with a VOC of 1.12 V) than the neat devices fabricated on ITO substrate with the intermediate-phase film containing Me-4PACz washed off. This demonstrates that a denser and robust SAM formed on the ITO substrate during the perovskite film crystallization process. Perovskite films have been shown to follow a top-to-bottom downward crystallization process initialized by the evaporation of residual solvent from the top surface of 'wet' films. We surmise that during film formation the Me-4PACz is pushed downwards and concentrated on the ITO surface where the phosphonic acid headgroups bind strongly to the ITO substrate spontaneously forming a robust SAM32. Meanwhile, residual Me-4PACz remains on the perovskite top surface. Me-4PACz is too large to be incorporated into the perovskite lattice and we do not see a substantial P signal throughout the film but cannot rule out a very small amount at grain boundaries.

Therefore, we conclude that some Me-4PACz molecules bind to the ITO surface through covalent bonds/chemisorption and form a loosely packed SAM during initial application of the perovskite precursor solution, but a denser and robust SAM forms during the crystallization of the perovskite film.

Figure 29:
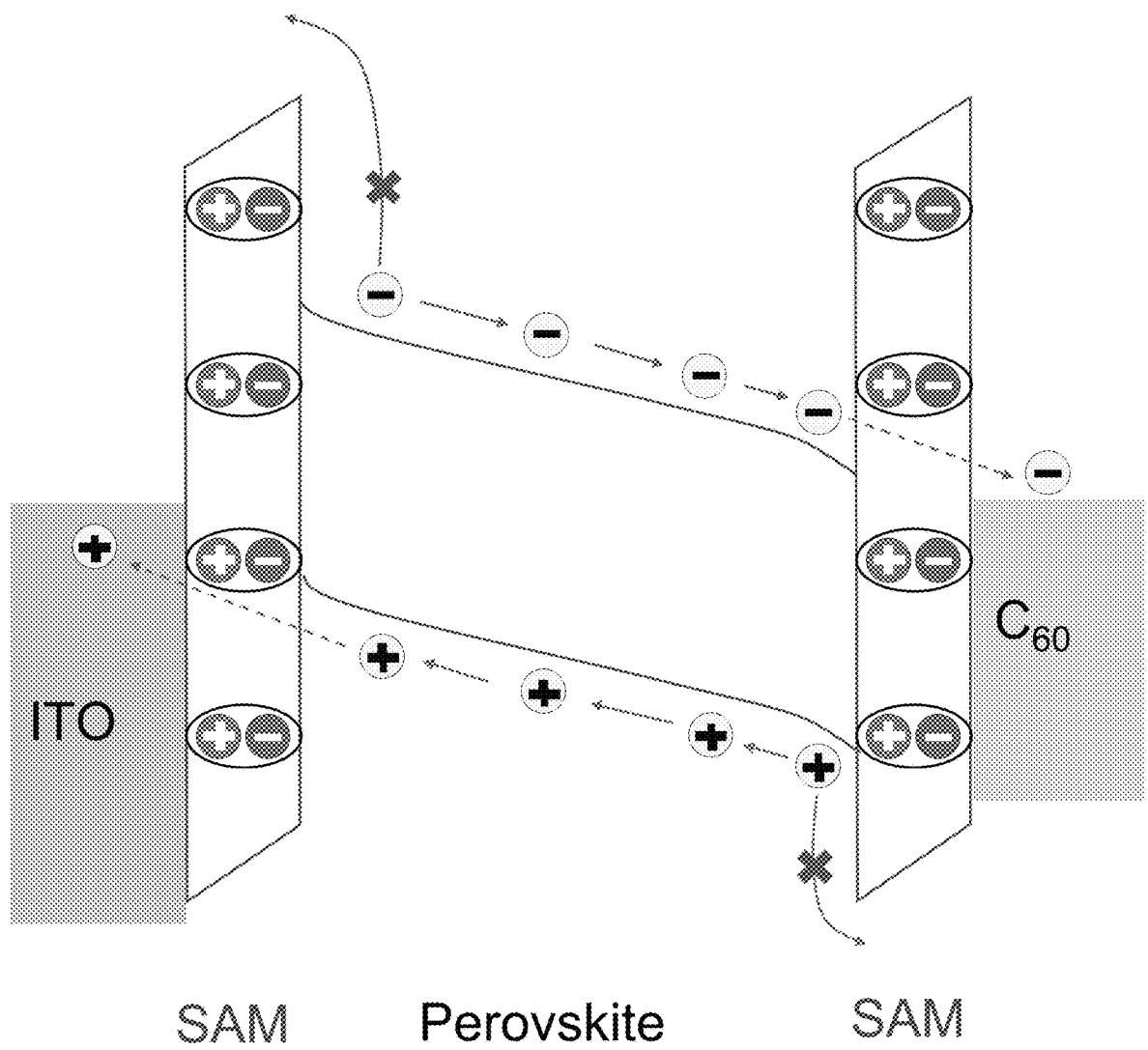
FIG. 29 illustrates a band diagram of the target PSCs under short-circuit condition, according to some embodiments of the present disclosure.
Figure 30:
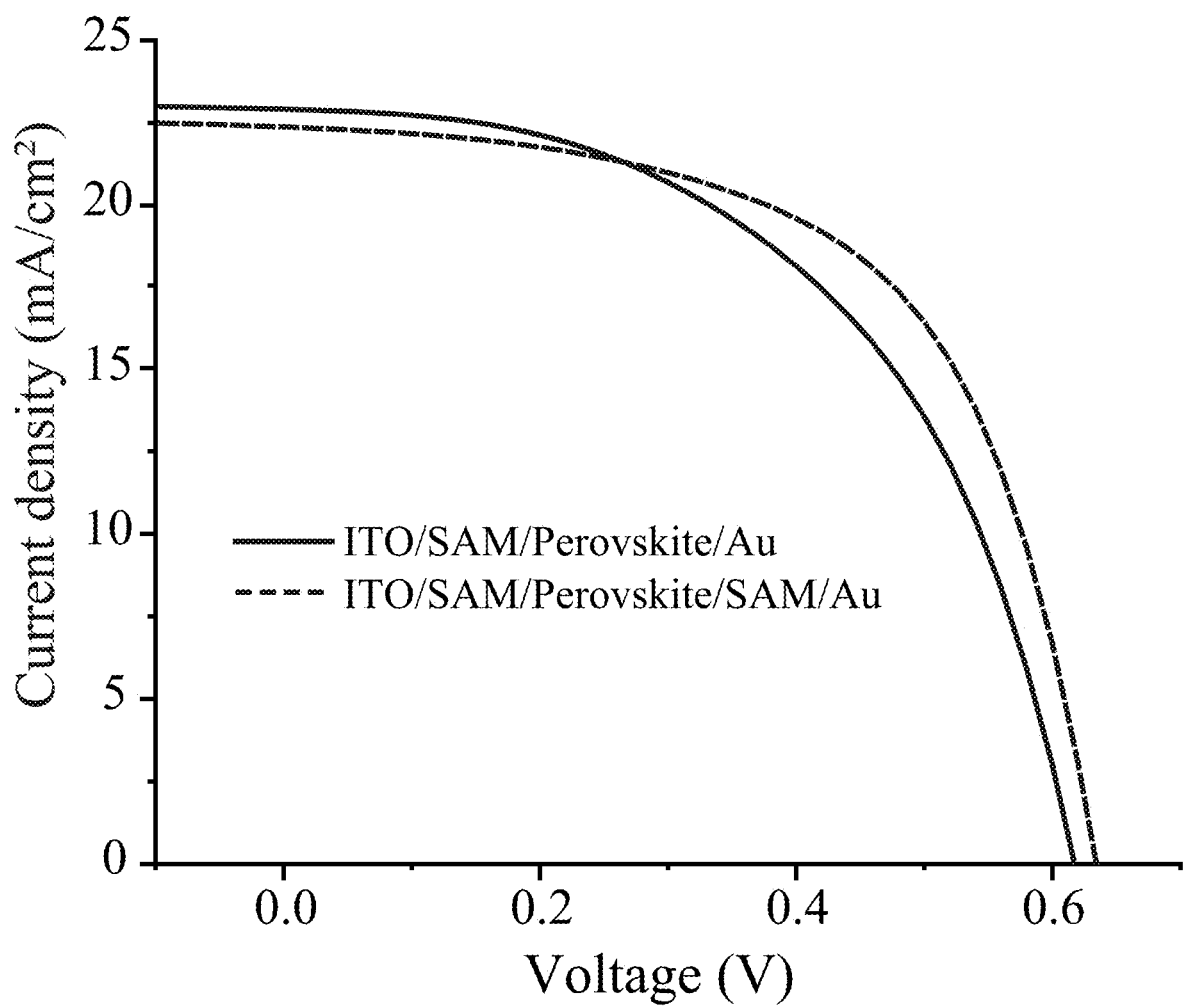
FIG. 30 illustrates J-V characteristics of a neat PSC (structured as ITO/SAM/Perovskite/Au) constructed on a substrate with the target perovskite washed off, and a target PSC (structured as ITO/SAM/Perovskite/SAM/Au), according to some embodiments of the present disclosure.

PAs can anchor to the surface of a perovskite layer with the alkyl tail pointing upwards. The molecular dipole induced by Me-4PACz on the top surface would thus have the same polarity as below the perovskite and could promote electron extraction to the ETL. Thus, contrary to a conventional HTL (such as poly(triaryl amine) (PTAA) and 2,2',7,7-tetrakis(N,N-di-p-methoxyphenyl-amine)9,9'-spirobifluorene (spiro-OMeTAD)), SAMs can be present on both sides of the perovskite absorber provided that the dipole is pointing in the same direction to promote charge-carrier extraction at both interfaces (see FIG. 29). Therefore, the approach could be possible also make this very simplified device stack, ITO/SAM/Perovskite/SAM/top-contact (metal or TCO), work. As shown in FIG. 30, the target PSC structured as ITO/SAM/Perovskite/SAM/Au showed a higher PCE of 8.33% with FF of 58.2% compared with neat PSC (structured as ITO/SAM/Perovskite/Au; PCE of 7.32% and FF of 51.6%) fabricated on the substrate with the target perovskite washed off.

Materials and Methods

Materials: Formamidinium iodide (FAI) and methylammonium bromide (MABr) were purchased from Greatcell Solar. Lead iodide ($PbI_2$, ultra dry, 99.999%) were purchased from Alfa Aesar. Lead bromide ($PbBr_2$, 99.999%), Cesium iodide (CsI, 99.999%), lithium fluoride (LiF, ≥99.98%), anhydrous dimethylformamide (DMF), anhydrous dimethyl sulfoxide (DMSO), and anhydrous chlorobenzene (CB) were purchased from Sigma-Aldrich. 2PACz and Me-4PACz were purchased from Tokyo Chemical Industry (TCI)-America. MeO-2PACz, Me-2PACz, MeO-4PACz, Me-4PACz, $C_{60}$ and bathocuproine (BCP) were purchased from Luminescence Technology Corp. (Lumtec). All chemicals were used as received without further purification.

Device fabrication: The patterned glass/ITO substrates were sequentially cleaned with acetone and isopropanol under ultrasonication, and then dried with nitrogen and treated with UV-ozone for 15 min. 1.4M perovskite precursor solution ($CS_{0.05}(FA_{0.92}MA_{0.08})_{0.95}Pb(I_{0.92}Br_{0.08})_3$ for 1.56 eV cells or $Cs_{0.05}FA_{0.05}MA_{0.15}Pb(I_{0.75}Br_{0.25})_3$ for 1.68 eV cells) was dissolved in mixed solvent (DMF/DMSO=4:1) in a nitrogen glovebox. For the target device, Me-4PACz was added into perovskite precursor. The hole-selective contact and perovskite absorber were cast in a single coating step in a nitrogen glovebox. In a typical procedure, the perovskite precursor containing Me-4PACz was spin-coated on UV-ozone treated glass/ITO substrates at 2000 rpm for 2 s and 4000 rpm for 20 s, and 150 μL CB was dropped on the spinning substrate 5 s before the end of the spin-coating process. Subsequently, the sample was annealed at 100° C. for 30 min. The devices were finished by thermally evaporating LiF (1 nm), $C_{60}$ (25 nm), BCP (6 nm) and silver (100 nm) in sequential order.

The module composed of eight-strip cells connected in series using P1, P2, P3 type interconnects. The laser structuring of all three scribes (P1, P2, P3) were made with the same near infrared 1064 nm 20 W laser (Trotec). For fabrication of solar modules, 6.5 cm×7 cm ITO substrates were patterned by a laser with a scribing width of 40 μm (Speed 300 mm/s, frequency 65 kHz, pulse duration: 120 ns, power 60%). ITO glass was cleaned with detergent solution, acetone, and isopropanol. The substrate was cleaned by ultraviolet-ozone treatment (UVO) for 30 min before the deposition of the perovskite layer. A 1.3 M $Cs_{0.05}MA_{0.07}FA_{0.88}Pb(I_{0.93}Br_{0.07})_3$ perovskite precursor solution was prepared by mixing $PbI_2$, FAI, $PbBr_2$, MABr and CsI in DMF/DMSO (8/1) mixed solvent with 15 mg/ml MACl and 0.5 mg/ml Me-4PACz. The resulting perovskite solutions were spin-coated on the substrates at 1000 rpm for 10 s and 4000 rpm for 30 s, respectively. 1 mL of chlorobenzene was dropped in 15 s at 4000 rpm followed by thermal annealing of 150° C. for 10 min and 100° C. for 20 min. The PCBM chlorobenzene solution (20 mg/ml) was spin-coated on the perovskite layer at 1000 rpm for 30 s followed by thermal annealing of 70° C. for 10 min. And then, the BCP isopropanol solution (0.5 mg/ml) was spin-coated on the PCBM layer at 5000 rpm for 30 s followed by thermal annealing of 70° C. for 10 min. Next, ITO/Perovskite/PCBM/BCP layers were laser scribed over a width of 400 μm (multiple parallel scribes with 50 μm spacing, speed 1000 mm/s, pulse duration 120 ns, frequency 65 kHz, power 15%). Finally, a silver electrode was deposited by thermal evaporation, and silver layers were scribed by a laser with a scribing width of 50 μm (speed 1000 mm/s, pulse duration 120 ns, frequency 65 kHz, power 15%).

Material characterization: The SEM images were taken using a Hitachi 4800 scanning electron microscope. The absorption spectra were obtained by a Shimadzu UV-3600 spectrophotometer. An ION-TOF TOF-SIMS V Time of Flight SIMS (TOF-SIMS) spectrometer was used for depth profiling of the perovskite films. Depth Profiling was completed with a 30 KeV $Bi_3^+$ Bismuth primary ion beam (0.8 pA pulsed current rastered over a 50×50 μm area) and a 1 kV oxygen ion sputter beam (7 nA sputter current) rastered over a 150×150 μm area. Photoelectron spectroscopy measurements were conducted in a PHI 5600 UHV system. UPS and XPS measurements both employed an 11 in. diameter hemispherical electron energy analyzer and multichannel detector. The excitation source for UPS was an Excitech H Lyman-α lamp (E-LUX™121) with an excitation energy of 10.2 eV. All UPS measurements were recorded with −5 V sample bias and a pass energy of 5 eV. XPS measurements used an Al Kα x-ray excitation source (1486.6 eV) and a pass energy of 30 eV. The KPFM and c-AFM measurements were performed inside an Ar-filled glovebox. The devices were cleaved from the film side to expose the cross section for KPFM measurements, and the front side of the device was grounded, and bias voltage was applied from the back contact of the devices. KPFM measurements were performed with varying bias voltage from −1 V to +1 V on the same area. AFM images were taken on a Veeco Nanoscope IIIA instrument running in tapping mode.

Device characterization: Simulated AM 1.5G irradiation (100 mW/cm$^2$) was produced by an Oriel Sol3A Class AAA Solar Simulator in a nitrogen glovebox for current density-voltage (J-V) measurements. The intensity of the solar simulator was calibrated with a KG5 filtered Si reference solar cell that was certified by NREL PV Performance Characterization Team, and the spectral mismatch factor was minimized to 0.9923. The device area was 0.122 cm$^2$ and was masked with a metal aperture to define an active area of 0.0585 cm$^2$. The scanning rate was 0.34 V s$^{-1}$. The stabilized power output (SPO) of the devices was measured by monitoring the photocurrent current density output with the biased voltage set near the maximum power point. External quantum efficiency (EQE) measurements were taken using a Newport Oriel IQE200.

Computations: DFT calculations were performed using the VASP code with projector augmented-wave potentials. A kinetic energy cutoff of 500 eV was used to expand the wave functions. The Brillouin zone was sampled with Γ-centered 2×2×1 k-mesh. The atomic coordinates were relaxed with PBE functional with a force tolerance of 0.01 eV Å$^{-1}$. To model ITO, we used the $In_2O_3$ crystal structure with ⅓ In atoms replaced by Sn. (222) surface was adopted with 0 termination (passivated with H).

Examples

Example 1. A device comprising: a perovskite layer; and a first layer comprising a molecule having a structure according to formula (I)

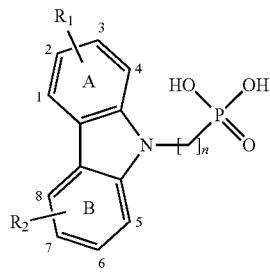

(I)

wherein: the perovskite layer and the first layer are in physical contact, n is between 1 and 10, inclusive, $R_1$ comprises at least one of hydrogen, a first alkyl group, a first alkoxy group, or a first halogen, $R_2$ comprises at least one of hydrogen, a second alkyl group, a second alkoxy group, or a second halogen, $R_1$ is bonded to aromatic ring (A) at carbon atom (1), carbon atom (2), carbon atom (3), or carbon atom (4), $R_2$ is bonded to aromatic ring (B) at carbon atom (5), carbon atom (6), carbon atom (7), or carbon atom (8), and $R_1$ and $R_2$ are the same or different.

Example 2. The device of Example 1, wherein the first alkyl group and the second alkyl group comprise independently at least one of a methyl group, an ethyl group, or a propyl group.

Example 3. The device of either Example 1 or Example 2, wherein the first alkoxy group and the second alkoxy group comprise independently at least one of a methoxy group, an ethoxy group, or a propoxy group.

Example 4. The device of any one of Examples 1-3, wherein the first halogen and the second halogen comprise independently at least one of fluorine, chlorine, bromine, or iodine.

Example 5. The device of any one of Examples 1-4, wherein $R_1$ is bonded to aromatic ring (A) at carbon atom (2).

Example 6. The device of any one of Examples 1-5, wherein $R_2$ is bonded to aromatic ring (B) at carbon atom (7).

Example 7. The device of any one of Examples 1-6, wherein the molecule comprises at least one of (2-(3,6-dimethyl-9H-carbazol-9-yl)ethyl)phosphonic acid (Me-2PACz), (4-(3,6-dimethoxy-9H-carbazol-9-yl)butyl)phosphonic acid (MeO-4PACz), (2-(3,6-dimethoxy-9H-carbazol-9-yl)ethyl)phosphonic acid (MeO-2PACz), (2-(9H-carbazol-9-yl)ethyl)phosphonic acid (2PACz), (4-(9H-carbazol-9-yl)butyl)phosphonic acid (4PACz), (2-(3,6-dibromo-9H-carbazol-9-yl)ethyl)phosphonic acid (Br-2PACz), (4-(3,6-dibromo-9H-carbazol-9-yl)butyl) phosphonic acid (Br-4PACz), or (6-(3,6-Dimethyl-9H-carbazol-9-yl)hexyl)phosphonic acid (Me-6PACz).

Example 8. The device of any one of Examples 1-7, wherein the molecule has a structuring according to at least one of formulas (II), (III), (IV), (V), or (VI)

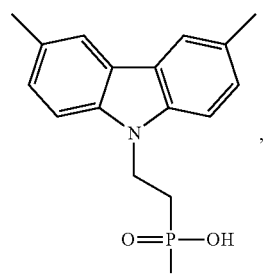

(II)

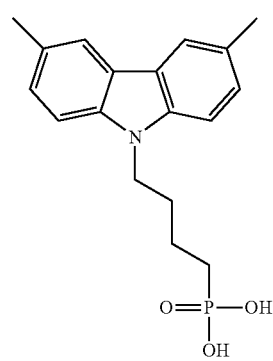

(III)

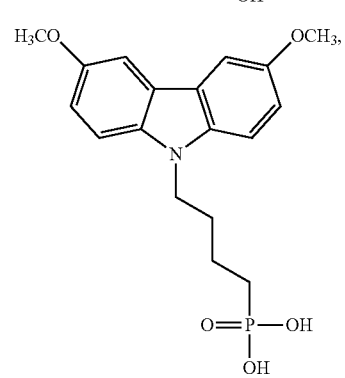

(IV)

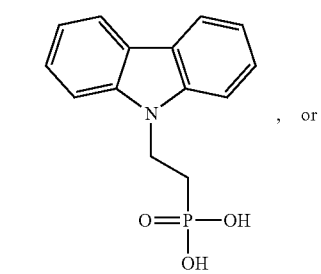

(V)

, or

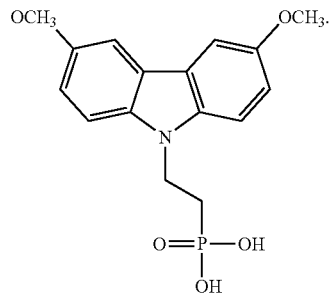

(VI)

Example 9. The device of any one of Examples 1-8, wherein the first layer has a thickness between 1 molecule and 10 molecules.

Example 10. The device of any one of Examples 1-9, wherein the first layer has a thickness between about 0.1 nm and about 10 nm.

Example 11. The device of any one of Examples 1-10, wherein the perovskite layer comprises at least one of a zero-dimensional (0D) structure, a one-dimensional (1D) structure, a two-dimensional (2D) structure, or a three-dimensional (3D) structure.

Example 12. The device of any one of Examples 1-11, wherein: the perovskite layer comprises $ABX_3$, A comprises a first cation, B comprises a second cation, and X comprises an anion.

Example 13. The device of any one of Examples 1-12, wherein A comprises at least one of methylammonium (MA), formamidinium (FA), cesium, or rubidium.

Example 14. The device of any one of Examples 1-13, wherein B comprises at least one of lead or tin.

Example 15. The device of any one of Examples 1-14, wherein X comprises a halide.

Example 16. The device of any one of Examples 1-15, wherein the perovskite layer comprises cesium, FA, MA, lead, iodide, and bromide.

Example 17. The device of any one of Examples 1-16, wherein the perovskite layer has a thickness between 0.1 nm and 100 μm.

Example 18. The device of any one of Examples 1-17, wherein the perovskite layer has a grain size between 100 nm and 500 nm.

Example 19. The device of any one of Examples 1-18, further comprising: a second layer comprising the molecule, wherein: the perovskite layer is positioned between the first layer and the second layer, and the perovskite layer and the second layer are in physical contact.

Example 20. The device of any one of Examples 1-19, wherein the second layer has a thickness between 1 molecule and 10 molecules.

Example 21. The device of any one of Examples 1-20, wherein the second layer has a thickness between about 0.1 nm and about 10 nm.

Example 22. The device of any one of Examples 1-21, further comprising: a contact layer, wherein: the first layer is positioned between the contact layer and the perovskite layer.

Example 23. The device of any one of Examples 1-22, wherein the contact layer comprises a transparent conducting oxide (TCO).

Example 24. The device of any one of Examples 1-23, wherein the TCO comprises at least one of indium-doped tin oxide (ITO), indium zinc oxide (IZO), or fluorine doped tin oxide (FTO).

Example 25. The device of any one of Examples 1-24, further comprising: a charge transfer layer (CTL), wherein: the second layer is positioned between the CTL and the perovskite layer.

Example 26. The device of any one of Examples 1-25, wherein the CTL is an electron transfer layer (ETL).

Example 27. The device of any one of Examples 1-26, wherein the ETL comprises at least of a metal oxide or a fullerene.

Example 28. A composition comprising: a perovskite precursor; a solvent; and a molecule having a structure according to formula (I)

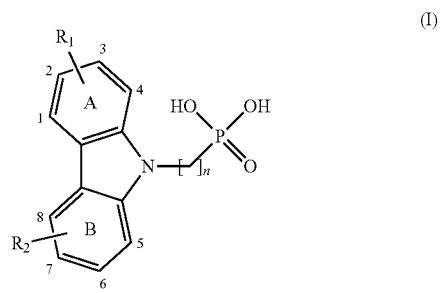

(I)

wherein: n is between 1 and 10, inclusively, $R_1$ comprises at least one of hydrogen, a first alkyl group, a first alkoxy group, or a first halogen, $R_2$ comprises at least one of hydrogen, a second alkyl group, a second alkoxy group, or a second halogen, $R_1$ is bonded to aromatic ring (A) at carbon atom (1), carbon atom (2), carbon atom (3), or carbon atom (4), $R_2$ is bonded to aromatic ring (B) at carbon atom (5), carbon atom (6), carbon atom (7), or carbon atom (8), and $R_1$ and $R_2$ are the same or different.

Example 29. The composition of Example 28, wherein the molecule comprises at least one of (2-(3,6-dimethyl-9H-carbazol-9-yl)ethyl)phosphonic acid (Me-2PACz), (4-(3,6-dimethoxy-9H-carbazol-9-yl)butyl)phosphonic acid (MeO-4PACz), (2-(3,6-dimethoxy-9H-carbazol-9-yl)ethyl) phosphonic acid (MeO-2PACz), (2-(9H-carbazol-9-yl) ethyl)phosphonic acid (2PACz), (4-(9H-carbazol-9-yl) butyl)phosphonic acid (4PACz), (2-(3,6-dibromo-9H-carbazol-9-yl)ethyl)phosphonic acid (Br-2PACz), (4-(3,6-dibromo-9H-carbazol-9-yl)butyl)phosphonic acid (Br-4PACz), or (6-(3,6-Dimethyl-9H-carbazol-9-yl)hexyl) phosphonic acid (Me-6PACz).

Example 30. The composition of either Example 28 or Example 29, wherein the perovskite precursor comprises at least element for synthesizing a perovskite having at least one of a zero-dimensional (0D) structure, a one-dimensional (1D) structure, a two-dimensional (2D) structure, or a three-dimensional (3D) structure.

Example 31. The composition of any one of Examples 28-30, wherein the perovskite precursor comprises at least one of methylammonium (MA), formamidinium (FA), cesium, rubidium, lead, tin, or a halide.

Example 32. The composition of any one of Examples 28-31, wherein the solvent comprises at least one of dimethylformamide (DMF) dimethyl sulfoxide (DMSO), n-methyl-2-pyrrolidone, gamma-butyrolactone, acetonitrile, an alcohol, or water.

Example 33. The composition of any one of Examples 28-32, wherein the alcohol comprises at least one of 2-methoxyethanol, methanol, or ethanol.

Example 34. The composition of any one of Examples 28-33, wherein: the molecule is present at a concentration x, and 0 g/ml<x≤20 g/ml.

Example 35. A method comprising: preparing a solution comprising: a perovskite precursor; a solvent; and a molecule having a structure according to formula (I)

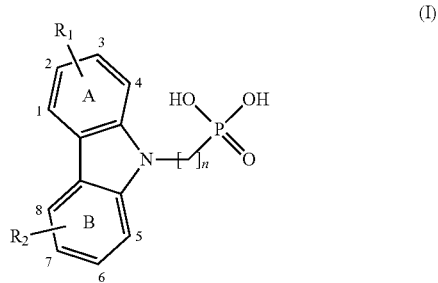

wherein: n is between 1 and 10, inclusively, $R_1$ comprises at least one of hydrogen, a first alkyl group, a first alkoxy group, or a first halogen, $R_2$ comprises at least one of hydrogen, a second alkyl group, a second alkoxy group, or a second halogen, $R_1$ is bonded to aromatic ring (A) at carbon atom (1), carbon atom (2), carbon atom (3), or carbon atom (4), $R_2$ is bonded to aromatic ring (B) at carbon atom (5), carbon atom (6), carbon atom (7), or carbon atom (8), and $R_1$ and $R_2$ are the same or different; applying the solution to a substrate to form a liquid layer on the substrate; and treating the liquid layer to form a perovskite layer positioned adjacent to a first layer comprising the molecule.

Example 36. The method of Example 35, wherein: the treating results in the forming of a second layer comprising the molecule, and the perovskite layer is positioned between the first layer and the second layer.

Example 37. The method of either Example 35 or Example 36, wherein: the molecule is present in the solution at a concentration x, and $0 \text{ g/ml} < x \leq 20 \text{ g/ml}$.

Example 38. The method of any one of Examples 35-37, wherein the preparing is performed using at least one of a stirred tank reactor, a microfluidic mixer, a vortex mixer, or an ultrasound device.

Example 39. The method of any one of Examples 35-38, wherein the applying is performed using at least one of spin coating, dip coating, curtain coating, blade coating, or spraying.

Example 40. The method of any one of Examples 35-39, wherein the preparing is performed by at least one of heating the liquid layer, exposing the liquid layer to a vacuum, applying an anti-solvent to the liquid layer, or exposing the liquid layer to a gas stream.

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
a first layer comprising a perovskite;
a second layer comprising a molecule; and
a third layer comprising the molecule, wherein:
the molecule has a structure according to formula (I)

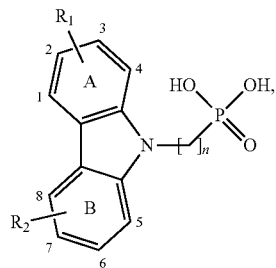

the first layer is positioned between the second layer and the third layer,
the first layer is in physical contact with the second layer and the third layer,
n is between 1 and 10, inclusively,
$R_1$ comprises at least one of hydrogen, a first alkyl group, a first alkoxy group, or a first halogen,
$R_2$ comprises at least one of hydrogen, a second alkyl group, a second alkoxy group, or a second halogen,
$R_1$ is bonded to aromatic ring (A) at carbon atom (1), carbon atom (2), carbon atom (3), or carbon atom (4), and
$R_2$ is bonded to aromatic ring (B) at carbon atom (5), carbon atom (6), carbon atom (7), or carbon atom (8).

2. The device of claim 1, wherein the first alkyl group and the second alkyl group comprise independently at least one of a methyl group, an ethyl group, or a propyl group.

3. The device of claim 1, wherein the first alkoxy group and the second alkoxy group comprise independently at least one of a methoxy group, an ethoxy group, or a propoxy group.

4. The device of claim 1, wherein the first halogen and the second halogen comprise independently at least one of fluorine, chlorine, bromine, or iodine.

5. The device of claim 1, wherein $R_1$ is bonded to aromatic ring (A) at carbon atom (2).

6. The device of claim 1, wherein $R_2$ is bonded to aromatic ring (B) at carbon atom (7).

7. The device of claim 1, wherein the molecule comprises at least one of (2-(3,6-dimethyl-9H-carbazol-9-yl)ethyl)phosphonic acid (Me-2PACz), (4-(3,6-dimethoxy-9H-carbazol-9-yl)butyl)phosphonic acid (MeO-4PACz), (2-(3,6-dimethoxy-9H-carbazol-9-yl)ethyl)phosphonic acid (MeO-2PACz), (2-(9H-carbazol-9-yl)ethyl)phosphonic acid (2PACz), (4-(9H-carbazol-9-yl)butyl)phosphonic acid (4PACz), (2-(3,6-dibromo-9H-carbazol-9-yl)ethyl)phosphonic acid (Br-2PACz), (4-(3,6-dibromo-9H-carbazol-9-yl)butyl)phosphonic acid (Br-4PACz), or (6-(3,6-dimethyl-9H-carbazol-9-yl)hexyl)phosphonic acid (Me-6PACz).

8. The device of claim 1, wherein the second layer has a thickness between about 0.1 nm and about 10 nm.

9. The device of claim 1, wherein the first layer comprises at least one of a zero-dimensional (0D) structure, a one-dimensional (1D) structure, a two-dimensional (2D) structure, or a three-dimensional (3D) structure.

10. The device of claim 1, wherein the perovskite has a grain size between 100 nm and 500 nm.

11. The device of claim 1, further comprising:
a contact layer, wherein:
the second layer is positioned between the contact layer and the first layer.

12. The device of claim 11, wherein the contact layer comprises a transparent conducting oxide (TCO).

13. The device of claim 1, further comprising:
a charge transfer layer (CTL), wherein:
the third layer is positioned between the CTL and the first layer.

14. The device of claim 13, wherein the CTL is an electron transfer layer (ETL).

15. The device of claim 14, wherein the ETL comprises least one of a metal oxide or a fullerene.

16. A method comprising:
preparing a solution comprising:
a perovskite precursor;
a solvent; and
a molecule having a structure according to formula (I)

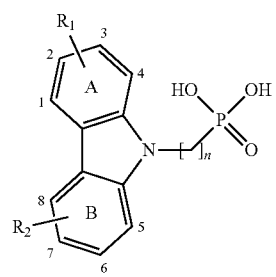

wherein:
n is between 1 and 10, inclusively,
$R_1$ comprises at least one of hydrogen, a first alkyl group, a first alkoxy group, or a first halogen,
$R_2$ comprises at least one of hydrogen, a second alkyl group, a second alkoxy group, or a second halogen,
$R_1$ is bonded to aromatic ring (A) at carbon atom (1), carbon atom (2), carbon atom (3), or carbon atom (4),
$R_2$ is bonded to aromatic ring (B) at carbon atom (5), carbon atom (6), carbon atom (7), or carbon atom (8), and
$R_1$ and $R_2$ are the same or different;
applying the solution to a substrate to form a liquid layer on the substrate; and
treating the liquid layer to form a first layer comprising a perovskite positioned between a second layer comprising the molecule and a third layer comprising the molecule, wherein:
the first layer is in physical contact with the second layer and the third layer.

17. The method of claim 16, wherein:
the treating results in the forming of the second layer comprising the molecule, and the perovskite layer is positioned between the first layer and the second layer.

18. The device of claim 1, wherein the the perovskite comprises $ABX_3$, A comprises a first cation, B comprises a second cation, and X comprises an anion.

19. The device of claim 1, wherein the third layer has a thickness between 0.1 nm and 10 nm, inclusively.

* * * * *